(12) United States Patent
Lin et al.

(10) Patent No.: US 10,879,251 B2
(45) Date of Patent: Dec. 29, 2020

(54) INTEGRATED CIRCUIT AND MANUFACTURING METHOD THEREOF

(71) Applicant: TAIWAN SEMICONDUCTOR MANUFACTURING CO., LTD., Hsinchu (TW)

(72) Inventors: Meng-Han Lin, Hsinchu (TW); Chin-Wen Chan, Taichung (TW); Chih-Ren Hsieh, Changhua County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/904,678

(22) Filed: Feb. 26, 2018

(65) Prior Publication Data

US 2018/0315765 A1 Nov. 1, 2018

Related U.S. Application Data

(60) Provisional application No. 62/490,615, filed on Apr. 27, 2017.

(51) Int. Cl.

| H01L 27/11 | (2006.01) |
| H01L 27/11521 | (2017.01) |
| H01L 29/06 | (2006.01) |
| H01L 21/762 | (2006.01) |
| H01L 27/11519 | (2017.01) |
| H01L 27/11546 | (2017.01) |
| H01L 27/11548 | (2017.01) |

(52) U.S. Cl.
CPC .. *H01L 27/11521* (2013.01); *H01L 21/76224* (2013.01); *H01L 21/76232* (2013.01); *H01L 27/11519* (2013.01); *H01L 27/11546* (2013.01); *H01L 27/11548* (2013.01); *H01L 29/0653* (2013.01)

(58) Field of Classification Search
None
See application file for complete search history.

(56) References Cited

U.S. PATENT DOCUMENTS

| 5,970,341 A * | 10/1999 | Lin | H01L 21/28273 257/E21.209 |
| 6,078,076 A * | 6/2000 | Lin | H01L 27/11521 257/321 |
| 6,228,713 B1 * | 5/2001 | Pradeep | H01L 21/76224 257/314 |
| 2003/0122178 A1 * | 7/2003 | Yang | H01L 27/115 257/314 |
| 2005/0090059 A1 * | 4/2005 | Lee | H01L 27/105 438/257 |
| 2015/0263010 A1 | 9/2015 | Chuang et al. | |

* cited by examiner

*Primary Examiner* — Bilkis Jahan
(74) *Attorney, Agent, or Firm* — McClure, Qualey & Rodack, LLP

(57) ABSTRACT

An integrated circuit includes a substrate, a first isolation feature, and a plurality of memory cells. The substrate has a cell region, a peripheral region, and a transition region between the cell region and the peripheral region. A top surface of the cell region is lower than a top surface of the peripheral region, and the substrate includes at least one protrusion portion in the transition region. The first isolation feature is in the transition region and covers the protrusion portion of the substrate. The memory cells are over the cell region of the substrate.

20 Claims, 42 Drawing Sheets

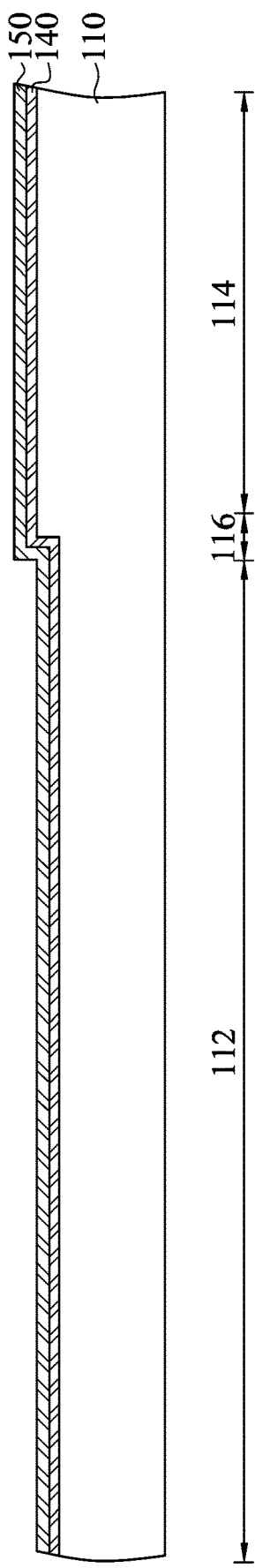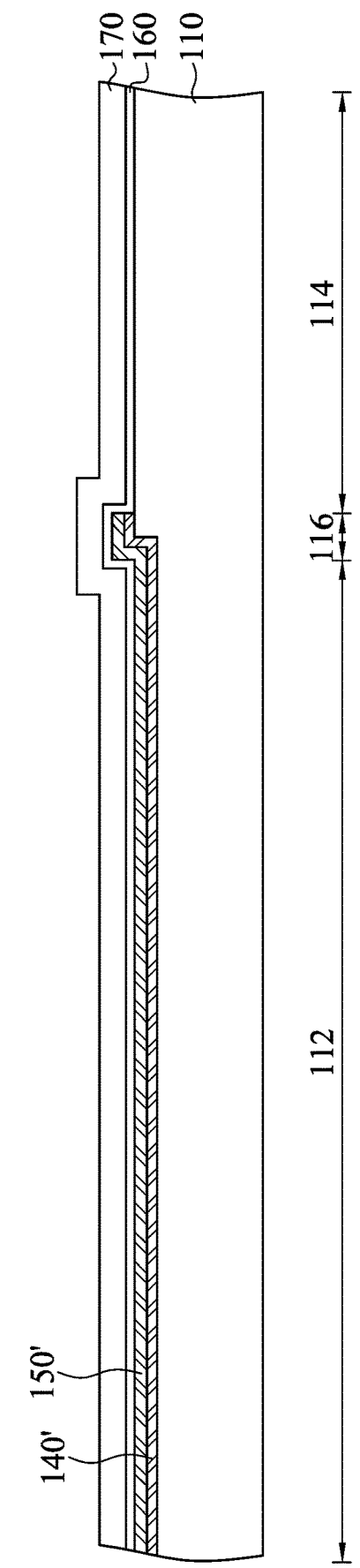

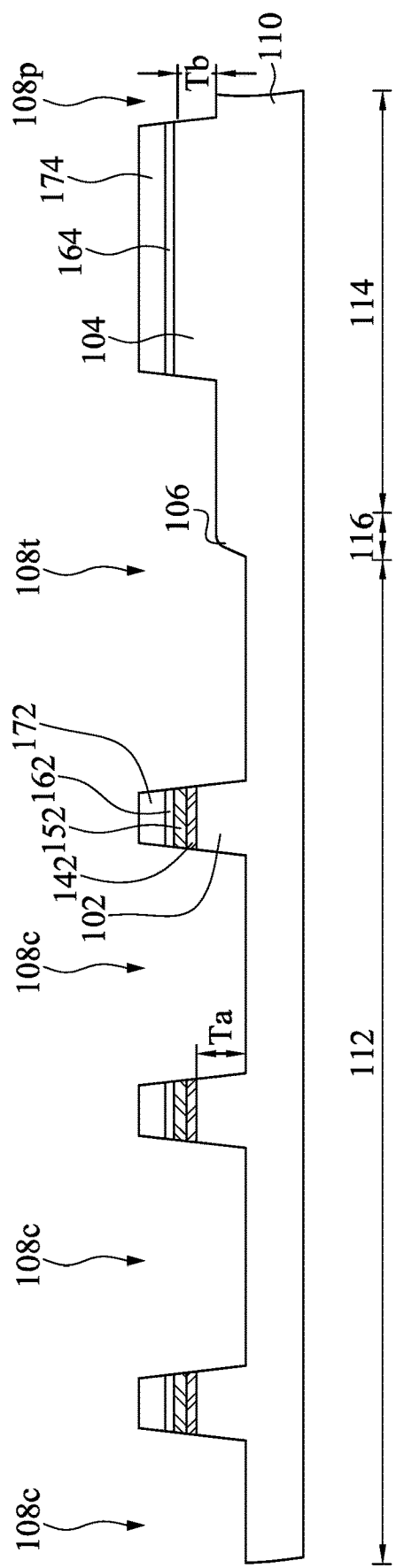
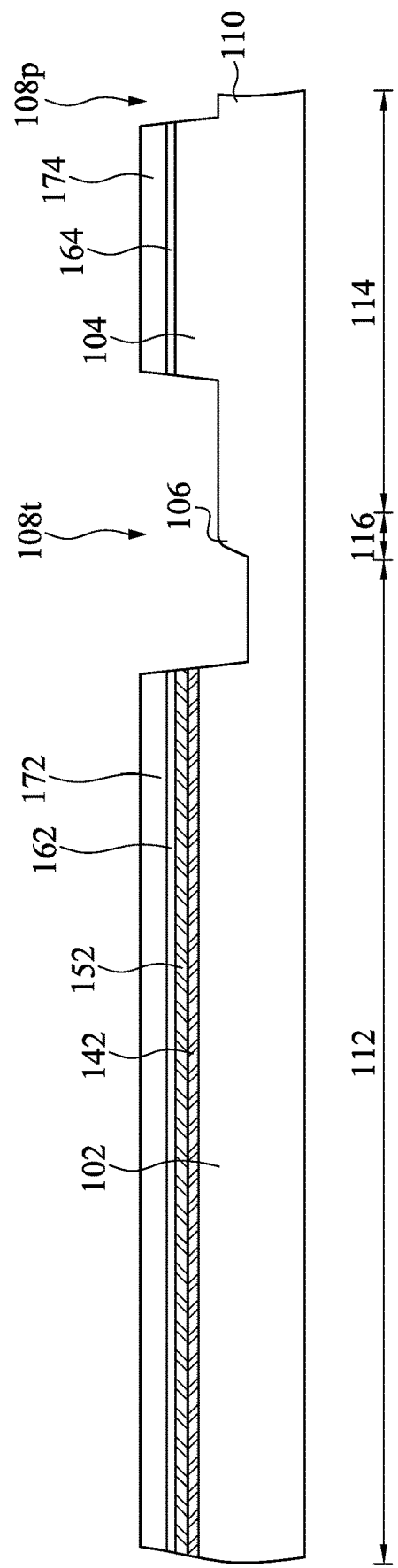
Fig. 5B
Fig. 5C

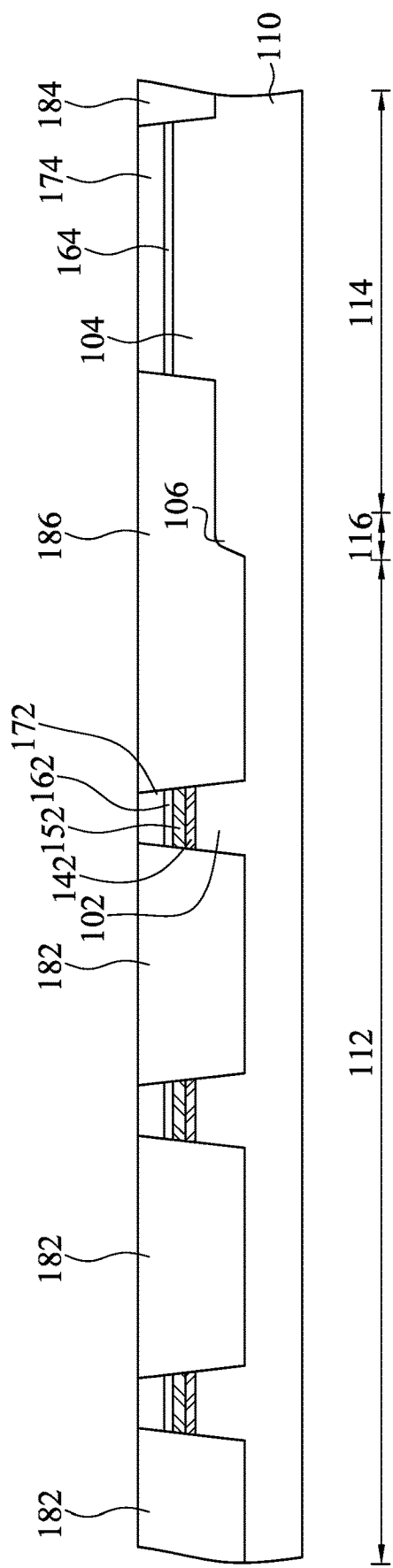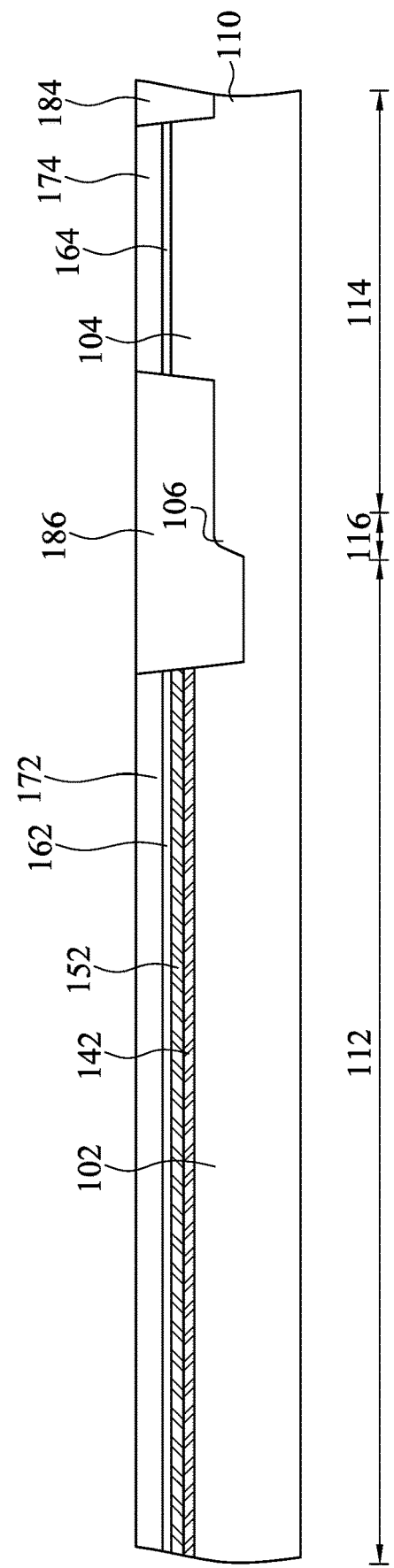

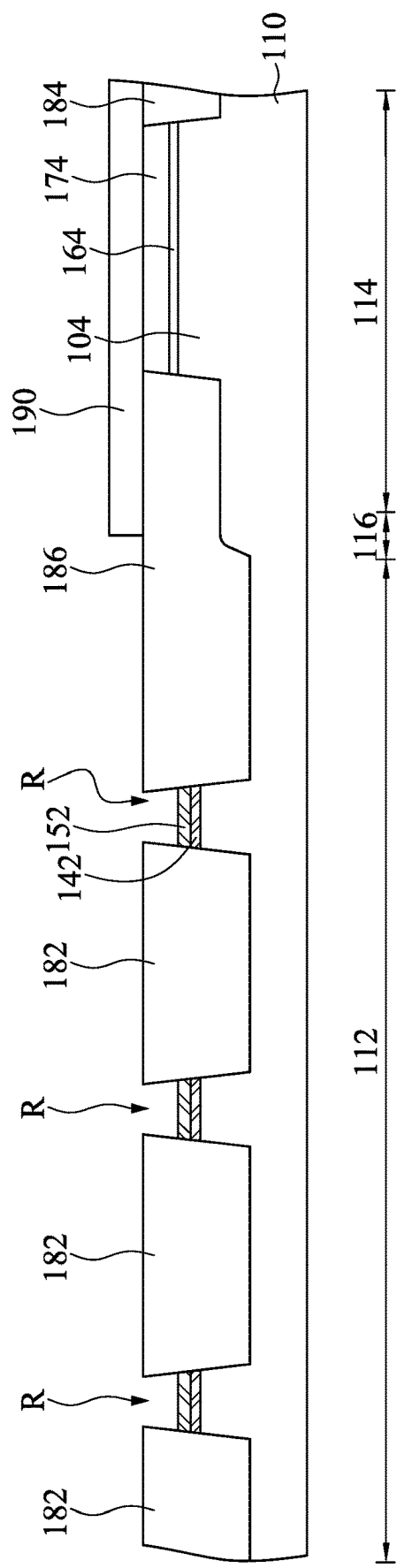
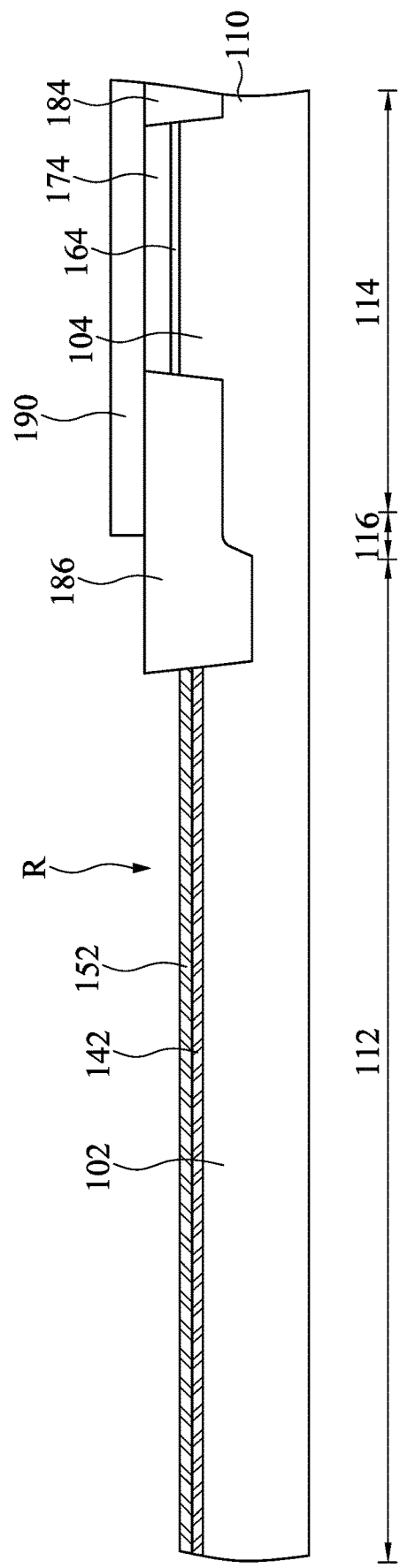
Fig. 7B
Fig. 7C

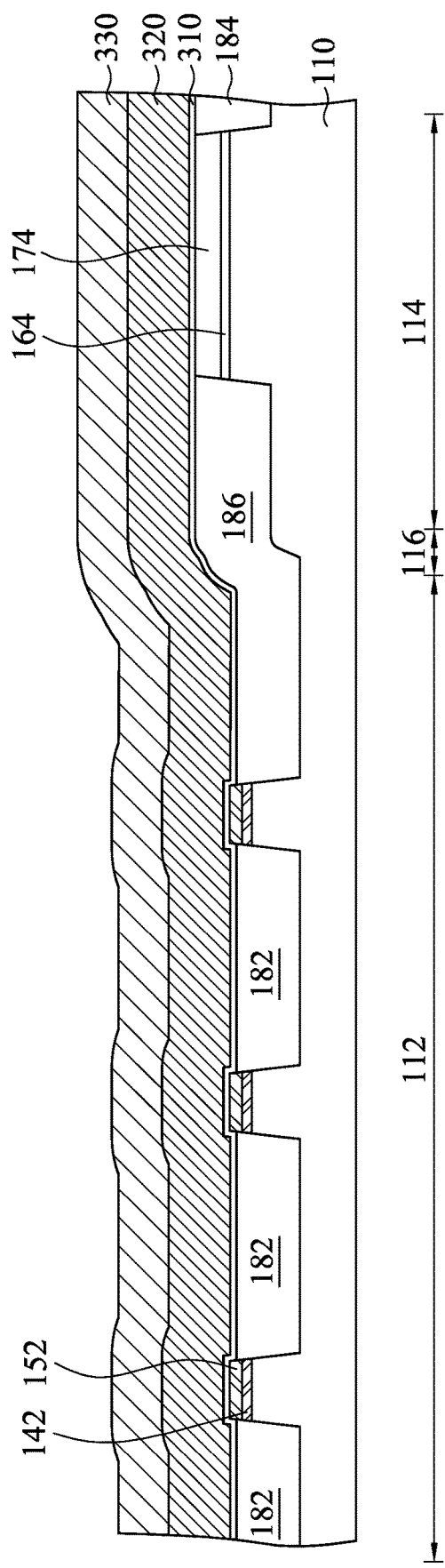
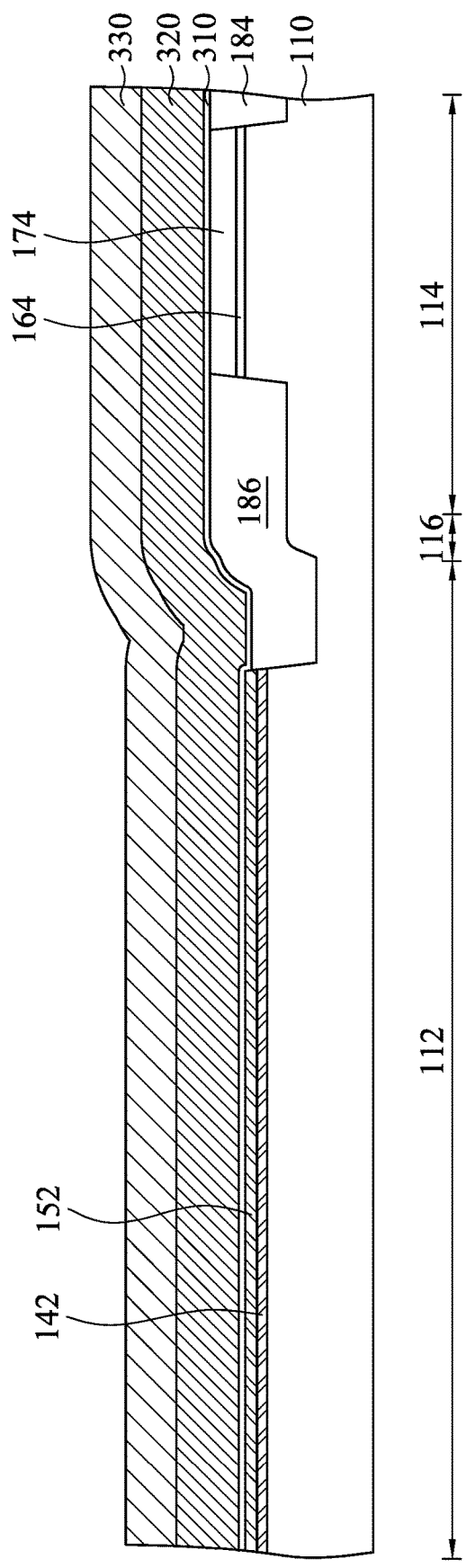
Fig. 9A
Fig. 9B

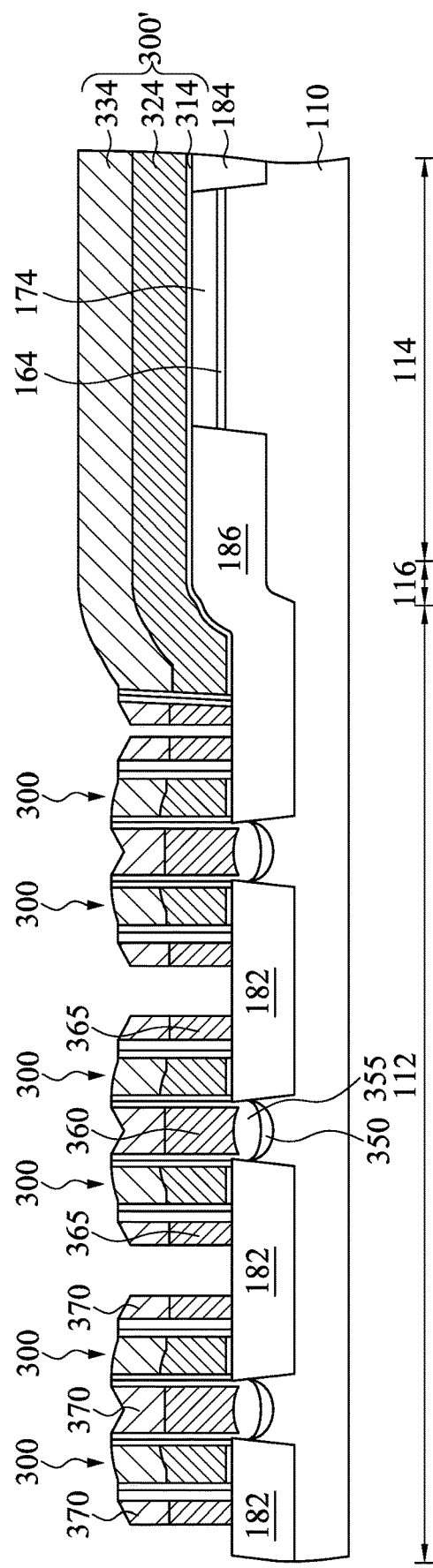
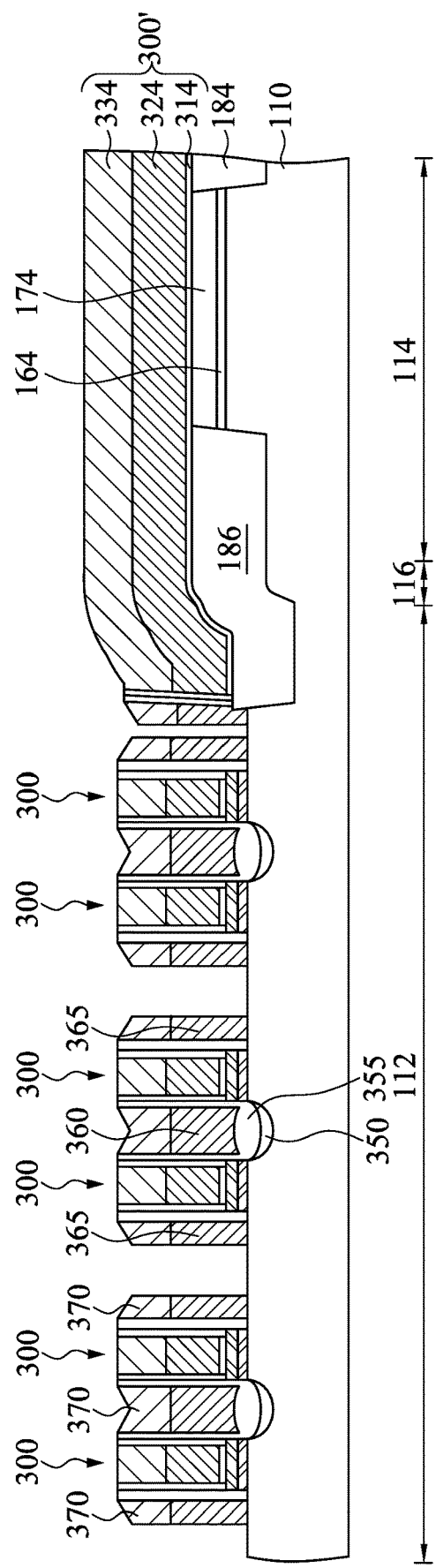
Fig. 13B
Fig. 13C

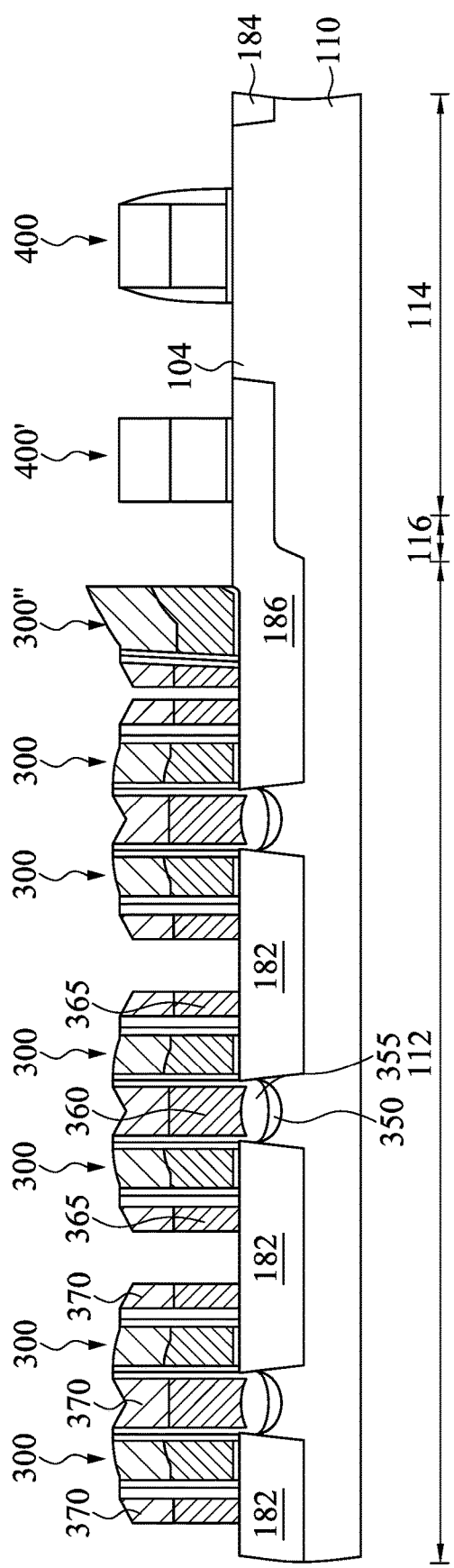
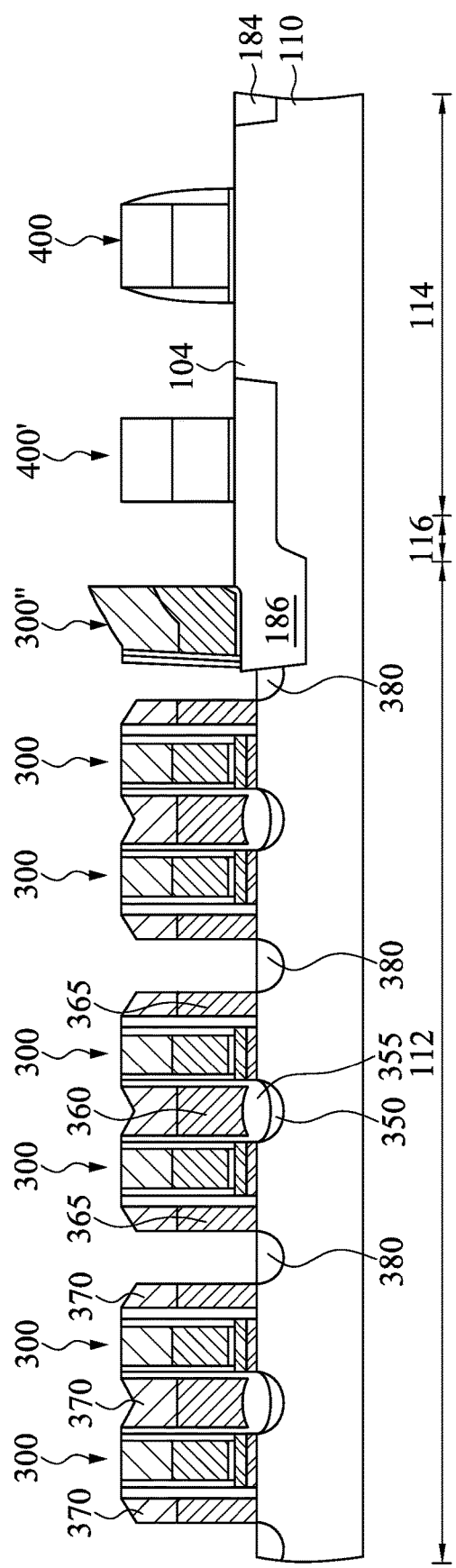
Fig. 14A
Fig. 14B

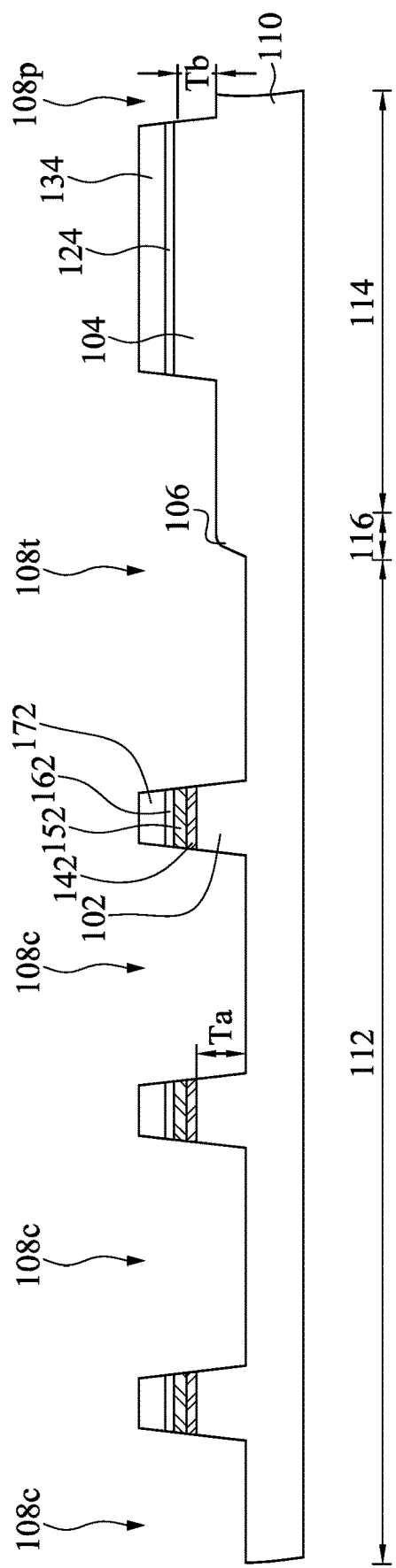
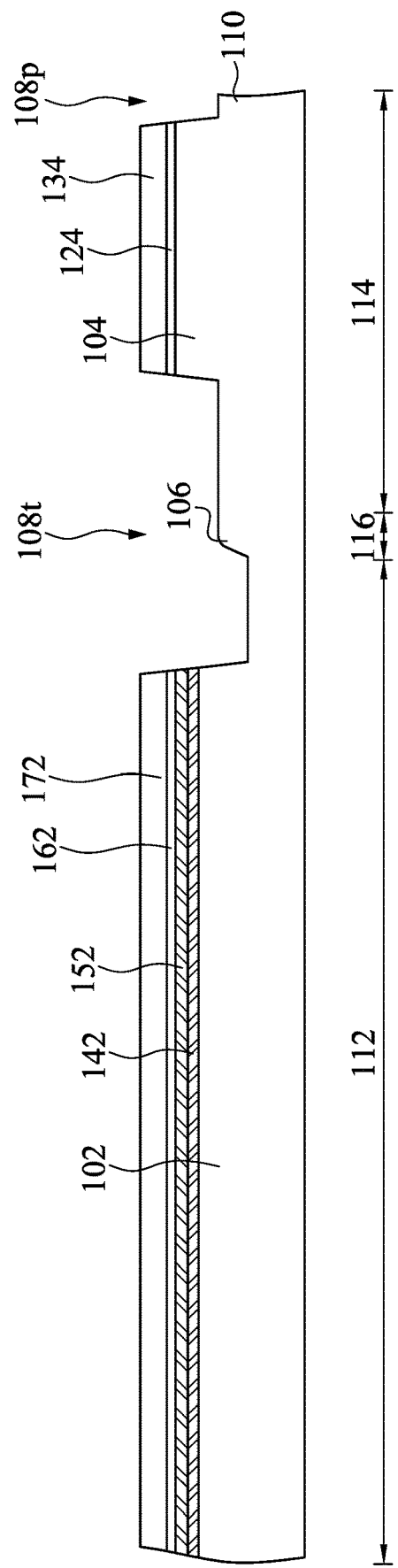
Fig. 21B
Fig. 21C

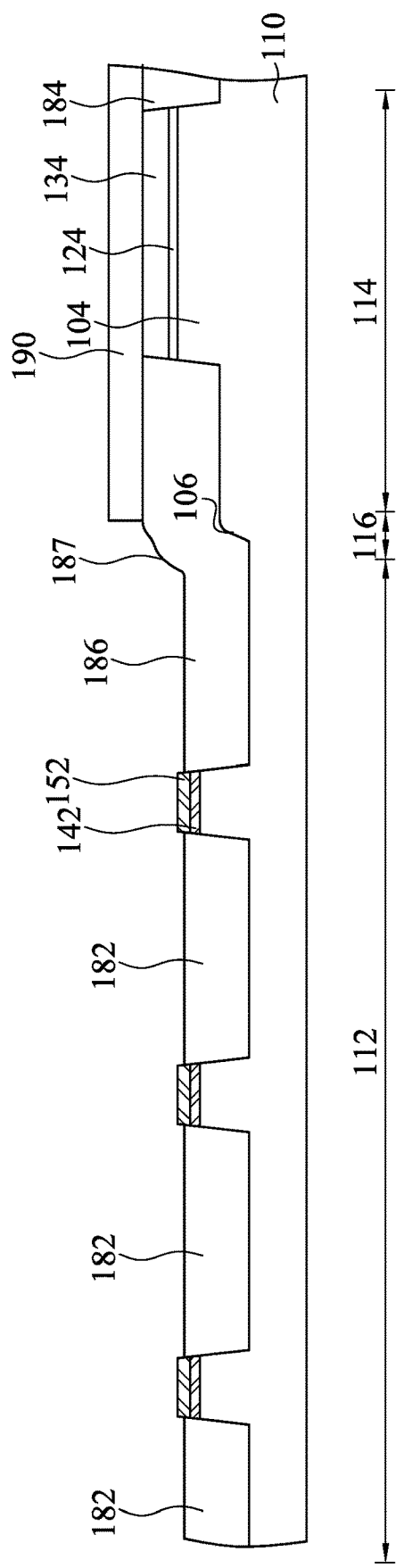
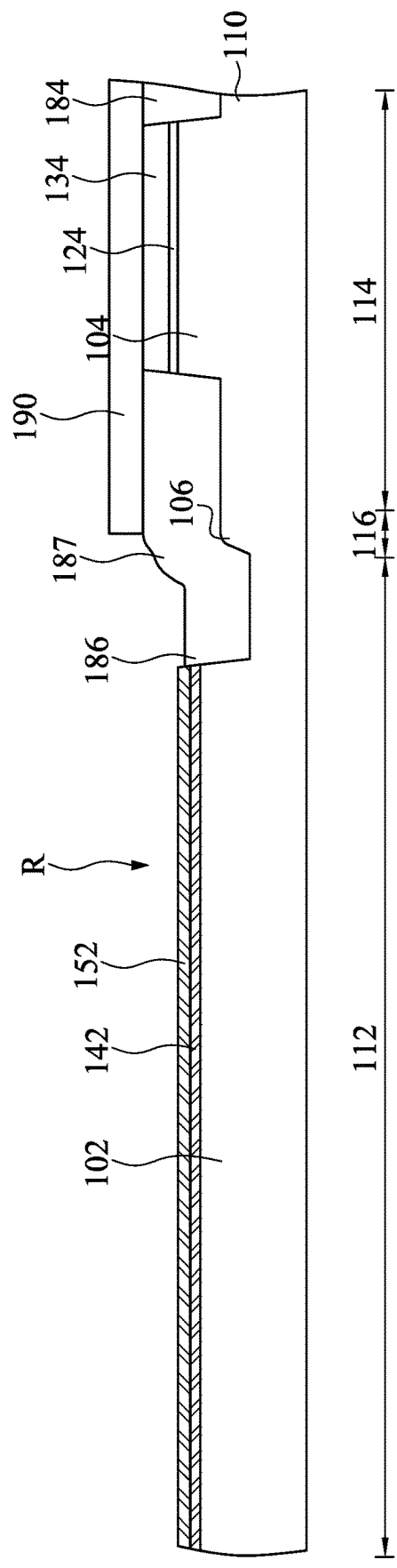
Fig. 24A
Fig. 24B

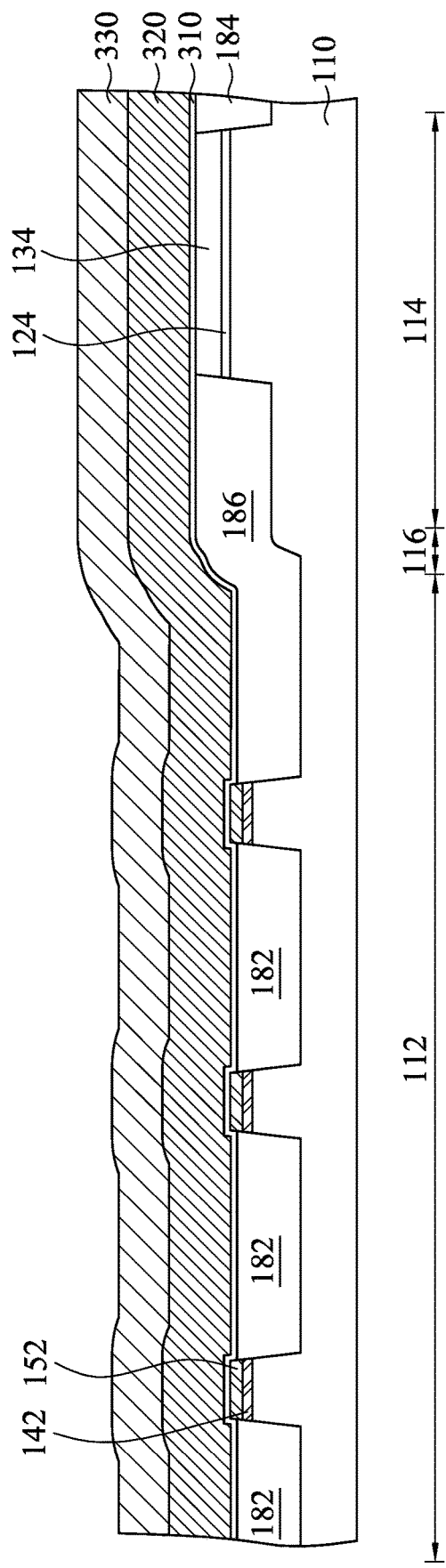
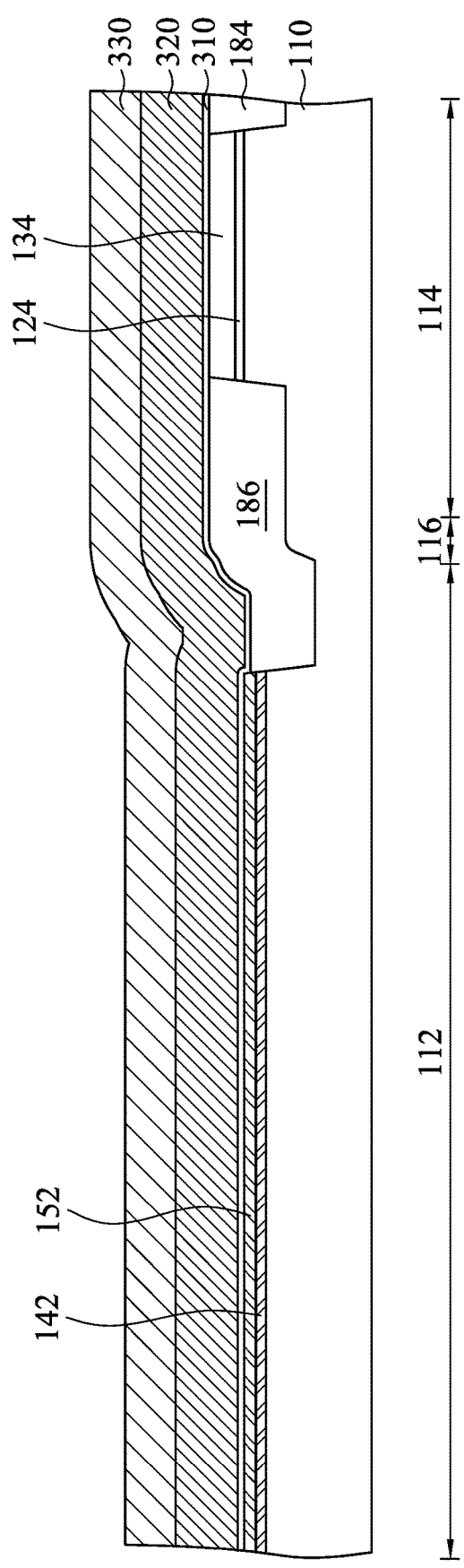
Fig. 25A
Fig. 25B

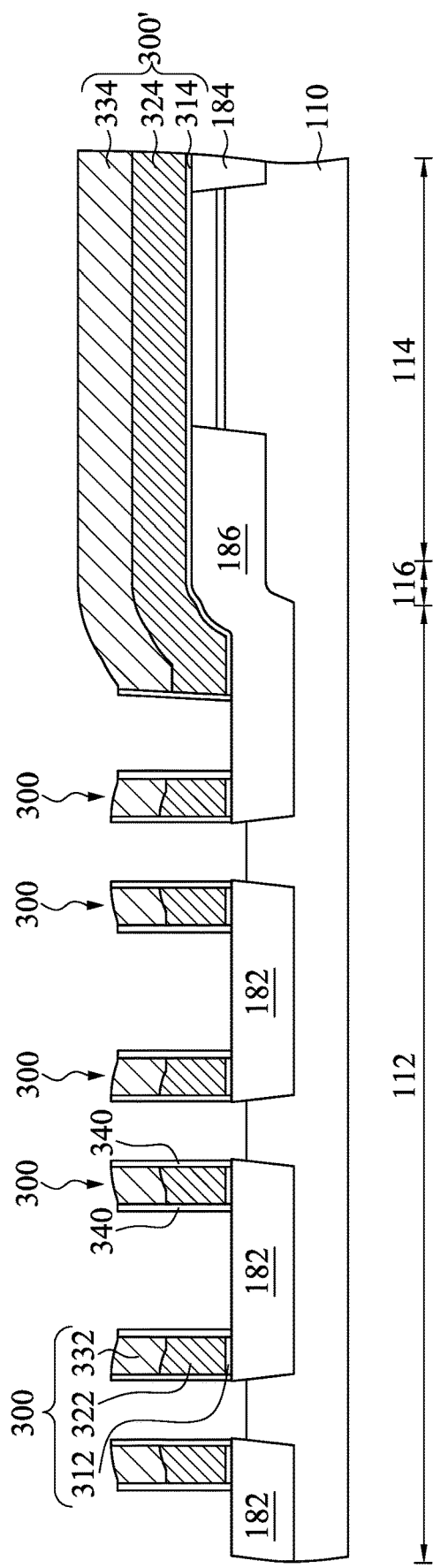
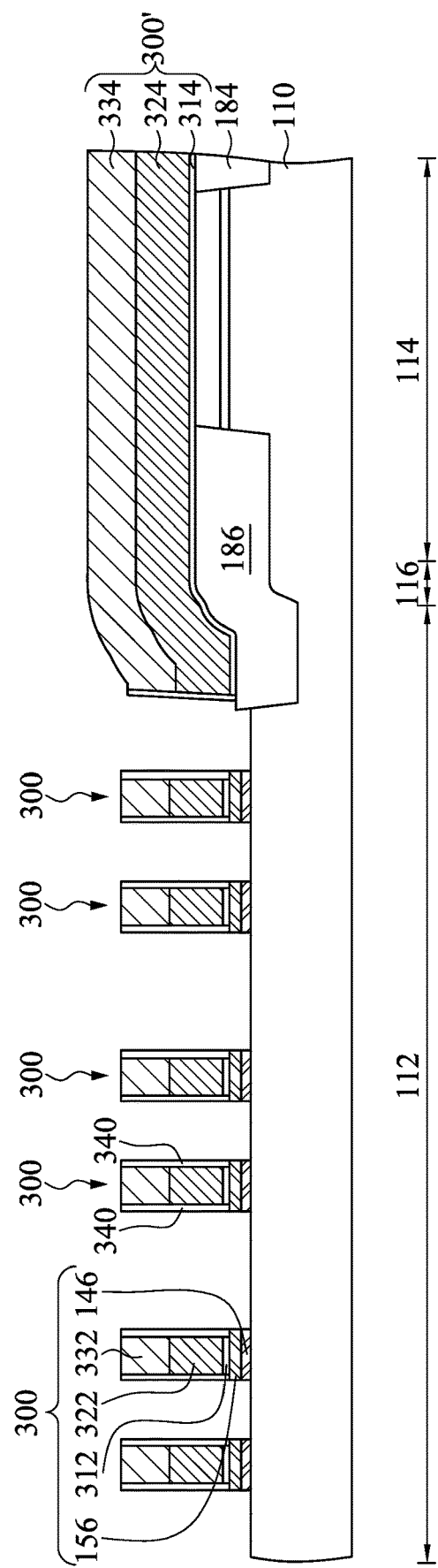
Fig. 26B
Fig. 26C

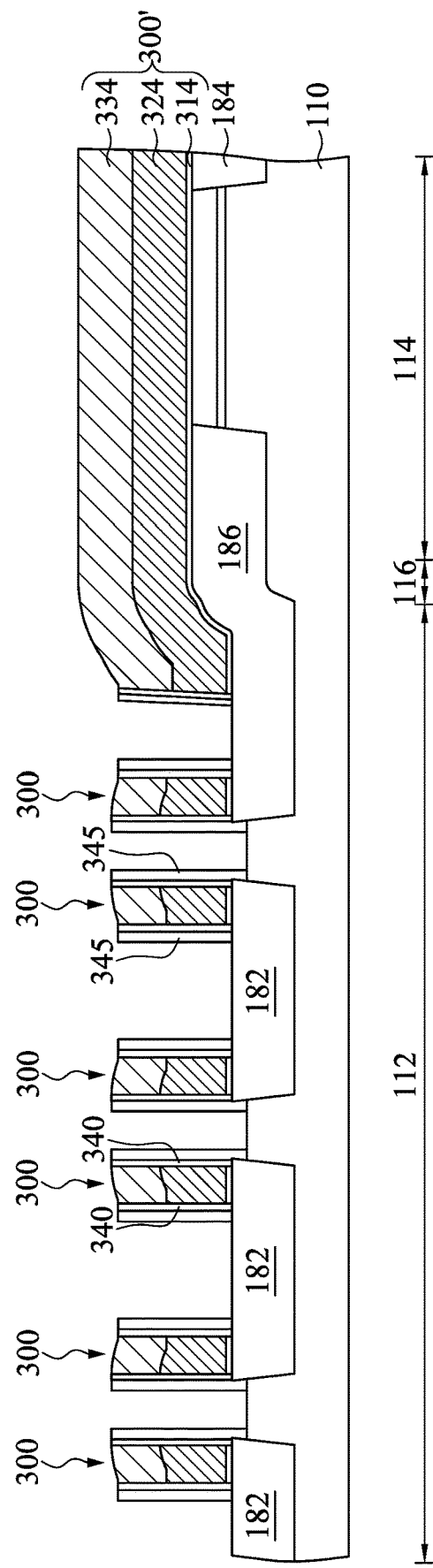
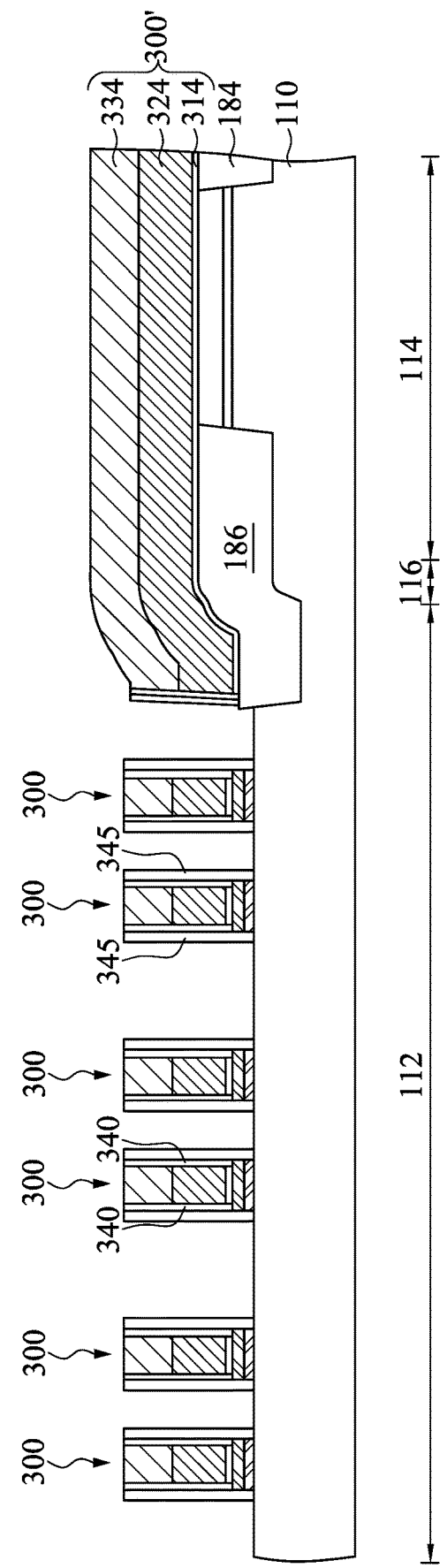
Fig. 27A
Fig. 27B

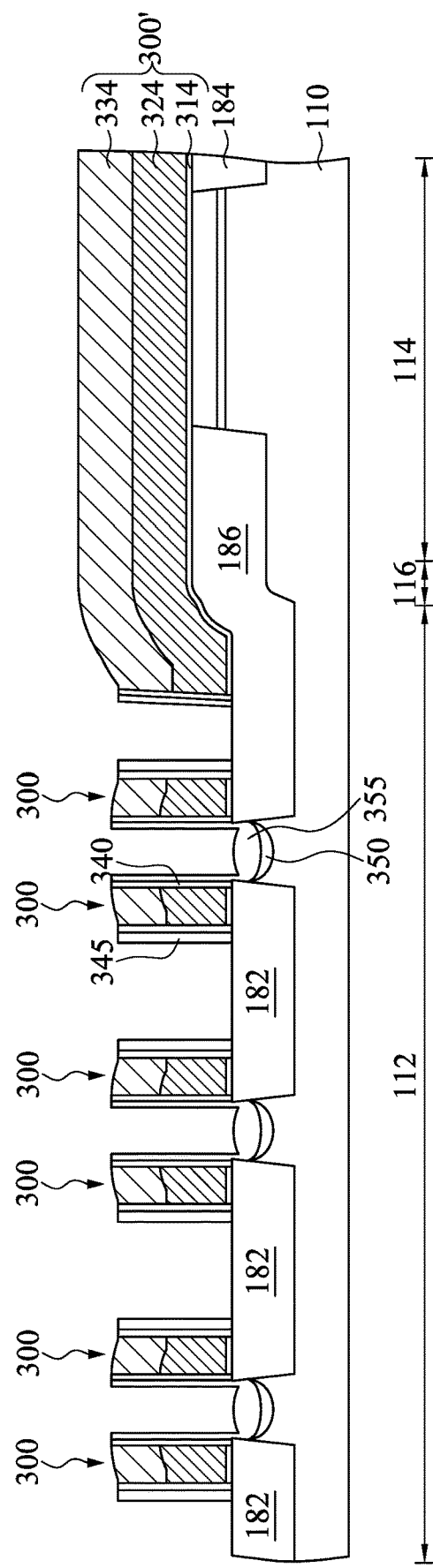
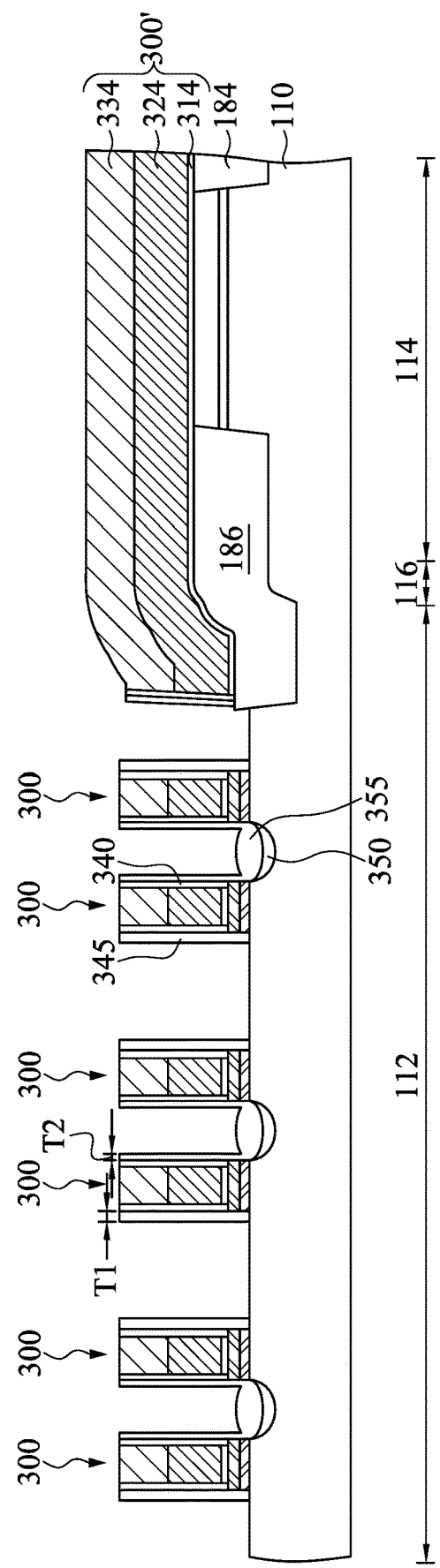
Fig. 28A
Fig. 28B

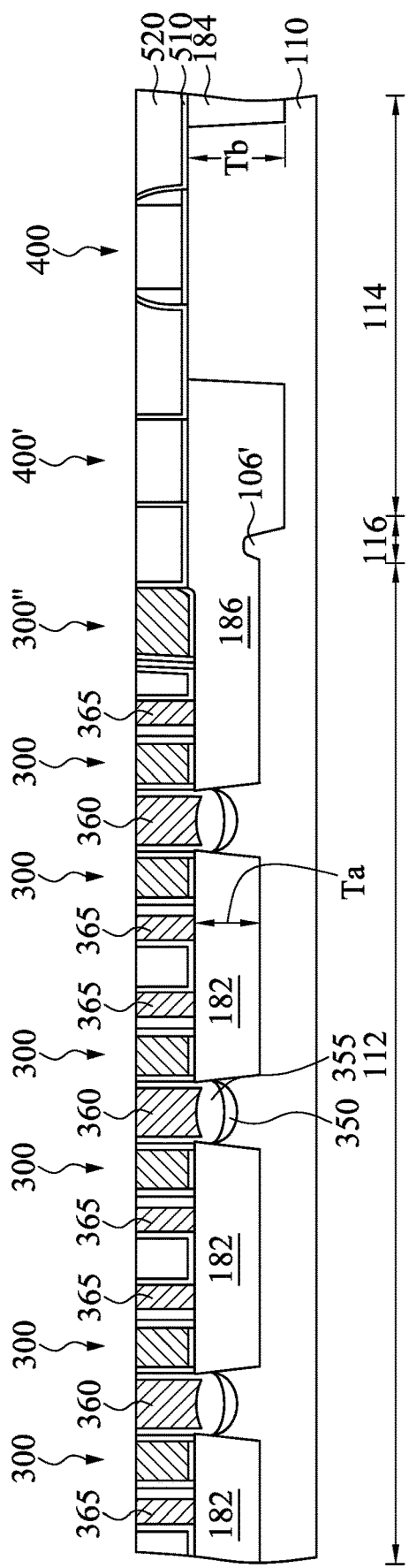
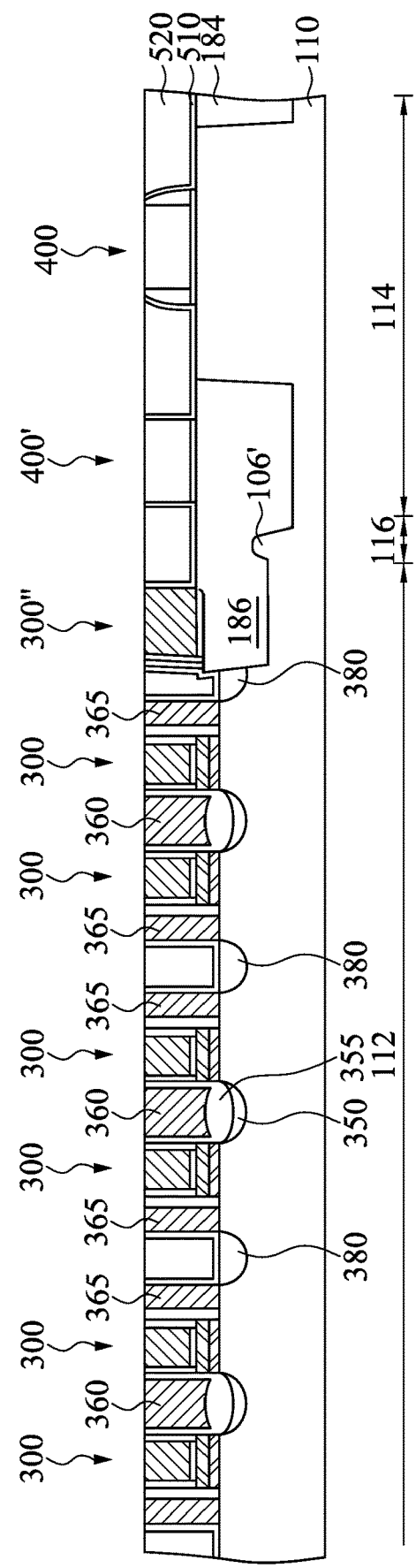
Fig. 32A
Fig. 32B

INTEGRATED CIRCUIT AND MANUFACTURING METHOD THEREOF

PRIORITY CLAIM AND CROSS-REFERENCE

This application claims priority to U.S. Provisional Application Ser. No. 62/490,615, filed Apr. 27, 2017, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 15C illustrate a method for manufacturing an integrated circuit (IC) in different stages in accordance with some embodiments.

FIGS. 17A to 31C illustrate a method for manufacturing an integrated circuit (IC) in different stages in accordance with some embodiments.

FIGS. 32A to 32B are cross-sectional views of an integrated circuit (IC) in accordance with some embodiments.

DETAILED DESCRIPTION

Figure 1A:
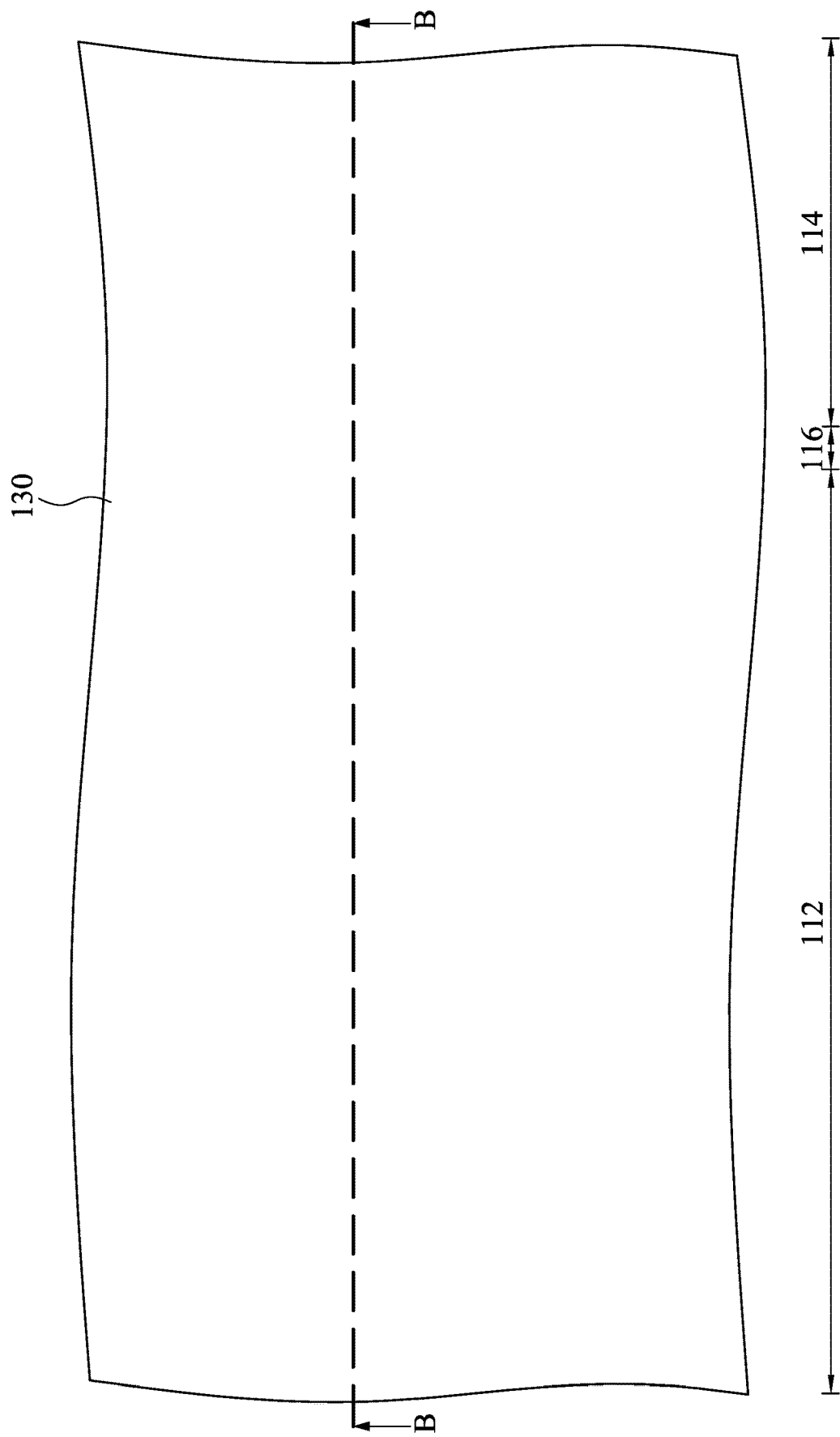

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory can be formed on a bulk silicon substrate and uses various bias conditions to read and write data values. For example, an EFS3 cell—or so-called "third generation SUPERFLASH" cell—includes a pair of symmetric split gate memory cells, each of which includes a pair of source/drain regions with a channel region arranged there between. In the EFS3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the EFS3 cell and a sidewall of the floating and/or control gate). At least one cell is configured to store a variable charge level on its floating gate, wherein the level of this charge corresponds to a data state stored in the cell and is stored in a non-volatile manner so that the stored charge/data persists in the absence of power.

By changing the amount of charge stored on the floating gate, the threshold voltage $V_{th}$ of the memory cell device can be correspondingly changed. For example, to perform a program operation (e.g., write a logical "0", program is 0, Vt high) for a cell, the control gate is biased with a high (e.g., at least an order of magnitude higher) voltage relative a voltage applied across the channel region and/or relative to a voltage applied to the select gate. The high bias voltage promotes Fowler-Nordheim tunneling of carriers from the channel region towards the control gate. As the carriers tunnel towards the control gate, the carriers become trapped in the floating gate and alter the $V_{th}$ of the cell. Conversely, to perform an erase operation (e.g., write a logical "1", erase is 1, Vt low) for the cell, the erase gate is biased with a high (e.g., at least an order of magnitude higher) voltage relative a voltage applied across the channel region and/or relative to a voltage applied to the control gate. The high bias voltage promotes Fowler-Nordheim tunneling of carriers from the floating gate towards the erase gate, thereby removing carriers from the floating gate and again changing the $V_{th}$ of the cell in a predictable manner. Subsequently, during a read operation, a voltage is applied to the select gate to induce part of the channel region to conduct. Application of a voltage to the select gate attracts carriers to part of the channel region adjacent to the select gate. While the select gate voltage is applied, a voltage greater than $V_{th}$, but less than $V_{th}+\Delta V_{th}$, is applied to the control gate (where $\Delta V_{th}$ is a change in $V_{th}$ due to charge trapped on the floating gate). If the memory cell device turns on (i.e., allows charge to flow), then it is deemed to contain a first data state (e.g., a logical "1" is read). If the memory cell device does not turn on, then it is deemed to contain a second data state (e.g., a logical "0" is read).

Due to the high-voltages involved in performing program and/or erase operations, high energy implants are used in some instances to form the source/drain regions of the flash memory cells. Thus, the source/drain regions of the flash cells can be implanted deeper than that of low-voltage CMOS devices. This additional implant depth can help to reduce current crowding at the substrate surface near edges of the source/drain regions.

Some embodiments of the present disclosure relate to flash memory devices that are formed on a recessed region of a substrate. Although some implementations are illustrated below with regards to split gate flash memory, it will be appreciated that this concept is not limited to split gate flash memory cells, but is also applicable to other types of flash memory cells as well as to other types of semiconductor devices, such as MOSFETs, FinFETs, and the like.

Figure 1B:
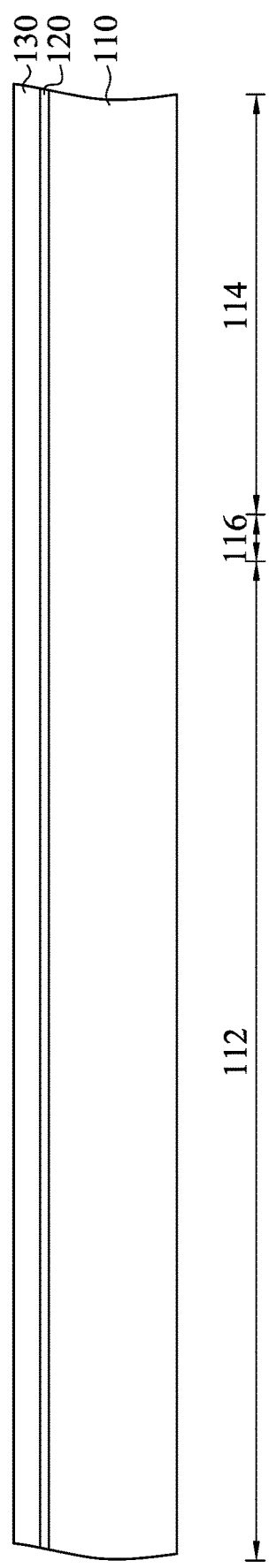

FIGS. 1A to 15C illustrate a method for manufacturing an integrated circuit (IC) in different stages in accordance with some embodiments. Reference is made to FIGS. 1A and 1B, where FIG. 1A is a top view of the IC according with some embodiments, and FIG. 1B is a cross-sectional view taking along line B-B of FIG. 1A. A substrate 110 is provided. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 110 includes a cell region 112, a peripheral region 114, and a transition region 116. The peripheral region 114 is located at least one edge of the cell region 112. For example, the peripheral region 114 surrounds the cell region 112. The transition region 116 is disposed between the cell region 112 and the peripheral region 114. A pad layer 120 is formed over the substrate 110. The pad layer 120 may be formed of dielectric material, such as an oxide layer. A mask layer 130 is formed over the pad layer 120. In some embodiments, the mask layer 130 is formed of dielectric material, such as silicon nitride (SiN) or other suitable materials. In some embodiments, the thickness of the mask layer 130 is few hundred Angstroms, such as about 200 to about 2000 Angstroms, and the thickness of the pad layer 120 is about 30 to about 300 Angstroms, and the present disclosure is not limited in this respect.

Figure 2:
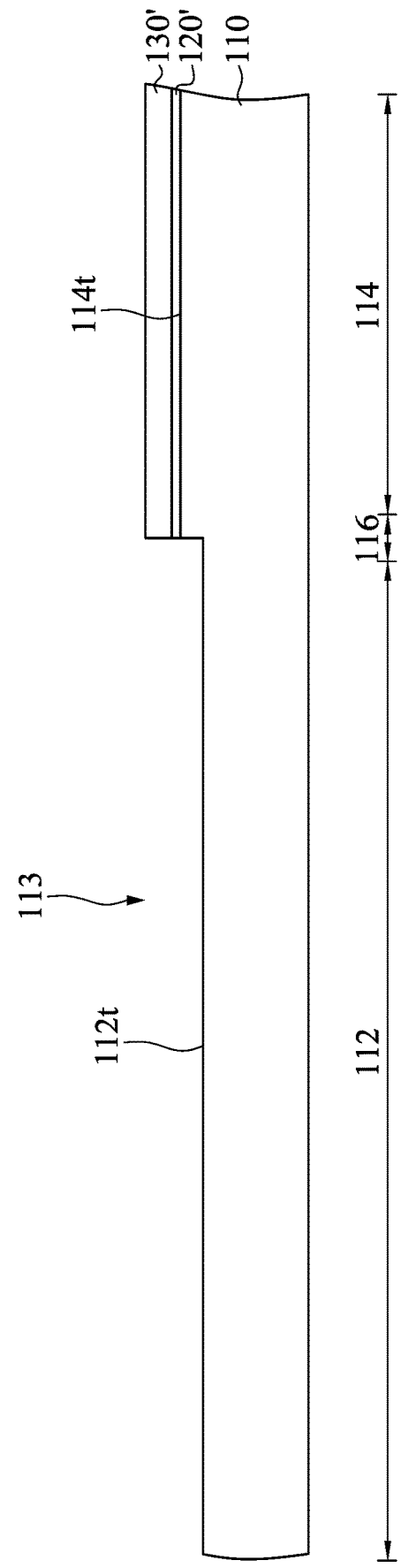

Reference is made to FIG. 2, where the cross-sectional position of FIG. 2 is the same as the cross-sectional position of FIG. 1B. The pad layer 120 and the mask layer 130 are patterned to respectively form a patterned pad layer 120' and a patterned mask layer 130' over the peripheral region 114 of the substrate 110. Specifically, portions of the pad layer 120 and the mask layer 130 above the cell region 112 of the substrate 110 are removed to expose the cell region 112 of the substrate 110, which is then recessed (such as etched) through the patterned pad layer 120' and the mask layer 130'. Therefore, a recess 103 is formed in the cell region 112 of the substrate 110. A top surface 112t of the cell region 112 is lower than a top surface 114t of the peripheral region 114. In some embodiments, the depth of the recess 113 is about 50 Angstroms to about 2000 Angstroms.

Reference is made to FIG. 3, where the cross-sectional position of FIG. 3 is the same as the cross-sectional position of FIG. 2. The patterned pad layer 120' and the patterned mask layer 130' of FIG. 2 are removed. As such, the peripheral region 114 and the transition region 116 of the substrate 110 are exposed. A tunneling film 140 is then conformally formed over the substrate 110. In some embodiments, the tunneling film 140 may include, for example, a dielectric material such as silicon dioxide ($SiO_2$), silicon nitride ($Si_3N_4$), oxynitrides (SiON), high-k materials, other non-conductive materials, or combinations thereof. The tunneling film 140 may be formed using thermal oxide, chemical vapor deposition (CVD), physical vapor deposition (PVD), atomic layer deposition (ALD), ozone oxidation, other suitable processes, or combinations thereof.

A floating gate film 150 is conformally formed over the tunneling film 140. The floating gate film 150 may include polysilicon formed through, for example low pressure CVD (LPCVD) methods, CVD methods and PVD sputtering methods employing suitable silicon source materials. If desired, the floating gate film 150 may be ion implanted to the desired conductive type. It is to be appreciated other gate electrode material such as metal, metal alloys, single crystalline silicon, or combinations thereof.

Reference is made to FIG. 4, where the cross-sectional position of FIG. 4 is the same as the cross-sectional position of FIG. 3. The tunneling film 140 and the floating gate film 150 of FIG. 3 are patterned to respectively form a patterned tunneling film 140' and a patterned floating gate film 150' over the cell region 112 of the substrate 110. Specifically, portions of the tunneling film 140 and the floating gate film 150 above the peripheral region 114 of the substrate 110 are removed to expose the peripheral region 114 of the substrate 110. In some embodiments, the floating gate film 150 and the tunneling film 140 can be removed by using an etching process. In some embodiments, such an etch process may be performed multiple times. However, the patterning process is not limited to a photolithography process using photoresists, and may be performed by an immersion lithography, electron beam lithography, or other suitable processes. As a result, the patterned tunneling film 140' and the patterned floating gate film 150' as shown in FIG. 4 is obtained.

Another pad layer 160 is conformally formed over the patterned floating gate film 150 and the substrate 110, and another mask layer 170 is conformally formed over the pad layer 160. That is, the pad layer 160 is in contact with the peripheral region 114 of the substrate 110 and the patterned floating gate film 150'. In other words, the pad layer 160 is spaced from the cell region 112 of the substrate 110, and the patterned tunneling film 140' and the patterned floating gate film 150' are disposed between the substrate 110 and the pad layer 160. The pad layer 160 may be formed of dielectric material, such as an oxide layer. The mask layer 170 can be formed of dielectric material, such as silicon nitride (SiN) or other suitable materials. In some embodiments, the thickness of the mask layer 170 is few hundred Angstroms, such as about 200 to about 2000 Angstroms, and the thickness of the pad layer 160 is about 30 to about 300 Angstroms, and the present disclosure is not limited in this respect.

Figure 5A:
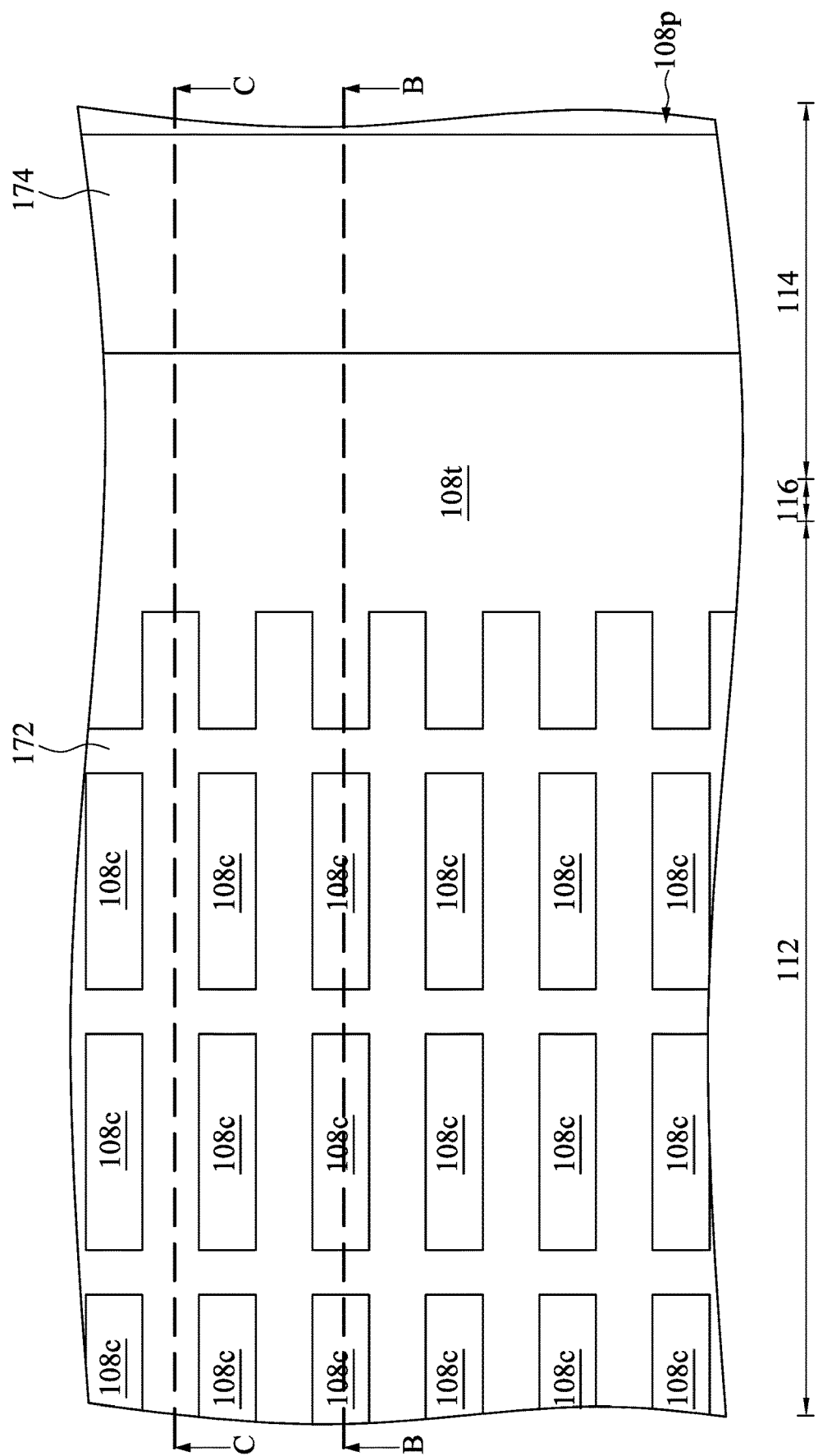

Reference is made to FIGS. 5A to 5C, where FIG. 5A is a top view of the IC, FIG. 5B is a cross-sectional view taking along line B-B of FIG. 5A, and FIG. 5C is a cross-sectional view taking along line C-C of FIG. 5A. The structure of FIG. 4 is patterned to form a plurality of trenches 108c, 108t, and 108p. The trenches 108c are formed in the cell region 112, the trench 108p is formed in the peripheral region 114, and the trench 108t is formed in the transition region 116. Specifically, the trenches 108c, 108t, and 108p are formed by forming a mask over the mask layer 170 of FIG. 4, the mask covering some portions of the mask layer 170 while leaving other regions of the mask layer 170 exposed and performing a dry etch to remove the exposed portions of the mask layer 170 and the corresponding layers underneath (i.e., the pad layer 160, the patterned floating gate film 150', the patterned tunneling film 140', the patterned mask layer 130', the patterned pad layer 120', and the substrate 110).

After the patterning process, the mask layer 170 of FIG. 4 is patterned to be a plurality of patterned mask layers 172 and 174, the pad layer 160 of FIG. 4 is patterned to be a plurality of patterned pad layers 162 and 164, the patterned floating gate film 150' of FIG. 4 is patterned to be a floating gate layer 152, the patterned tunneling film 140' of FIG. 4 is patterned to be a tunneling film 142, and the substrate 110 is patterned to include a plurality of base portions 102 and 104. The base portion 102 of the substrate 110 is located in the cell region 112 of the substrate 110, and the base portion(s) 104 of the substrate 110 is located in the peripheral region 114 of the substrate 110. It is noted that the number of the base portion 104 of the substrate 110 can be plural in some other embodiments, and the base portions 104 are separated from each other by the trench(es) 108p. The tunneling film 142 is disposed over the base portion 102 of the substrate 110, the floating gate layer 152 is disposed over the tunneling film 142, the patterned pad layer 162 is disposed over the floating gate layer 152, and the patterned mask layer 172 is disposed over the patterned pad layer 162. The patterned pad layer 164 is disposed over the base portion 104 of the substrate 110, and the patterned mask layers 174 is disposed over the patterned pad layer 164.

Moreover, since the patterned floating gate film 150' and the patterned tunneling film 140' are over the cell region 112 and not over the peripheral region 114, the etching rate in the cell region 112 may be different from the etching rate in the peripheral region 114. For example, if the patterned floating gate film 150' and the patterned tunneling film 140' are etched faster than the substrate 110 of the peripheral region 114, the trenches 108c are deeper than the trench 108p. That is, the trenches 108c and 108p have different depths. Also, the depth Ta of the portion of the trench 108c in the substrate 110 is different from the depth Tb of the portion of the trench 108p in the substrate 110. In FIG. 5B, the depth Ta is deeper than the depth Tb. Furthermore, the trench 108t has different depths respectively in the cell region 112 and in the peripheral region 114. Hence, the substrate 110 further includes a protrusion portion 106 disposed in the transition region 116 of the substrate 110 after the patterning process. The protrusion portion 106 may be a step in FIGS. 5B and 5C.

Figure 6A:
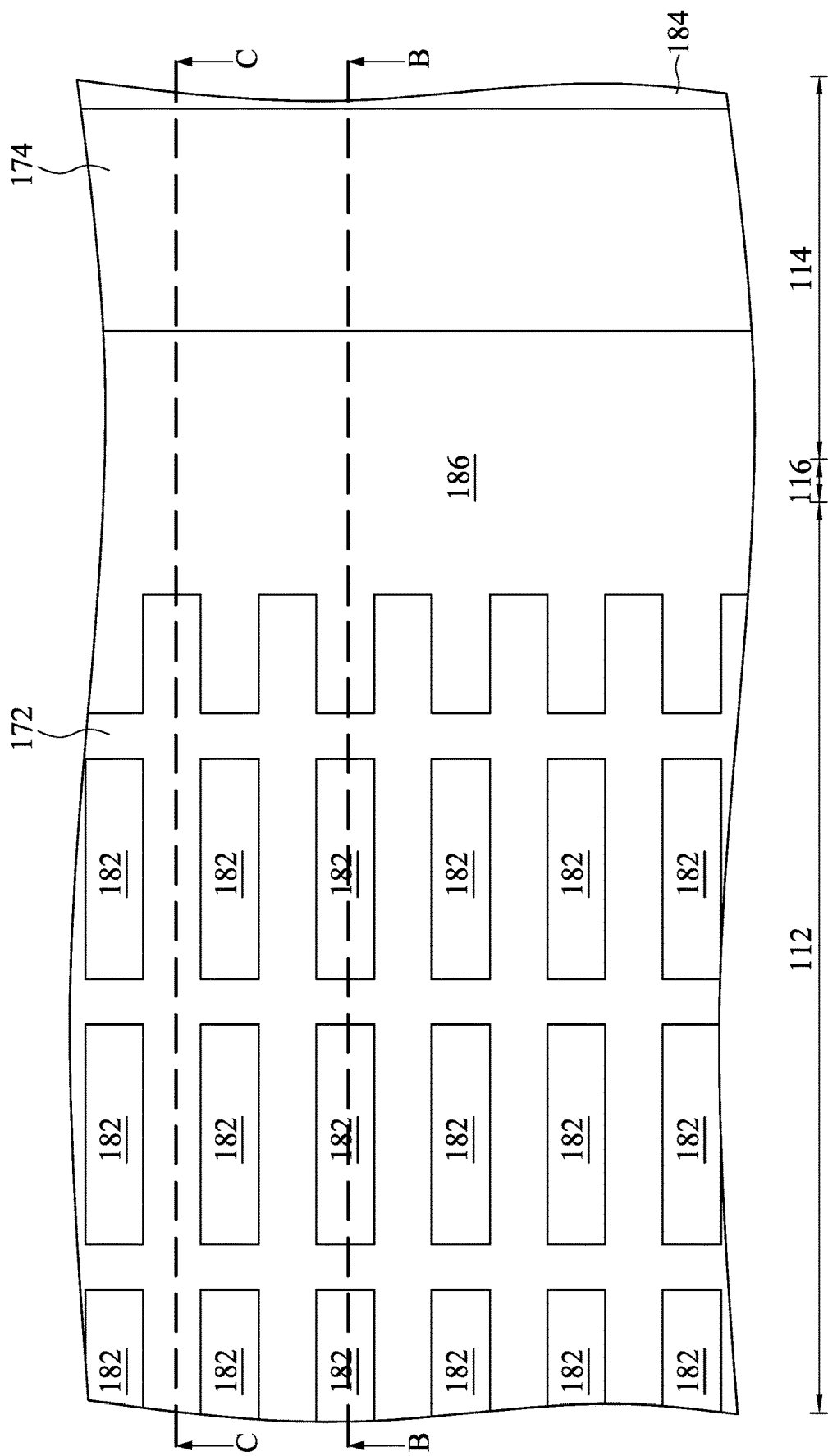

Reference is made to FIGS. 6A to 6C, where FIG. 6A is a top view of the IC, FIG. 6B is a cross-sectional view taking along line B-B of FIG. 6A, and FIG. 6C is a cross-sectional view taking along line C-C of FIG. 6A. A plurality of isolation features 182, 184, and 186 are respectively formed in the trenches 108c, 108p, and 108t of FIG. 5A. It is noted that the number of the isolation feature 184 can be plural in some other embodiments. In greater detail, dielectric material covers the structure of FIG. 5A. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other commonly used CVD methods. The formation of the liner oxide reduces the electrical fields and hence improves the performance of the resulting semiconductor device. A chemical mechanical polish (CMP) is then performed to level the top surface of the dielectric material to the top surfaces of the patterned mask layers 172 and 174 to form a plurality of isolation features 182, 184, and 186 in the trenches 108c, 108p, and 108t of FIG. 5A).

In FIGS. 6A to 6C, the isolation features 182 are disposed in the cell region 112 of the substrate 110, the isolation feature 184 is disposed in the peripheral region 114 of the substrate 110, and the isolation feature 186 is at least disposed in the transition region 116 of the substrate 110. The isolation feature 182 is in contact with the base portions 102 of the substrate 110, the tunneling film 142, the floating gate layer 152, the patterned pad layer 162, and the patterned mask layer 172. The isolation feature 184 is in contact with the base portions 104 of the substrate 110, the patterned pad layer 164, and the patterned mask layer 174. The isolation feature 186 is in contact with the base portions 102, 104 and the protrusion portion 106 of the substrate 110, the tunneling film 142, the floating gate layer 152, the patterned pad layers 162, 164, and the patterned mask layers 172, 174. The protrusion portion 106 of the substrate 110 is embedded in the isolation feature 186. In other words, the isolation feature 186 covers the protrusion portion 106.

Figure 7A:
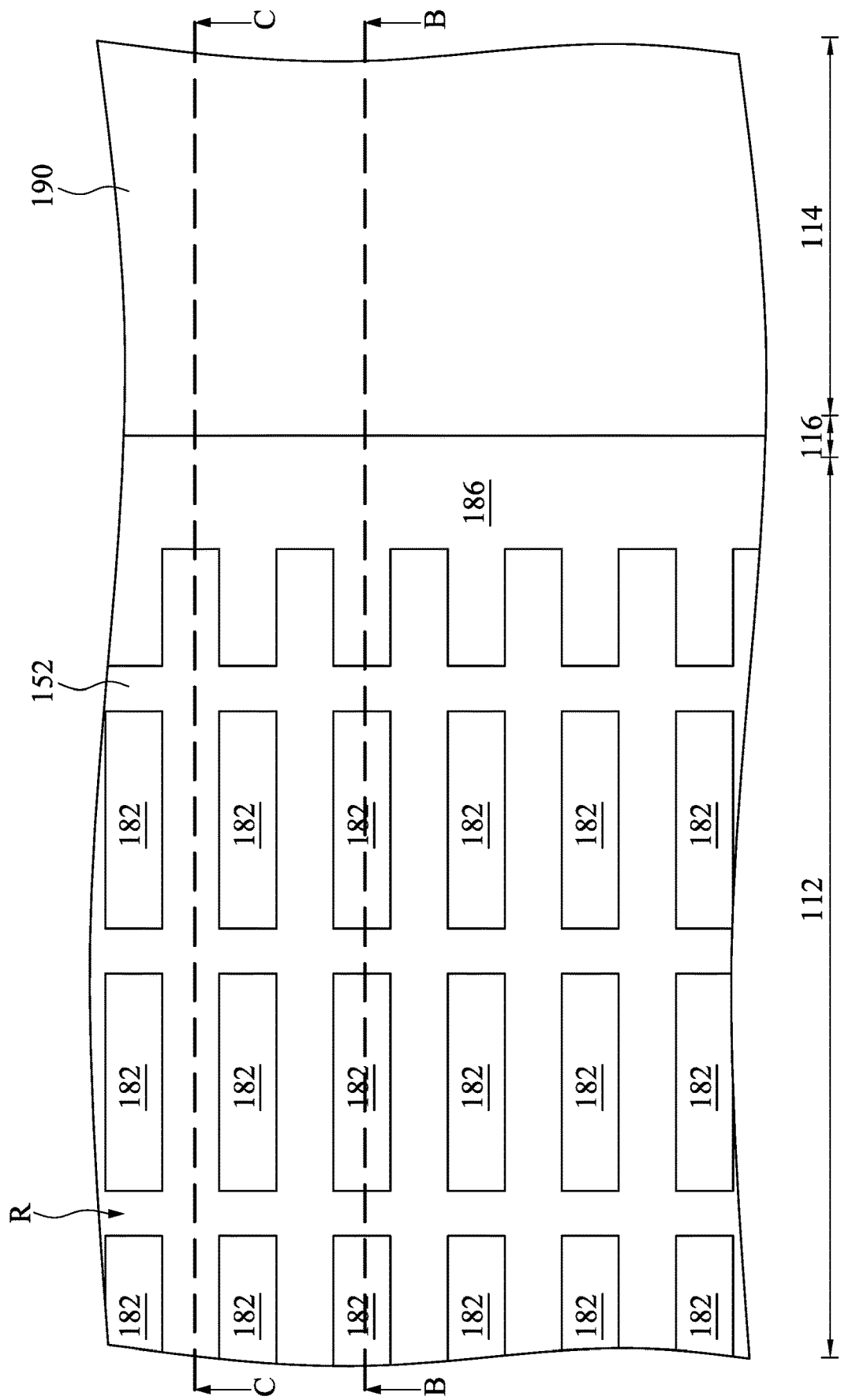

Reference is made to FIGS. 7A to 7C, where FIG. 7A is a top view of the IC, FIG. 7B is a cross-sectional view taking along line B-B of FIG. 7A, and FIG. 7C is a cross-sectional view taking along line C-C of FIG. 7A. A patterned hard mask layer 190 is formed over the peripheral region 114 of the substrate 110 to cover the structures disposed over the peripheral region 114 of the substrate 110 and expose the structures disposed over the cell region 112 of the substrate 110. The patterned mask layers 172 and the patterned pad layers 162 of FIGS. 6A to 6C are then removed. As such, the floating gate layers 152 are exposed. Hence, the floating gate layer 152 and the adjacent isolation features 182 and 186 together define a recess R.

Figure 8A:
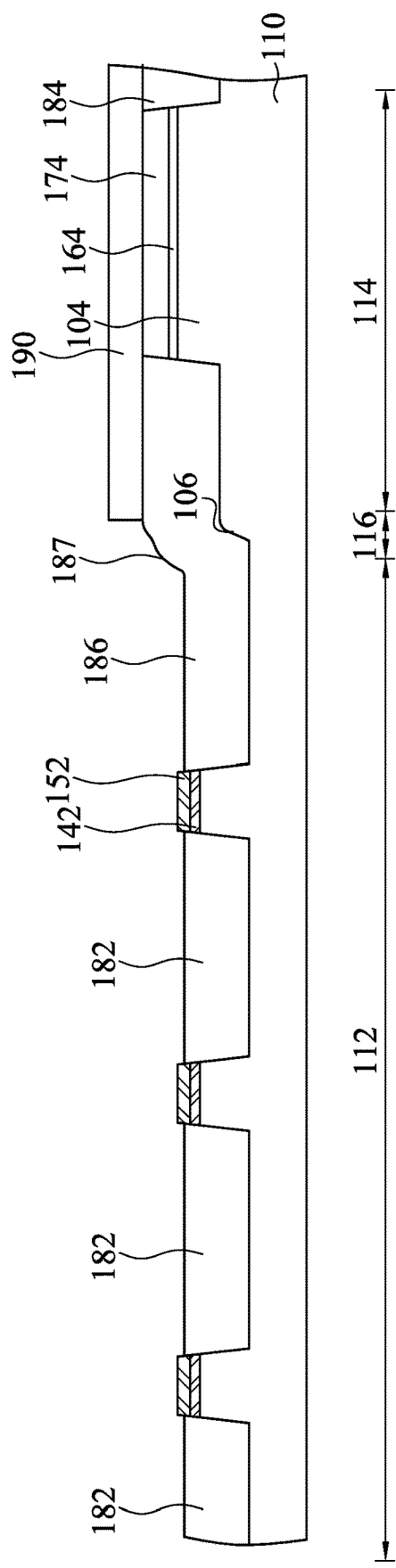
Figure 8B:
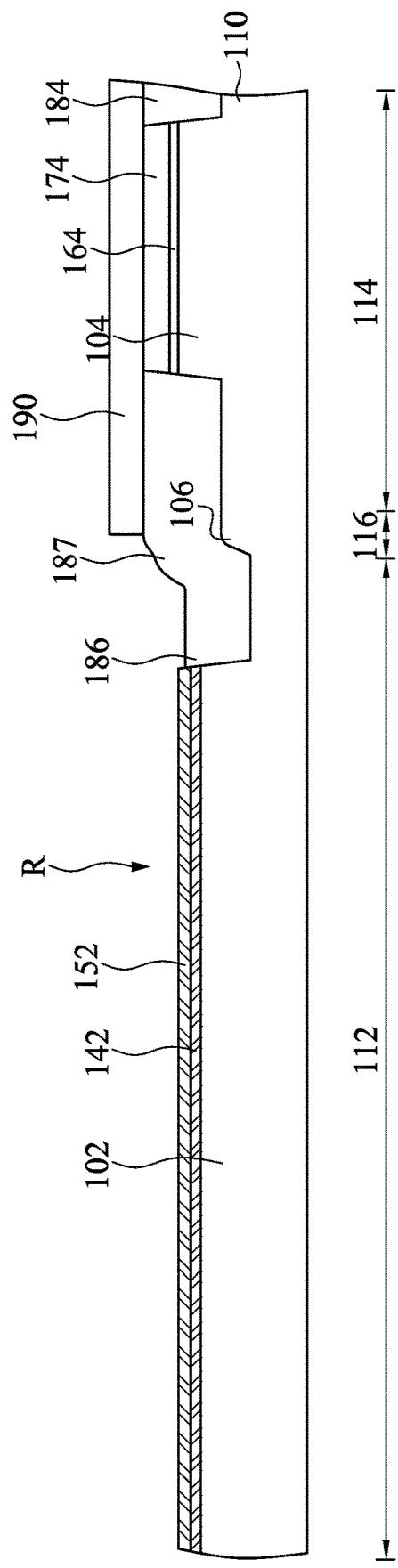

Reference is made to FIGS. 8A and 8B, where the cross-sectional positions of FIGS. 8A and 8B are respectively the same as the cross-sectional position of FIGS. 7B and 7C. The isolation features 182 and the portion of the isolation feature 186 uncovered by the patterned hard mask layer 190 are recessed until the top surfaces of the isolation features 182 and 186 are lower than the top surface of the floating gate layer 152. The top surfaces of the isolation features 182 and 186 can be higher than the bottom surface of the floating gate layer 152 in some embodiments. In some embodiments, the isolation features 182 and 186 can be recessed by performing a wet etching process, and the present disclosure is not limited in this respect. After the isolation features 182 and 186 are recessed, the top surface of the isolation feature 186 is not planar and may have a step 187 adjacent to the edge of the patterned hard mask layer 190. In some embodiments, the step 187 is located over the protrusion portion 106.

Reference is made to FIGS. 9A and 9B, where the cross-sectional positions of FIGS. 9A and 9B are respectively the same as the cross-sectional position of FIGS. 8A and 8B. The patterned hard mask layer 190 of FIGS. 8A and 8B is removed, and the removal method may be performed by solvent stripping or plasma ashing, for example. A dielectric film 310 is conformally formed over the structure of FIGS. 8A and 8B without the patterned hard mask layer 190. In some embodiments, the dielectric film 310 and the tunneling film 142 may have the same or different materials. That is, the dielectric film 310 may include, for example, a dielectric material such as silicon dioxide ($SiO_2$), silicon nitride ($Si_3N_4$), oxynitrides (SiON), high-k materials, other non-conductive materials, or combinations thereof. The dielectric film 310 may be formed using chemical vapor deposition (CVD), physical vapor deposition (PVD), atomic layer deposition (ALD), ozone oxidation, other suitable processes, or combinations thereof.

A control gate film 320 is conformally formed over the dielectric film 310. The control gate film 320 may include polysilicon formed through, for example low pressure CVD (LPCVD) methods, CVD methods and PVD sputtering methods employing suitable silicon source materials. If desired, the control gate film 320 may be ion implanted to the desired conductive type. It is to be appreciated other gate electrode material such as metal, metal alloys, single crystalline silicon, or combinations thereof.

A hard mask layer 330 is conformally formed over the control gate film 320. The hard mask layer 330 may include single layer or multiple layers. In some embodiments, the hard mask layer 330 includes $SiN/SiO_2/SiN$ stacked layers or other suitable materials. In some embodiments, the hard mask layer 330 may be formed using chemical vapor deposition (CVD), physical vapor deposition (PVD), atomic layer deposition (ALD), ozone oxidation, other suitable processes, or combinations thereof.

Figure 10A:
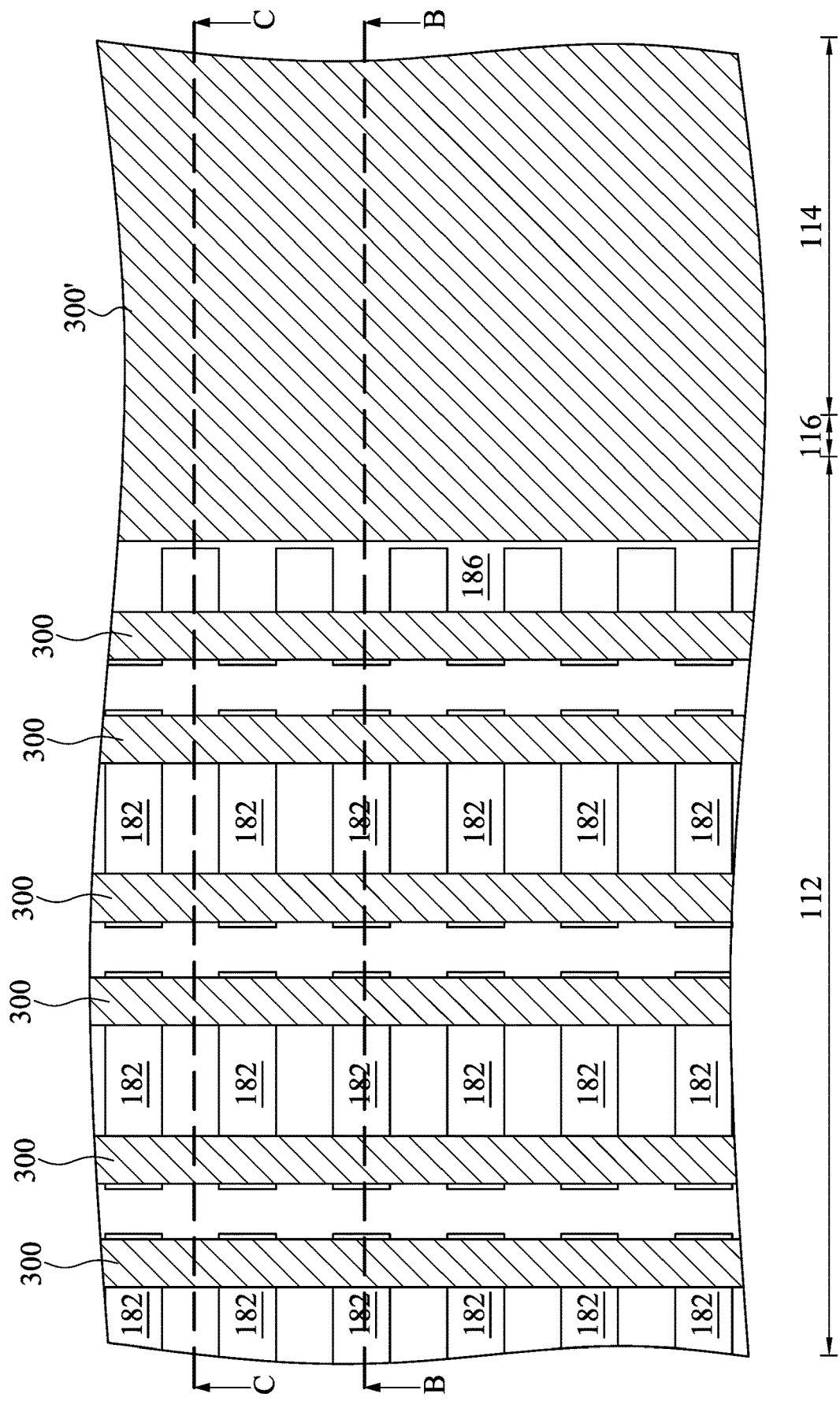
Figure 10B:
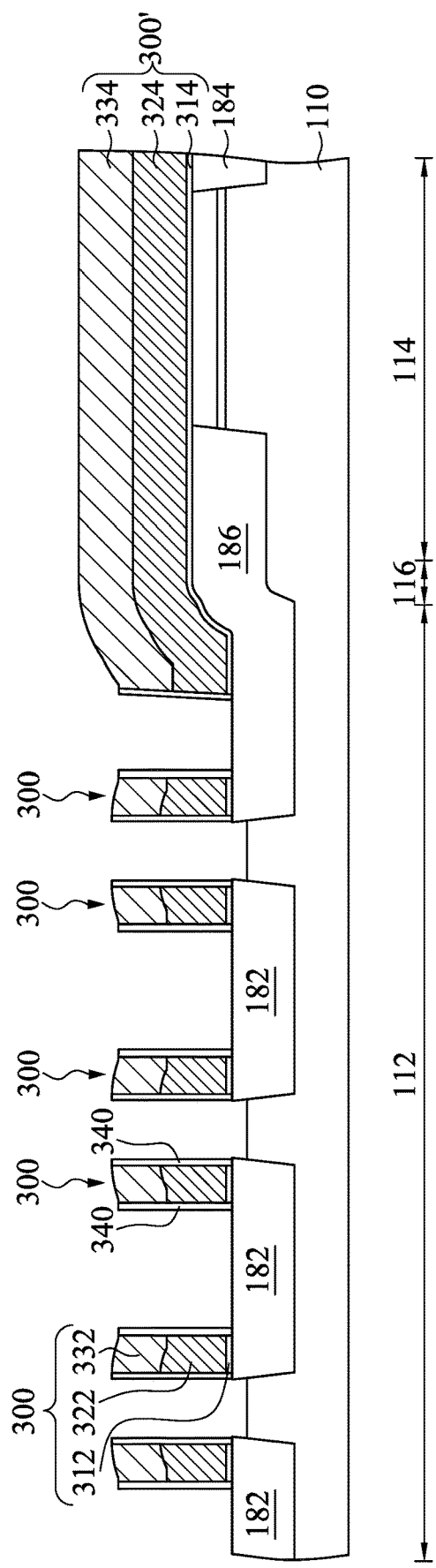
Figure 10C:
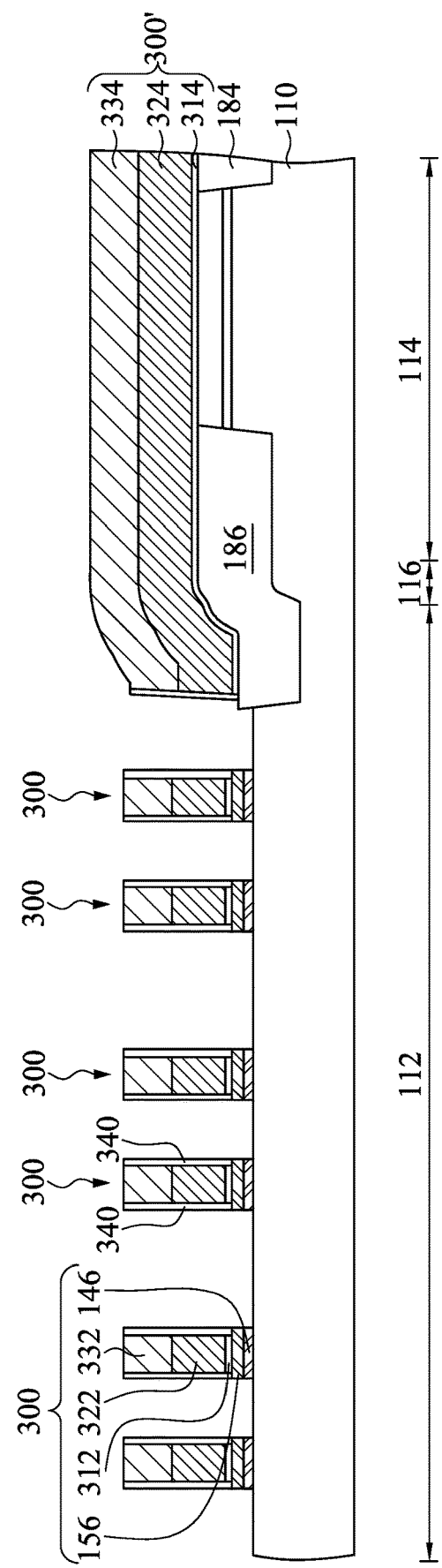

Reference is made to FIGS. 10A to 10C, where FIG. 10A is a top view of the IC, FIG. 10B is a cross-sectional view taking along line B-B of FIG. 10A, and FIG. 10C is a cross-sectional view taking along line C-C of FIG. 10A. The hard mask layer 330, the control gate film 320, the dielectric film 310, the floating gate layer 152, and the tunneling film 142 of FIGS. 9A and 9B are patterned to form a plurality of gate stacks 300 over the cell region 112 of the substrate 110. Two adjacent gate stacks 300 are formed between two adjacent isolation features 182 (186). Specifically, at least one of the gate stacks 300 includes a tunneling layer 146, a floating gate 156, a dielectric layer 312, a control gate 322, and a hard mask 332. The tunneling layer 146 is formed from the tunneling film 142 of FIGS. 9A and 9B. For example, the tunneling films 142 can be patterned to form the tunneling layers 146. The floating gate 156 is formed over the tunneling layer 146 and is formed from the floating gate layer 152 of FIGS. 9A and 9B. For example, the floating gate layer 152 can be patterned to form the floating gates 156. The dielectric layer 312 is formed over the floating gate 156. For example, the dielectric film 310 can be patterned to form the dielectric layer 312. The control gate 322 is formed over the dielectric layer 312. For example, the control gate film 320 can be patterned to form the control gate 322. The hard mask 332 is formed over the control gate 322. For example, the hard mask layer 330 can be patterned to form the hard mask 332. In some embodiments, the floating gate 156 may be thinner than the control gate 322. At least one of the gate stacks 300 further include a pair of spacers 340 disposed over the floating gate 156 and on opposite sides of the dielectric layer 312, the control gate 322, and the hard mask 332. For clarity, the spacers 340 are illustrated in FIGS. 10B and 10C and are omitted in FIG. 10A. In some embodiments, the spacer 340 includes an inner silicon oxide layer, a middle silicon nitride layer, and an outer silicon oxide layer. Furthermore, the portions of the hard mask layer 330, the control gate film 320, and the dielectric film 310 over the peripheral region 114 is patterned to form a semiconductor stack 300' including a dielectric layer 314, a control gate layer 324 over the dielectric layer 314, and a hard mask layer 334 over the control gate layer 324.

Figure 11A:
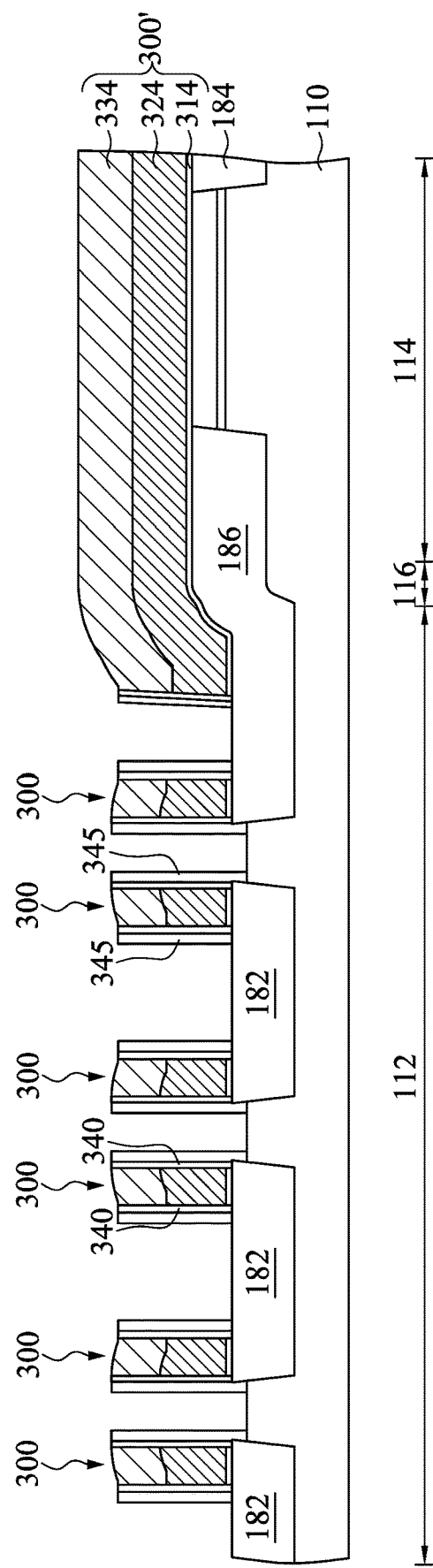
Figure 11B:
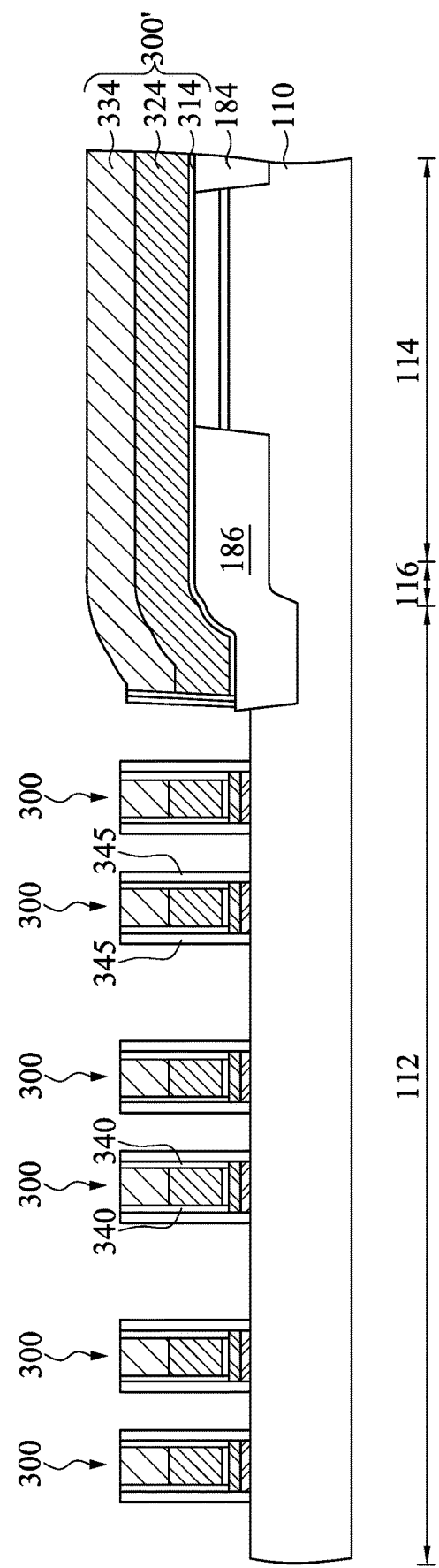

Reference is made to FIGS. 11A and 11B, where the cross-sectional positions of FIGS. 11A and 11B are respectively the same as the cross-sectional position of FIGS. 10B and 10C. Dielectric layers 345 are formed on opposite sides of the gate stacks 300. In some embodiments, the dielectric layers 345 are high temperature oxide layer or other suitable dielectric layers. In some embodiments, a dielectric film may be conformally formed over the structure of FIGS. 10A to 10C, and an etching process is performed to remove the horizontal portions of the dielectric film to form the dielectric layers 345.

Figure 12A:
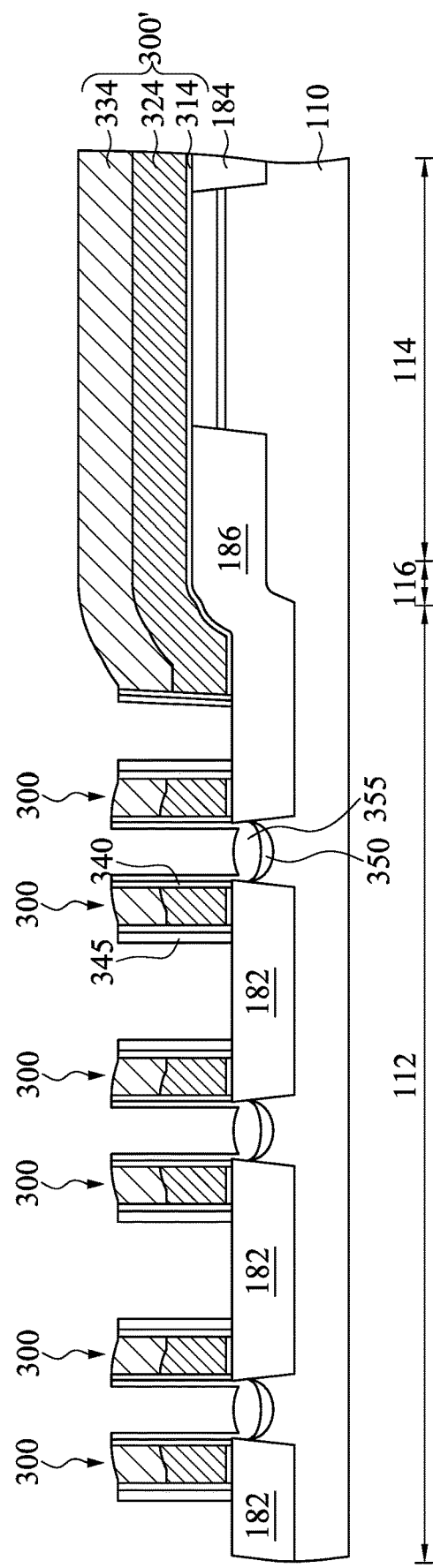
Figure 12B:
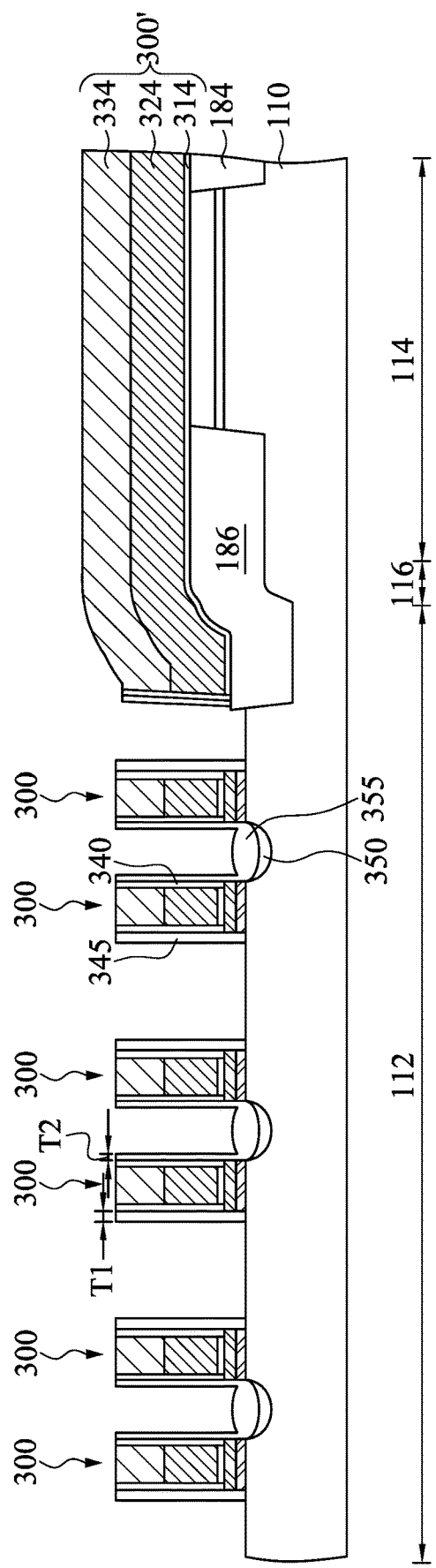

Reference is made to FIGS. 12A and 12B, where the cross-sectional positions of FIGS. 12A and 12B are respectively the same as the cross-sectional position of FIGS. 11A and 11B. The dielectric layers 345 between adjacent two gate stacks 300 are removed, and source regions 350 are formed between two adjacent gate stacks 300. For example, a patterned photoresist layer is formed by a combination of spin coating, exposing and developing processes to expose areas of the substrate 110 between adjacent gate stacks 300. The exposed dielectric layers 345 are then removed, and ions are implanted into the areas to form the source regions 350. A common source (CS) dielectric layer 355 is formed over the source region 350. The CS dielectric layer 355 may be a dielectric isolation structure and may be formed by oxidizing the substrate 110, other suitable processes, or combinations thereof. The patterned photoresist layer is then removed, and the removal method may be performed by solvent stripping or plasma ashing, for example.

In FIG. 12B, since the dielectric layers 345 and the CS dielectric layer 355 are formed separately, the thickness T1 of the dielectric layers 345 and the thickness T2 of the portion of CS dielectric layer 355 in contact with the spacer 340 are different. For example, the thickness T1 is greater than the thickness T2, and the present disclosure is not limited in this respect.

Figure 13A:
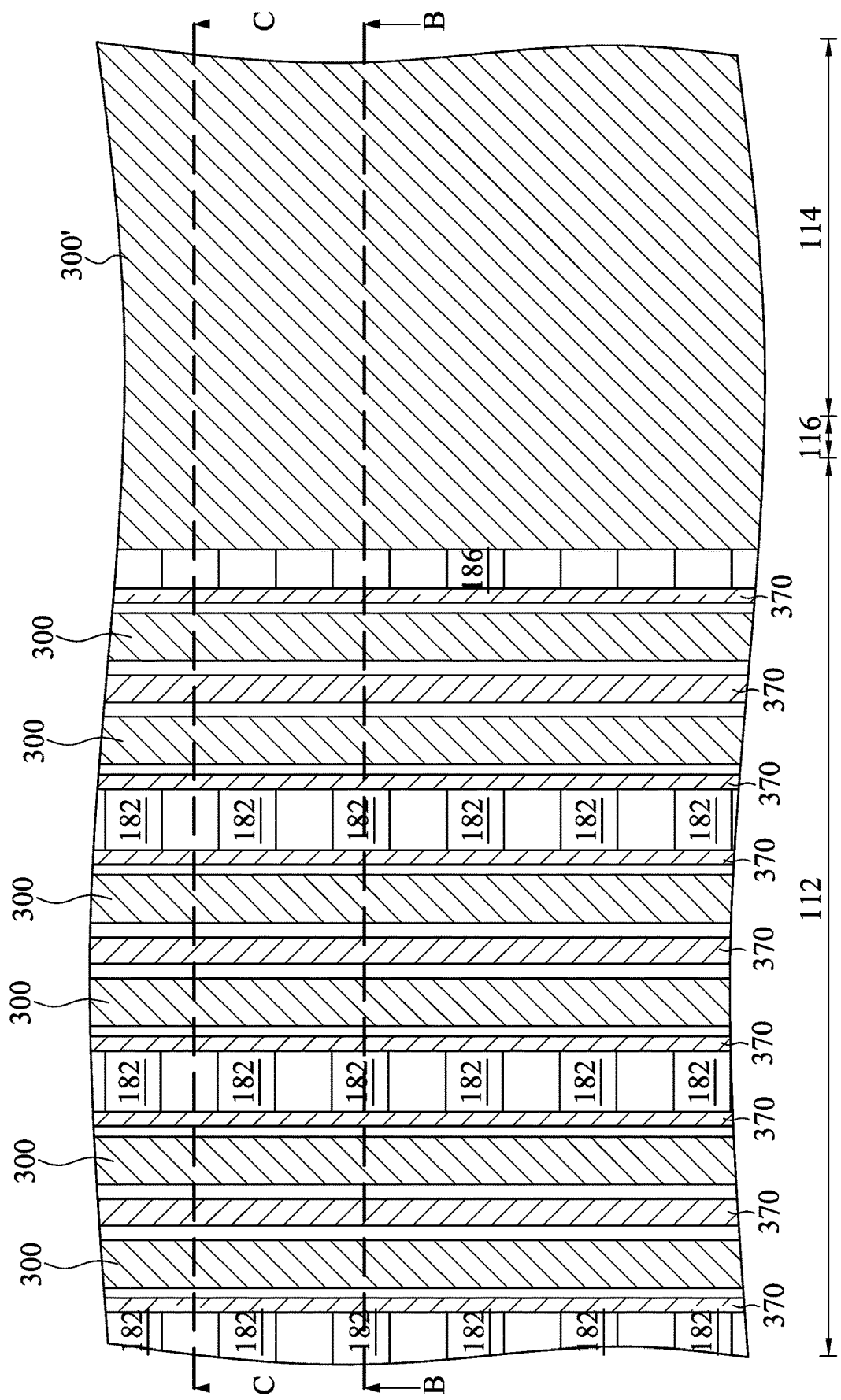

Reference is made to FIGS. 13A to 13C, where FIG. 13A is a top view of the IC, FIG. 13B is a cross-sectional view taking along line B-B of FIG. 13A, and FIG. 13C is a cross-sectional view taking along line C-C of FIG. 13A. A plurality of erase gates 360 and select gates (or word lines) 365 are respectively formed on opposite sides of the gate stacks 300. For example, a conductive layer is deposited over the substrate 110, and the conductive layer is patterned or etched back. Then, a plurality of hard masks 370 are respectively formed over the patterned conductive layer, and another etching process is formed to pattern the patterned conductive layer using the hard masks 370 as masks to form the erase gates 360 and the select gates 365. In some embodiments, the erase gates 360 and the select gates 365 may be made of polysilicon or other suitable materials.

Reference is made to FIGS. 14A and 14B, where the cross-sectional positions of FIGS. 14A and 14B are respectively the same as the cross-sectional position of FIGS. 13B and 13C. The semiconductor stack 300' of FIGS. 13B and 13C are removed to expose the patterned mask layers 174 (see FIGS. 13B and 13C) and the isolation feature 184. A portion of the semiconductor stack 300'' remains over the isolation feature 186 after the removing process. The patterned pad layer 164 and the patterned mask layer 174 (see FIGS. 13A and 13B) are then removed to expose the base portion 104. Then, the isolation features 186 and 184 are recessed until the top surfaces of the isolation features 186 and 184 are substantially flush with the base portion 104. At least one semiconductor device 400 is formed over the base portion 104 and at least one semiconductor stack 400' is formed over the isolation feature 186. In some embodiments, the semiconductor device 400 can be a transistor (such as a high-κ metal gate (HKMG) transistor, and/or a logic transistor), and the present disclosure is not limited in this respect. In some embodiments, the semiconductor stack 400' and the semiconductor device 400 are made of the same materials.

In some embodiments, when the semiconductor device 400 is a transistor, during the formation of source/drain region of the semiconductor device 400, a plurality of drain regions 380 are formed in the cell region 112 of the substrate 110. Specifically, the drain regions 380 are respectively disposed adjacent to the select gates 365. In other words, the gate stack 300 and the select gate 365 are disposed in a position between the source region 350 and the drain region 380. In some embodiments, the drain regions 380 are formed by performing an ion implantation process in the substrate 110.

Figure 15A:
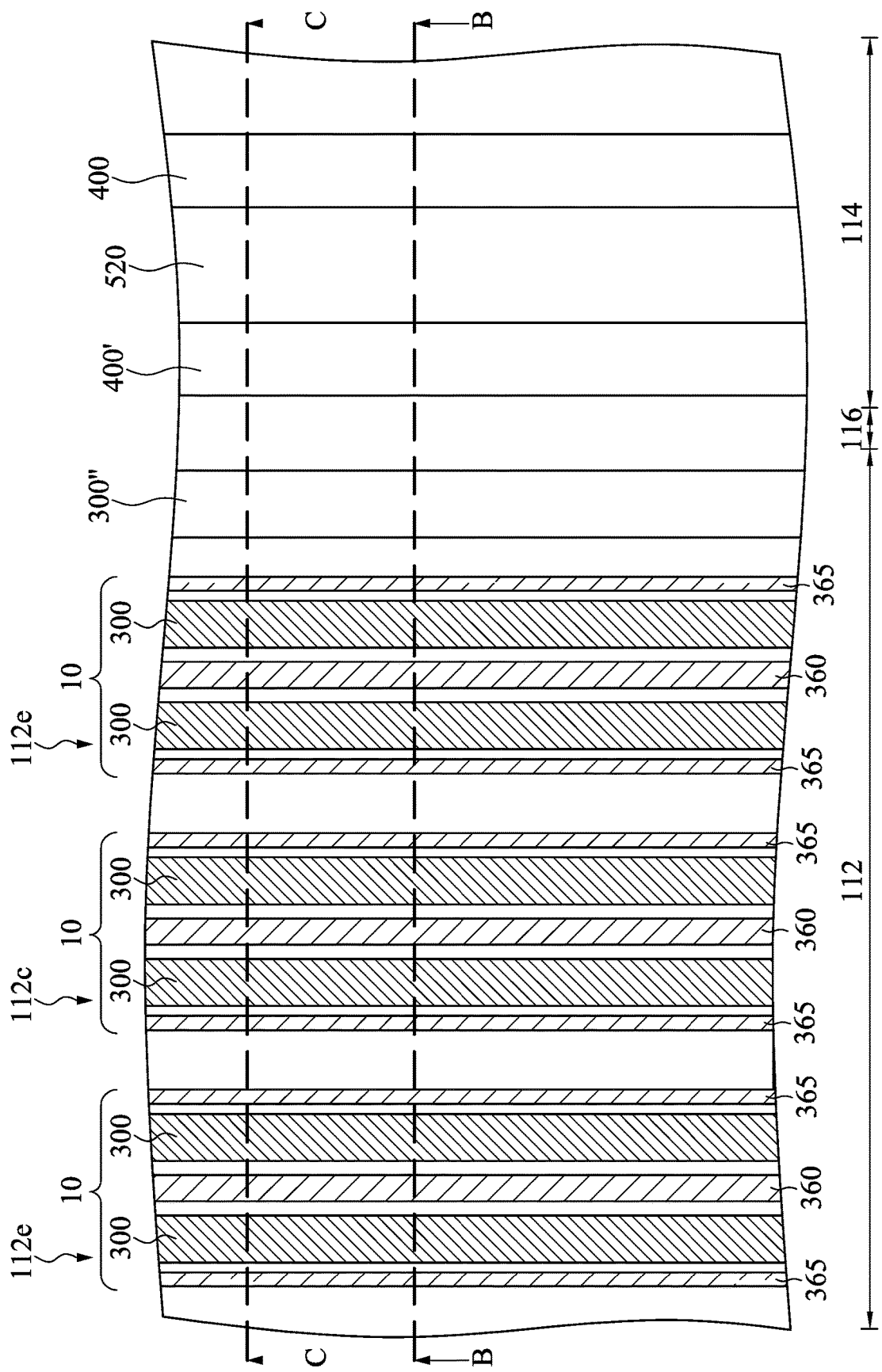
Figure 15B:
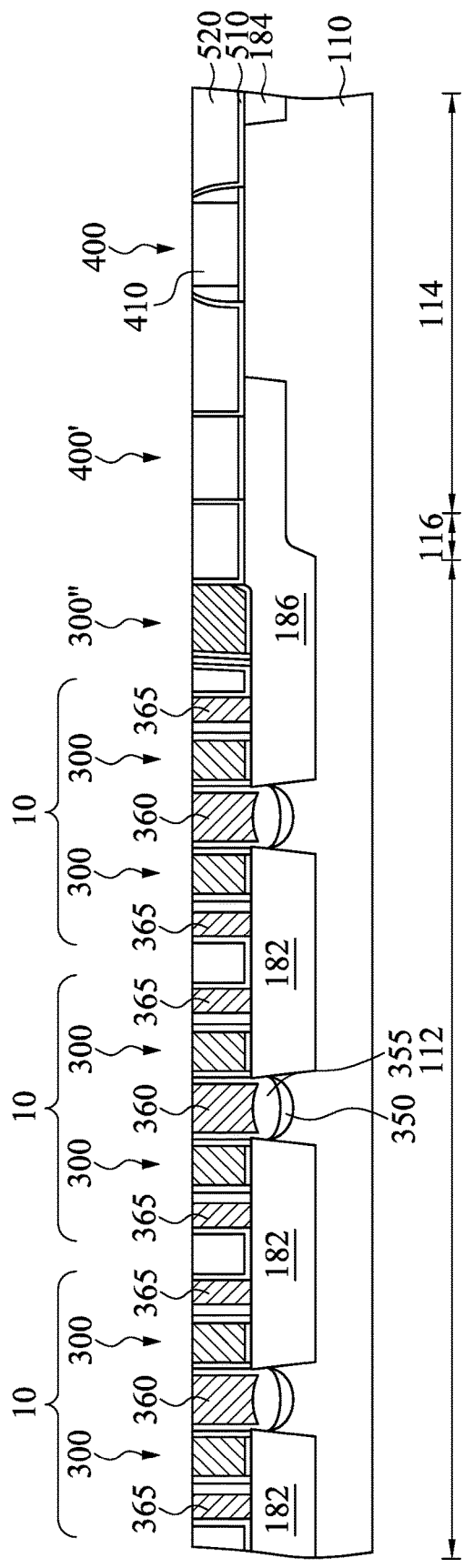
Figure 15C:
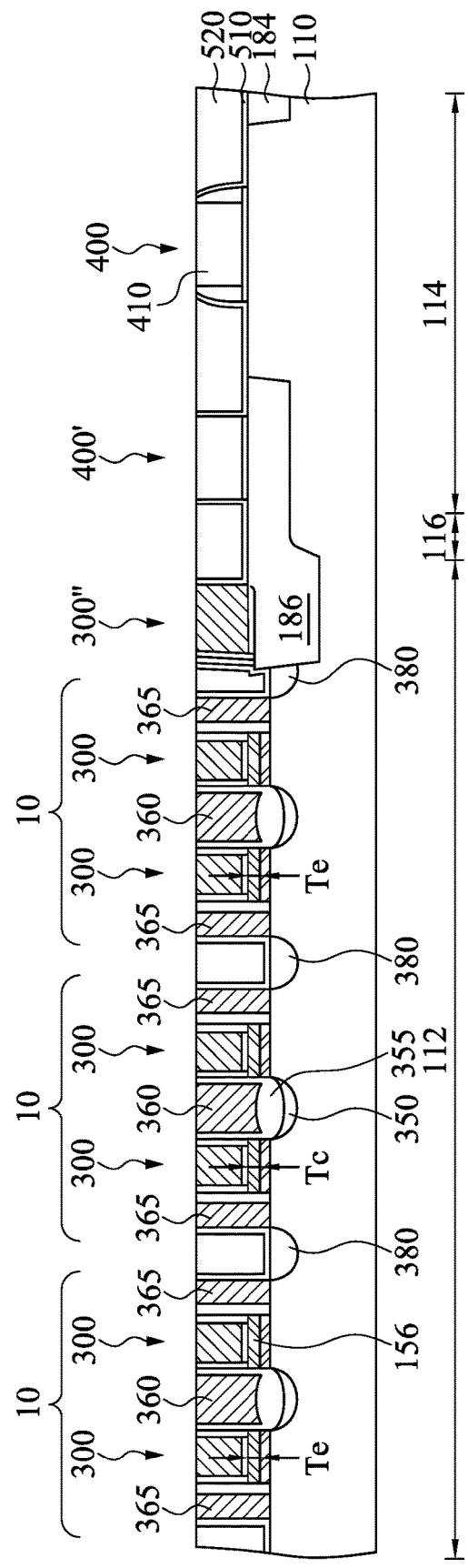

Reference is made to FIGS. 15A to 15C, where FIG. 15A is a top view of the IC, FIG. 15B is a cross-sectional view taking along line B-B of FIG. 15A, and FIG. 15C is a cross-sectional view taking along line C-C of FIG. 15A. An etching stop layer 510 is conformally formed over the structure of FIGS. 14A and 14B, and an interlayer dielectric (ILD) 520 is formed over the etching stop layer 510. Then, a chemical mechanical polish (CMP) process is performed to level the top surface of the ILD 520 with the top surfaces of the erase gates 360, the control gates 322, the select gates 365 of the memory cells 10 and a top surface of a gate 410 of the semiconductor device 400. As such, a plurality of memory cells 10 are formed. At least one of the memory cells 10 includes two gate stacks 300, one erase gate 360, two select gate 365, one source region 350, and two drain region 380. Two adjacent memory cells 10 share one drain region 380.

In FIGS. 15A to 15C, since the floating gate film 150 of FIG. 3 is deposited over the substrate 110, the thickness of the floating gate film 150 is uniform. Therefore, the floating gate 156 of the memory cell 10 disposed at the center 112c of the cell region 112 of the substrate 110 and the floating gate 156 of the memory cell 10 disposed at an edge 112e of the cell region 112 of the substrate 110 have substantially the same thickness. That is, the thickness Tc of the memory cell 10 disposed at the center 112c of the cell region 112 of the substrate 110 is substantially the same as the thickness Te of the memory cell 10 disposed at the edge 112e of the cell region 112 of the substrate 110. With such configuration, the product yield of the integrated circuit is improved. It is noted that the number of the memory cells 10 in FIGS. 15A to 15C is illustrative, and should not limit the present disclosure. In some other embodiments, the number of the memory cells 10 can be greater than three and arranged as an array. The floating gates 156 of the memory cells 10 have substantially the same thickness. The term "substantially" as used herein may be applied to modify any quantitative representation which could permissibly vary without resulting in a change in the basic function to which it is related.

Figure 16A:
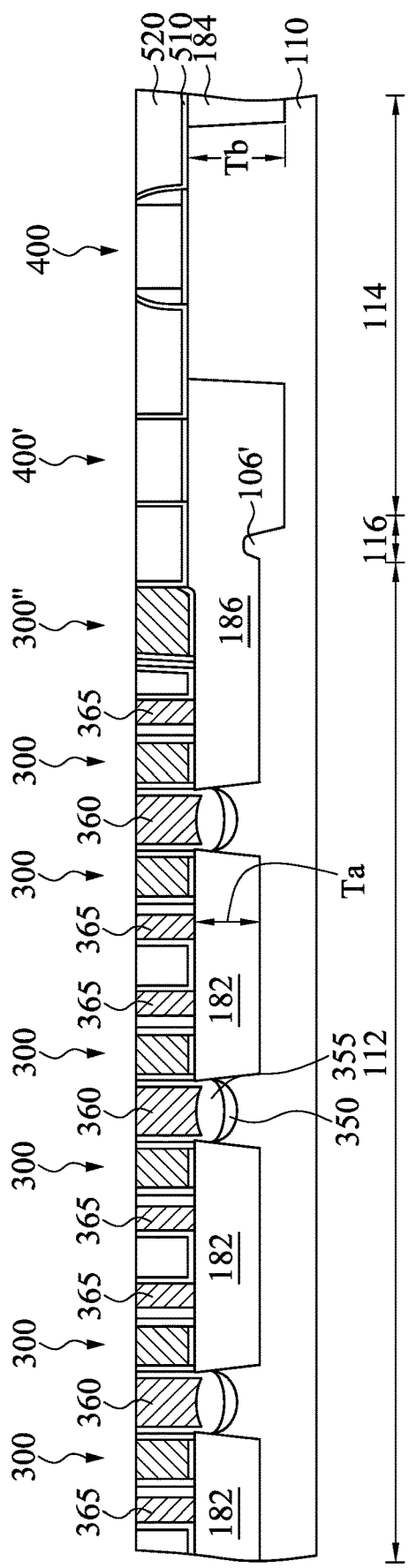
FIGS. 16A to 16B are cross-sectional views of an integrated circuit (IC) in accordance with some embodiments.
Figure 16B:
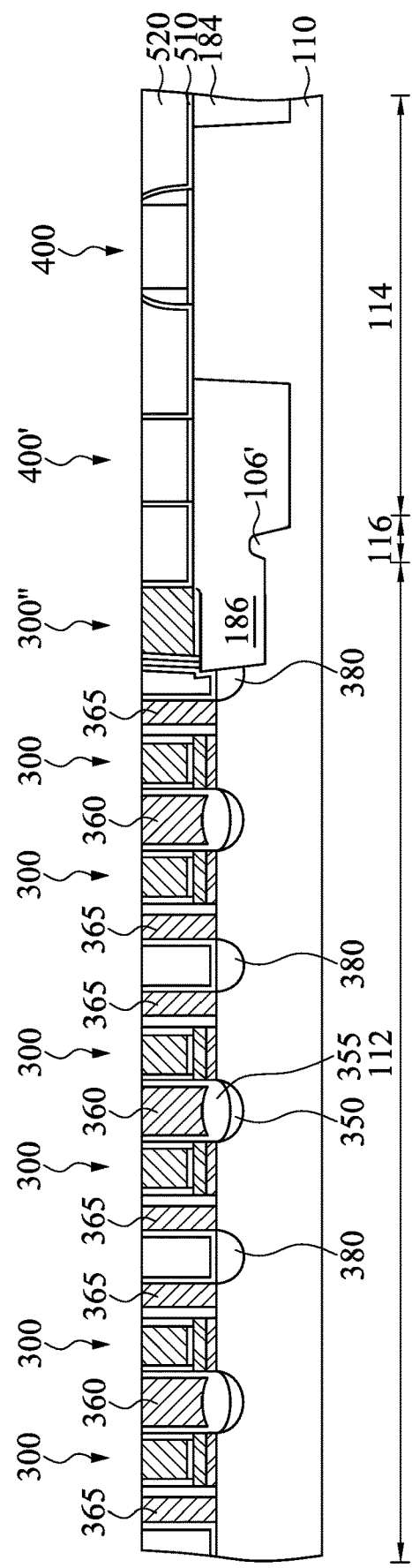

Reference is made to FIGS. 16A and 16B, where the cross-sectional positions of FIGS. 16A and 16B are respectively the same as the cross-sectional position of FIGS. 15B and 15C. The difference between the integrated circuits of FIGS. 16A to 16B and the integrated circuits of FIGS. 15A to 15C pertains to the thickness of the isolation feature 184 and the profile of the isolation feature 186. In some embodiments, if the patterned floating gate film 150' and the patterned tunneling film 140' are etched slower than the substrate 110 of the peripheral region 114 in FIG. 4, the isolation feature 184 is deeper than the isolation feature 182. That is, the isolation features 184 and 182 have different depths Ta and Tb. In FIG. 16A, the depth Tb is deeper than the depth Ta. Furthermore, the isolation feature 186 has different depths respectively in the cell region 112 and in the peripheral region 114. Hence, the substrate 110 further includes a protrusion portion 106' disposed in the transition region 116 of the substrate 110. The protrusion portion 106' may be a bump in FIGS. 16A and 16B. Other relevant structural details of the integrated circuits of FIGS. 16A to 16B are similar to the integrated circuits of FIGS. 15A to 15C, and, therefore, a description in this regard will not be repeated hereinafter.

Figure 17A:
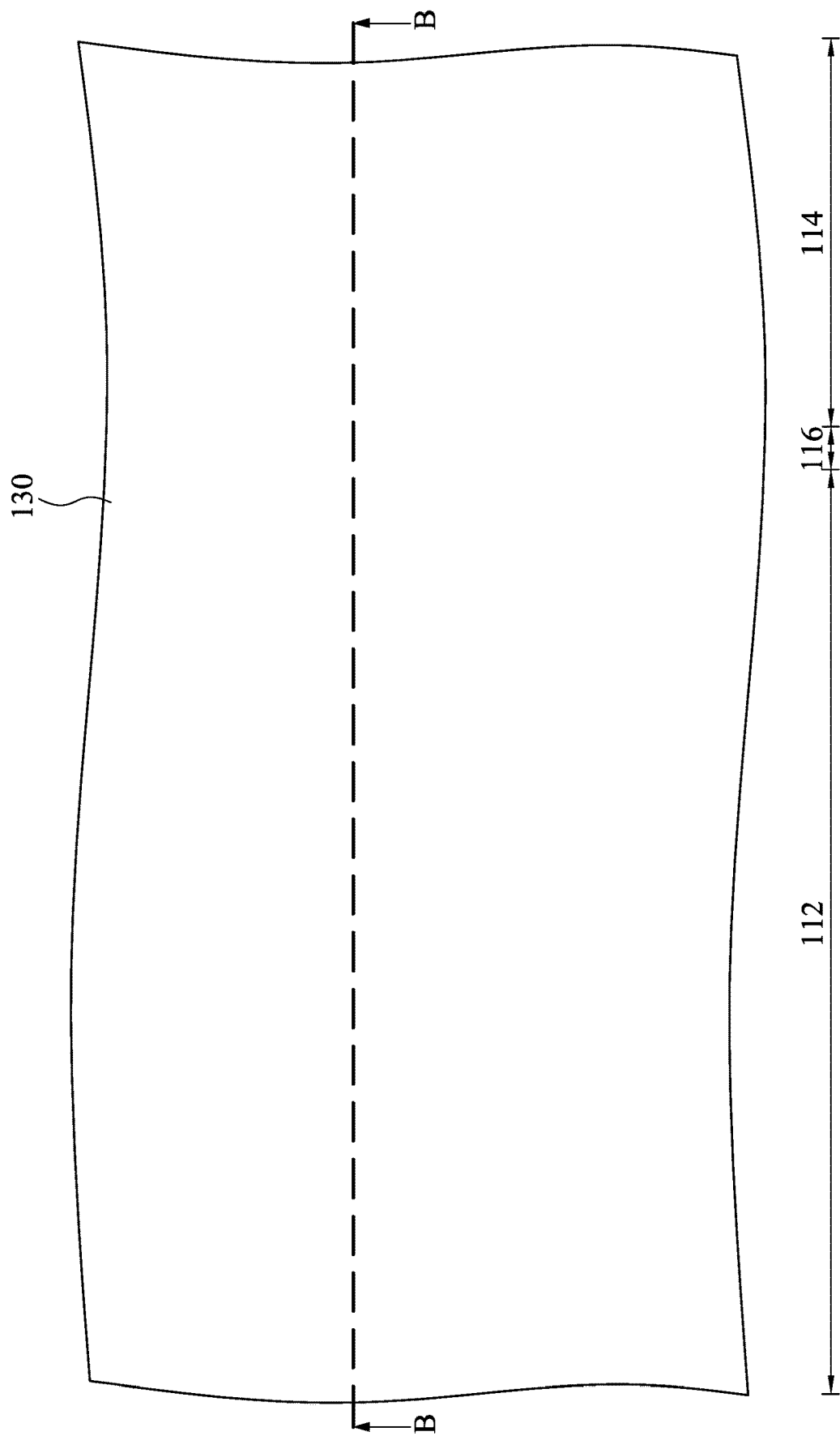
Figure 17B:
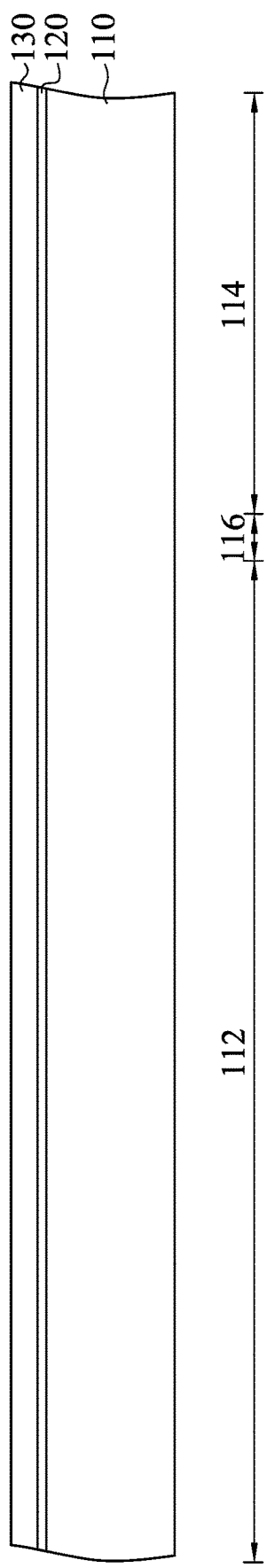

FIGS. 17A to 31C illustrate a method for manufacturing an integrated circuit (IC) in different stages in accordance with some embodiments. Reference is made to FIGS. 17A and 17B, where FIG. 17A is a top view of the IC according with some embodiments, and FIG. 17B is a cross-sectional view taking along line B-B of FIG. 17A. A substrate 110 is provided. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 110 includes a cell region 112, a peripheral region 114, and a transition region 116. The peripheral region 114 is located at least one edge of the cell region 112. For example, the peripheral region 114 surrounds the cell region 112. The transition region 116 is disposed between the cell region 112 and the peripheral region 114. A pad layer 120 is formed over the substrate 110. The pad layer 120 may be formed of dielectric material, such as an oxide layer. A mask layer 130 is formed over the pad layer 120. In some embodiments, the mask layer 130 is formed of dielectric material, such as silicon nitride (SiN) or other suitable materials. In some embodiments, the thickness of the mask layer 130 is few hundred Angstroms, such as about 200 to about 2000 Angstroms, and the thickness of the pad layer 120 is about 30 to about 300 Angstroms, and the present disclosure is not limited in this respect.

Figure 18:
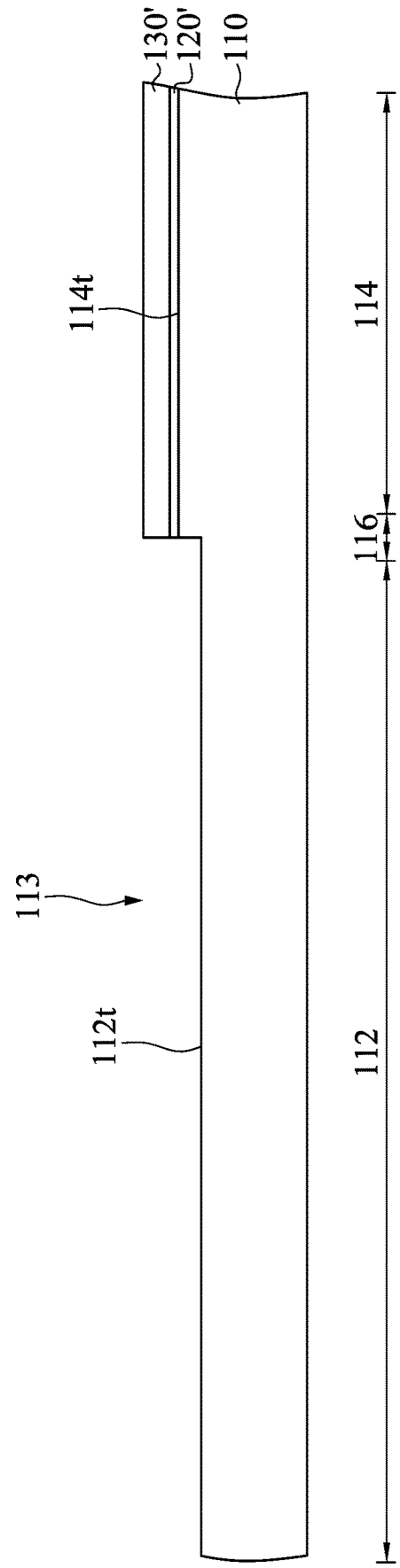

Reference is made to FIG. 18, where the cross-sectional position of FIG. 18 is the same as the cross-sectional position of FIG. 17B. The pad layer 120 and the mask layer 130 of FIG. 17B are patterned to respectively form a patterned pad layer 120' and a patterned mask layer 130' over the peripheral region 114 of the substrate 110. Specifically, portions of the pad layer 120 and the mask layer 130 above the cell region 112 of the substrate 110 are removed to expose the cell region 112 of the substrate 110, which is then recessed (such as etched) through the patterned pad layer 120' and the mask layer 130'. Therefore, a recess 103 is formed in the cell region 112 of the substrate 110. A top surface 112t of the cell region 112 is lower than a top surface 114t of the peripheral region 114. In some embodiments, the depth of the recess 113 is about 50 Angstroms to about 2000 Angstroms.

Figure 19:
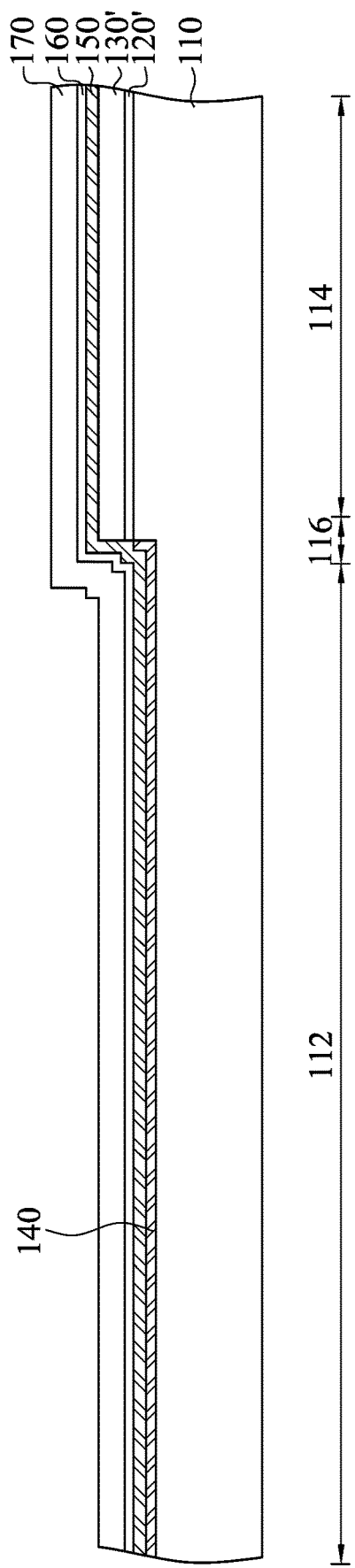

Reference is made to FIG. 19, where the cross-sectional position of FIG. 19 is the same as the cross-sectional position of FIG. 18. A tunneling film 140 is then conformally formed over the exposed substrate 110 of FIG. 18. That is, the tunneling film 140 is in contact with the cell region 112 of the substrate 110. In some embodiments, the tunneling film 140 may include, for example, a dielectric material such as silicon dioxide ($SiO_2$), silicon nitride ($Si_3N_4$), oxynitrides (SiON), high-k materials, other non-conductive materials, or combinations thereof. The tunneling film 140 may be formed using thermal oxide, chemical vapor deposition (CVD), physical vapor deposition (PVD), atomic layer deposition (ALD), ozone oxidation, other suitable processes, or combinations thereof.

A floating gate film 150 is conformally formed over the tunneling film 140 and the patterned mask layer 130'. The floating gate film 150 may include polysilicon formed through, for example low pressure CVD (LPCVD) methods, CVD methods and PVD sputtering methods employing suitable silicon source materials. If desired, the floating gate film 150 may be ion implanted to the desired conductive type. It is to be appreciated other gate electrode material such as metal, metal alloys, single crystalline silicon, or combinations thereof.

Another pad layer 160 is conformally formed over the floating gate film 150, and another mask layer 170 is conformally formed over the pad layer 160. The pad layer 160 may be formed of dielectric material, such as an oxide layer. The mask layer 170 can be formed of dielectric material, such as silicon nitride (SiN) or other suitable materials. In some embodiments, the thickness of the mask layer 170 is few hundred Angstroms, such as about 200 to about 2000 Angstroms, and the thickness of the pad layer 160 is about 30 to about 300 Angstroms, and the present disclosure is not limited in this respect.

Figure 20:
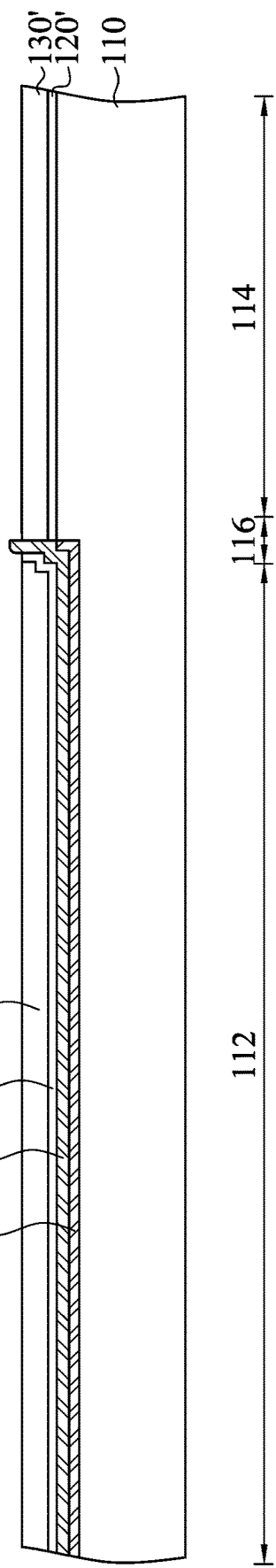

Reference is made to FIG. 20, where the cross-sectional position of FIG. 20 is the same as the cross-sectional position of FIG. 19. The mask layer 170, the pad layer 160, and the floating gate film 150 of FIG. 19 are patterned to form a patterned floating gate film 150', a patterned pad layer 160', and a patterned mask layer 170' over the cell region 112 of the substrate 110. Specifically, portions of the mask layer 170, the pad layer 160, and the floating gate film 150 above the peripheral region 114 of the substrate 110 are removed to expose the patterned mask layer 130'. In some embodiments, the mask layer 170, the pad layer 160, and the floating gate film 150 can be removed by using multiple etching processes. However, the patterning process is not limited to a photolithography process using photo-resists, and may be performed by an immersion lithography, electron beam lithography, or other suitable processes. As a result, the patterned mask layer 170', the patterned pad layer 160', and the patterned floating gate film 150' as shown in FIG. 20 is obtained.

Figure 21A:
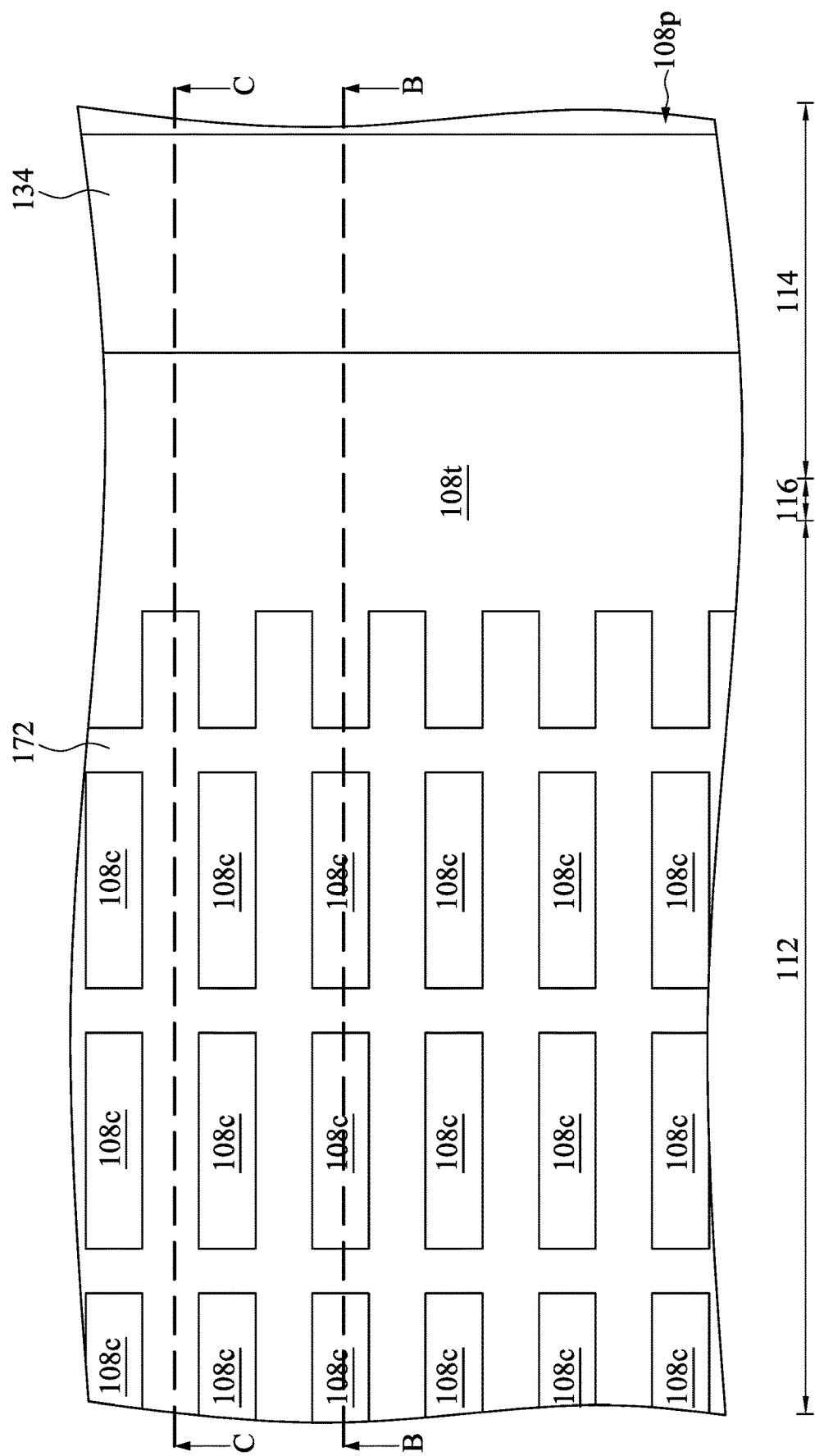

Reference is made to FIGS. 21A to 21C, where FIG. 21A is a top view of the IC, FIG. 21B is a cross-sectional view taking along line B-B of FIG. 21A, and FIG. 21C is a cross-sectional view taking along line C-C of FIG. 21A. The structure of FIG. 20 is patterned to form a plurality of trenches 108c, 108t, and 108p. The trenches 108c are formed in the cell region 112, the trench 108p is formed in the peripheral region 114, and the trench 108t is formed in the transition region 116. Specifically, the trenches 108c, 108t, and 108p are formed by forming a mask over the patterned mask layers 170' and 130' of FIG. 20, the mask covering some portions of the patterned mask layers 170' and 130' while leaving other regions of the patterned mask layers 170' and 130' exposed and performing a dry etch to remove the exposed portions of the patterned mask layers 170', 130' and the corresponding layers underneath (i.e., the patterned pad layers 160', 120', the patterned floating gate film 150', the tunneling film 140, and the substrate 110).

After the patterning process, the patterned mask layer 170' of FIG. 20 is patterned to be a patterned mask layer 172, the pad layer 160' of FIG. 20 is patterned to be a patterned pad layer 162, the floating gate film 150' of FIG. 20 is patterned to be a floating gate layer 152, the tunneling film 140 of FIG. 20 is patterned to be a tunneling film 142, the patterned mask layer 130' of FIG. 20 is patterned to be a patterned mask layer 134, the pad layer 120' of FIG. 20 is patterned to be a patterned pad layer 124, and the substrate 110 is patterned to include a plurality of base portions 102 and 104. The base portion 102 of the substrate 110 is located in the cell region 112 of the substrate 110, and the base portion(s) 104 of the substrate 110 is located in the peripheral region 114 of the substrate 110. It is noted that the number of the base portion 104 of the substrate 110 can be plural in some other embodiments, and the base portions 104 are separated from each other by the trench(es) 108p. The tunneling film 142 is disposed over the base portions 102 of the substrate 110, the floating gate layer 152 is disposed over the tunneling film 142, the patterned pad layer 162 is disposed over the floating gate layer 152, and the patterned mask layer 172 is disposed over the patterned pad layer 162. The patterned pad layer 124 is disposed over the base portion 104 of the substrate 110, and the patterned mask layers 134 is disposed over the patterned pad layer 164.

Moreover, since the patterned floating gate film 150' and the patterned tunneling film 140' are over the cell region 112 and not over the peripheral region 114, the etching rate in the cell region 112 may be different from the etching rate in the peripheral region 114. For example, if the patterned floating gate film 150' and the patterned tunneling film 140' are etched faster than the substrate 110 of the peripheral region 114, the trenches 108c are deeper than the trench 108p. That is, the trenches 108c and 108p have different depths. Also, the depth Ta of the portion of the trench 108c in the substrate 110 is different from the depth Tb of the portion of the trench 108p in the substrate 110. In FIG. 21, the depth Ta is deeper than the depth Tb. Furthermore, the trench 108t has different depths respectively in the cell region 112 and in the peripheral region 114. Hence, the substrate 110 further includes a protrusion portion 106 disposed in the transition region 116 of the substrate 110 after the patterning process. The protrusion portion 106 may be a step in FIGS. 21B and 21C.

Figure 22A:
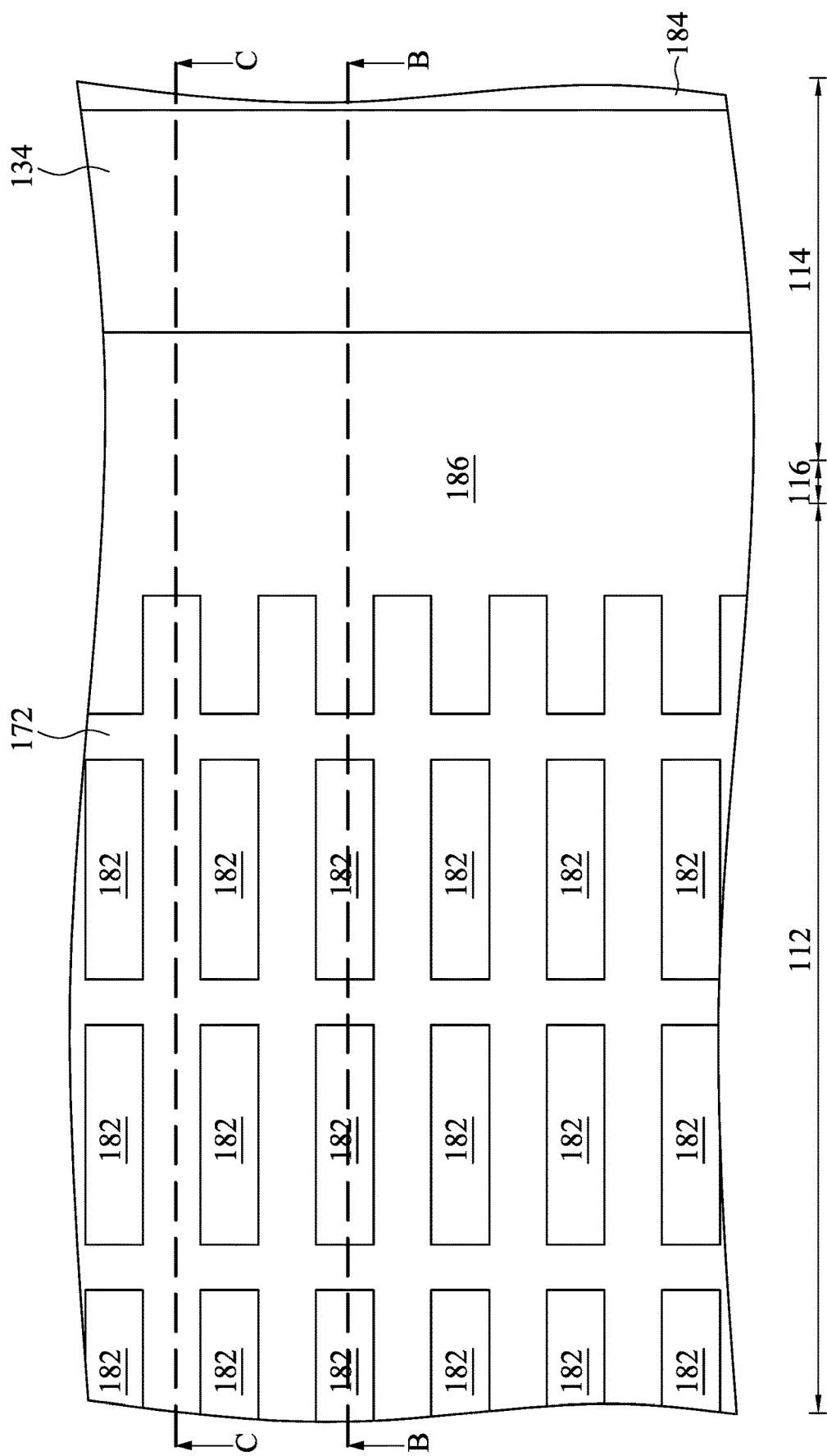
Figure 22B:
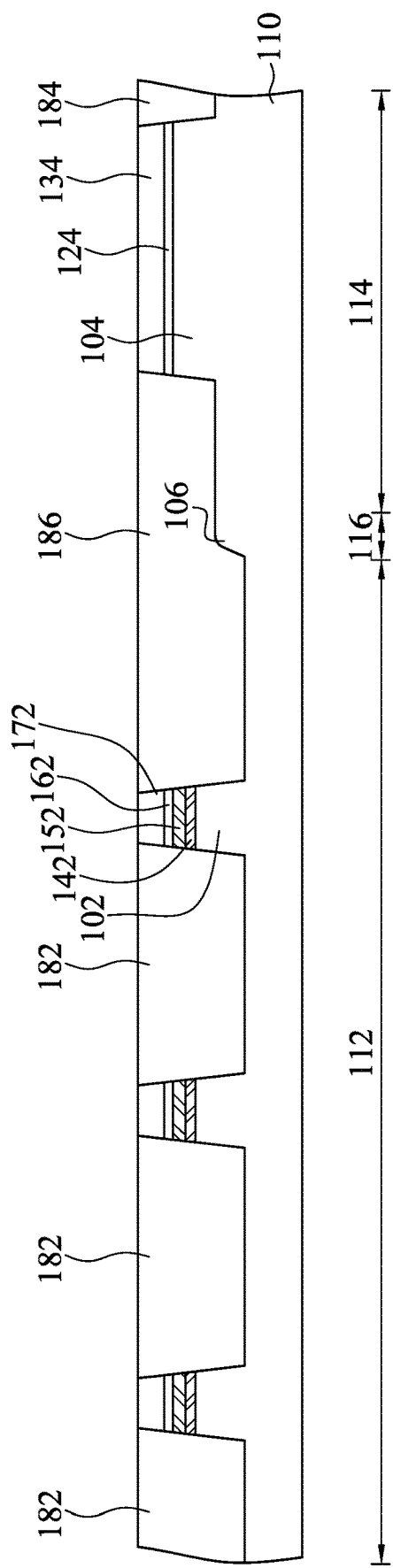
Figure 22C:
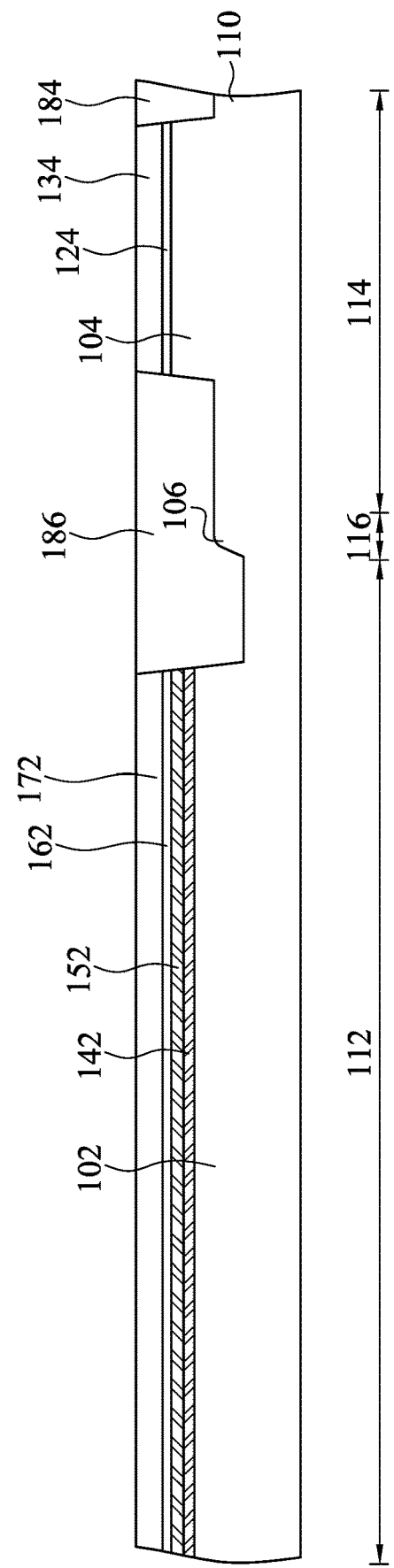

Reference is made to FIGS. 22A to 22C, where FIG. 22A is a top view of the IC, FIG. 22B is a cross-sectional view taking along line B-B of FIG. 22A, and FIG. 22C is a cross-sectional view taking along line C-C of FIG. 22A. A plurality of isolation features 182, 184, and 186 are respectively formed in the trenches 108c, 108p, and 108t of FIG. 21A. It is noted that the number of the isolation feature 184 can be plural in some other embodiments. In greater detail, dielectric material covers the structure of FIG. 21A. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other commonly used CVD methods. The formation of the liner oxide reduces the electrical fields and hence improves the performance of the resulting semiconductor device. A chemical mechanical polish (CMP) is then performed to level the top surface of the dielectric material to the top surfaces of the patterned mask layers 172 and 174 to form a plurality of isolation features 182, 184, and 186 in the trenches 108c, 108p, and 108t of FIG. 21A).

In FIGS. 22A to 22C, the isolation features 182 are disposed in the cell region 112 of the substrate 110, the isolation feature 184 is disposed in the peripheral region 114 of the substrate 110, and the isolation feature 186 is at least disposed in the transition region 116 of the substrate 110. The isolation feature 182 is in contact with the base portions 102 of the substrate 110, the tunneling film 142, the floating gate layer 152, the patterned pad layer 162, and the patterned mask layer 172. The isolation feature 184 is in contact with the base portions 104 of the substrate 110, the patterned pad layer 124, and the patterned mask layer 134. The isolation feature 186 is in contact with the base portions 102, 104 and the protrusion portion 106 of the substrate 110, the tunneling film 142, the floating gate layer 152, the patterned pad layers 162, 124, and the patterned mask layers 172, 134. The protrusion portion 106 of the substrate 110 is embedded in the isolation feature 186. In other words, the isolation feature 186 covers the protrusion portion 106.

Figure 23A:
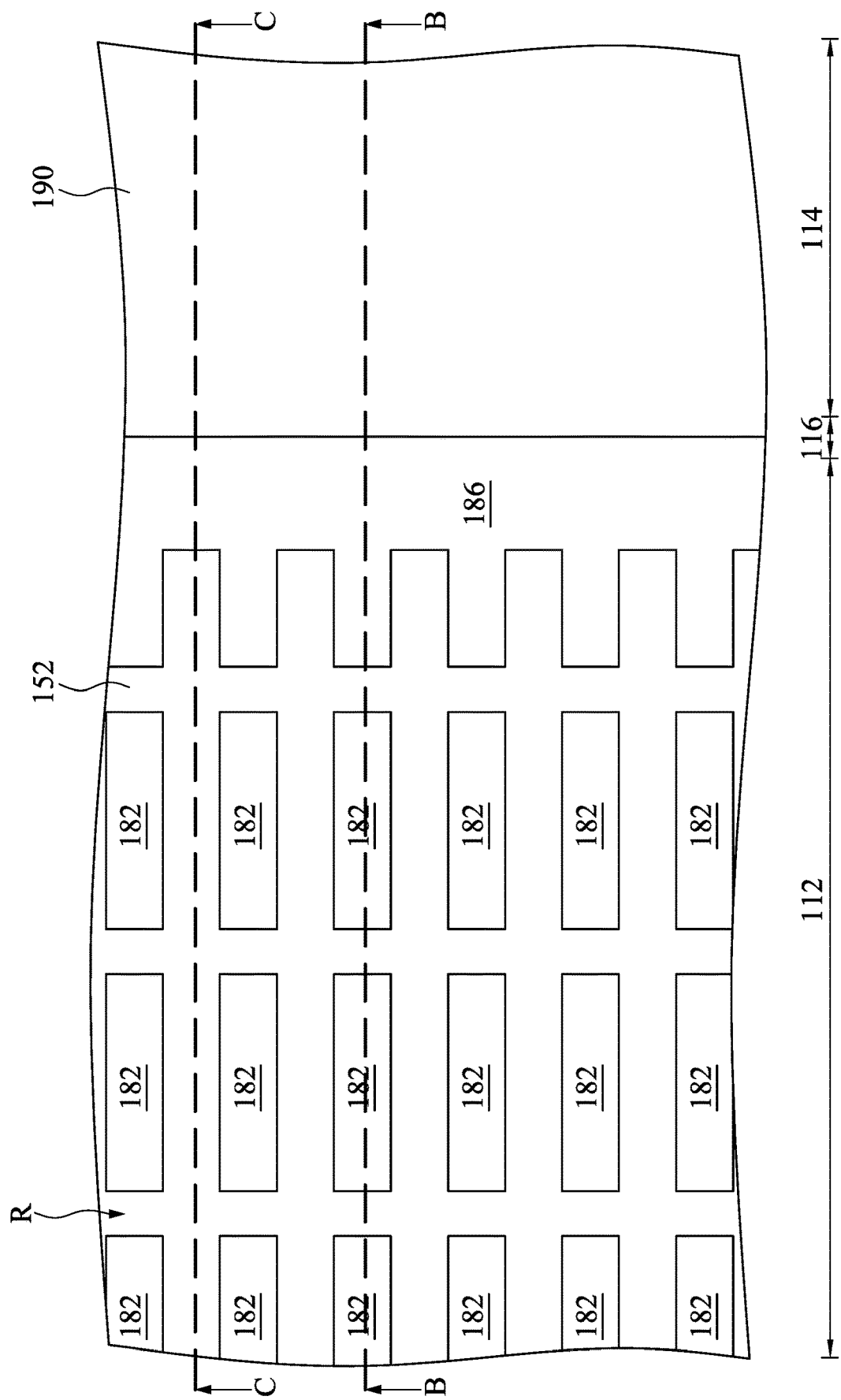
Figure 23B:
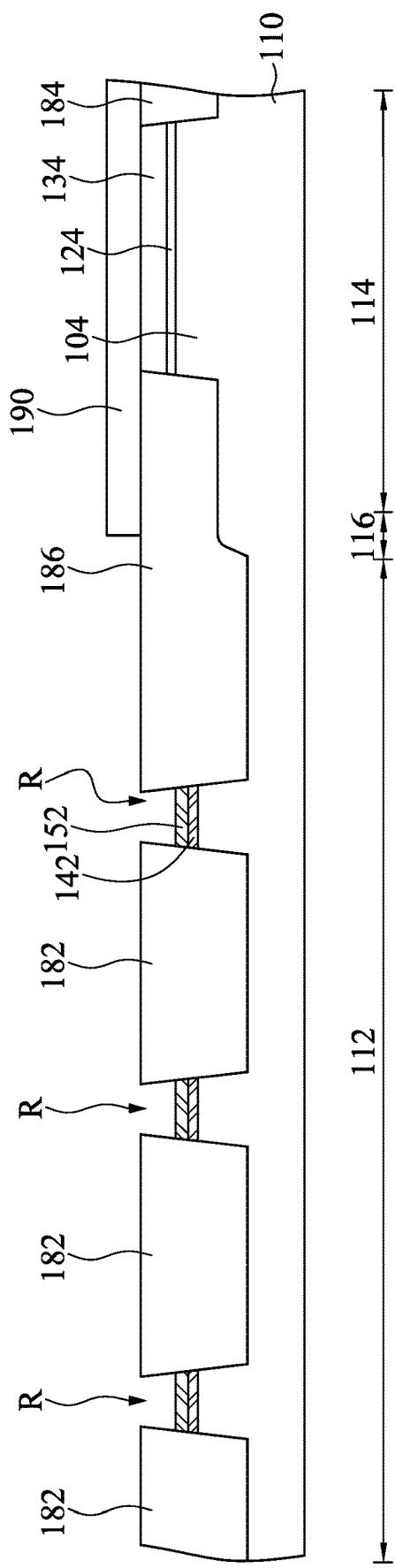
Figure 23C:
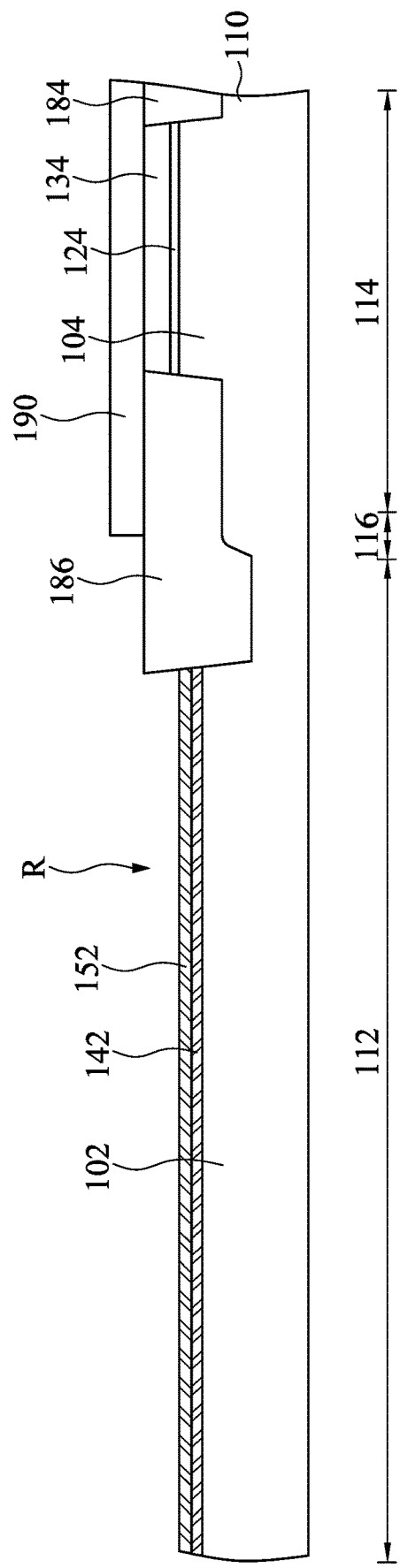

Reference is made to FIGS. 23A to 23C, where FIG. 23A is a top view of the IC, FIG. 23B is a cross-sectional view taking along line B-B of FIG. 23A, and FIG. 23C is a cross-sectional view taking along line C-C of FIG. 23A. A patterned hard mask layer 190 is formed over the peripheral region 114 of the substrate 110 to cover the structures disposed over the peripheral region 114 of the substrate 110 and expose the structures disposed over the cell region 112 of the substrate 110. The patterned mask layers 172 and the patterned pad layers 162 of FIGS. 22A to 22C are then removed. As such, the floating gate layers 152 are exposed. Hence, the floating gate layer 152 and the adjacent isolation features 182 and 186 together define a recess R.

Reference is made to FIGS. 24A and 24B, where the cross-sectional positions of FIGS. 24A and 24B are respectively the same as the cross-sectional position of FIGS. 23B and 23C. The isolation features 182 and the portion of the isolation feature 186 uncovered by the patterned hard mask layer 190 are recessed until the top surfaces of the isolation features 182 and 186 are lower than the top surface of the floating gate layer 152. The top surfaces of the isolation features 182 and 186 can be higher than the bottom surface of the floating gate layer 152 in some embodiments. In some embodiments, the isolation features 182 and 186 can be recessed by performing a wet etching process, and the present disclosure is not limited in this respect. After the isolation features 182 and 186 are recessed, the top surface of the isolation feature 186 is not planar and may have a step 187 adjacent to the edge of the patterned hard mask layer 190. In some embodiments, the step 187 is located over the protrusion portion 106.

Reference is made to FIGS. 25A and 25B, where the cross-sectional positions of FIGS. 25A and 25B are respectively the same as the cross-sectional position of FIGS. 25A and 25B. The patterned hard mask layer 190 of FIGS. 24A and 24B is removed, and the removal method may be performed by solvent stripping or plasma ashing, for example. A dielectric film 310 is conformally formed over the structure of FIGS. 24A and 24B without the patterned hard mask layer 190. In some embodiments, the dielectric film 310 and the tunneling film 142 may have the same or different materials. That is, the dielectric film 310 may include, for example, a dielectric material such as silicon dioxide ($SiO_2$), silicon nitride ($Si_3N_4$), oxynitrides (SiON), high-k materials, other non-conductive materials, or combinations thereof. The dielectric film 310 may be formed using chemical vapor deposition (CVD), physical vapor deposition (PVD), atomic layer deposition (ALD), ozone oxidation, other suitable processes, or combinations thereof.

A control gate film 320 is conformally formed over the dielectric film 310. The control gate film 320 may include polysilicon formed through, for example low pressure CVD (LPCVD) methods, CVD methods and PVD sputtering methods employing suitable silicon source materials. If desired, the control gate film 320 may be ion implanted to the desired conductive type. It is to be appreciated other gate electrode material such as metal, metal alloys, single crystalline silicon, or combinations thereof.

A hard mask layer 330 is conformally formed over the control gate film 320. The hard mask layer 330 may include single layer or multiple layers. In some embodiments, the hard mask layer 330 includes $SiN/SiO_2/SiN$ stacked layers or other suitable materials. In some embodiments, the hard mask layer 330 may be formed using chemical vapor deposition (CVD), physical vapor deposition (PVD), atomic layer deposition (ALD), ozone oxidation, other suitable processes, or combinations thereof.

Figure 26A:
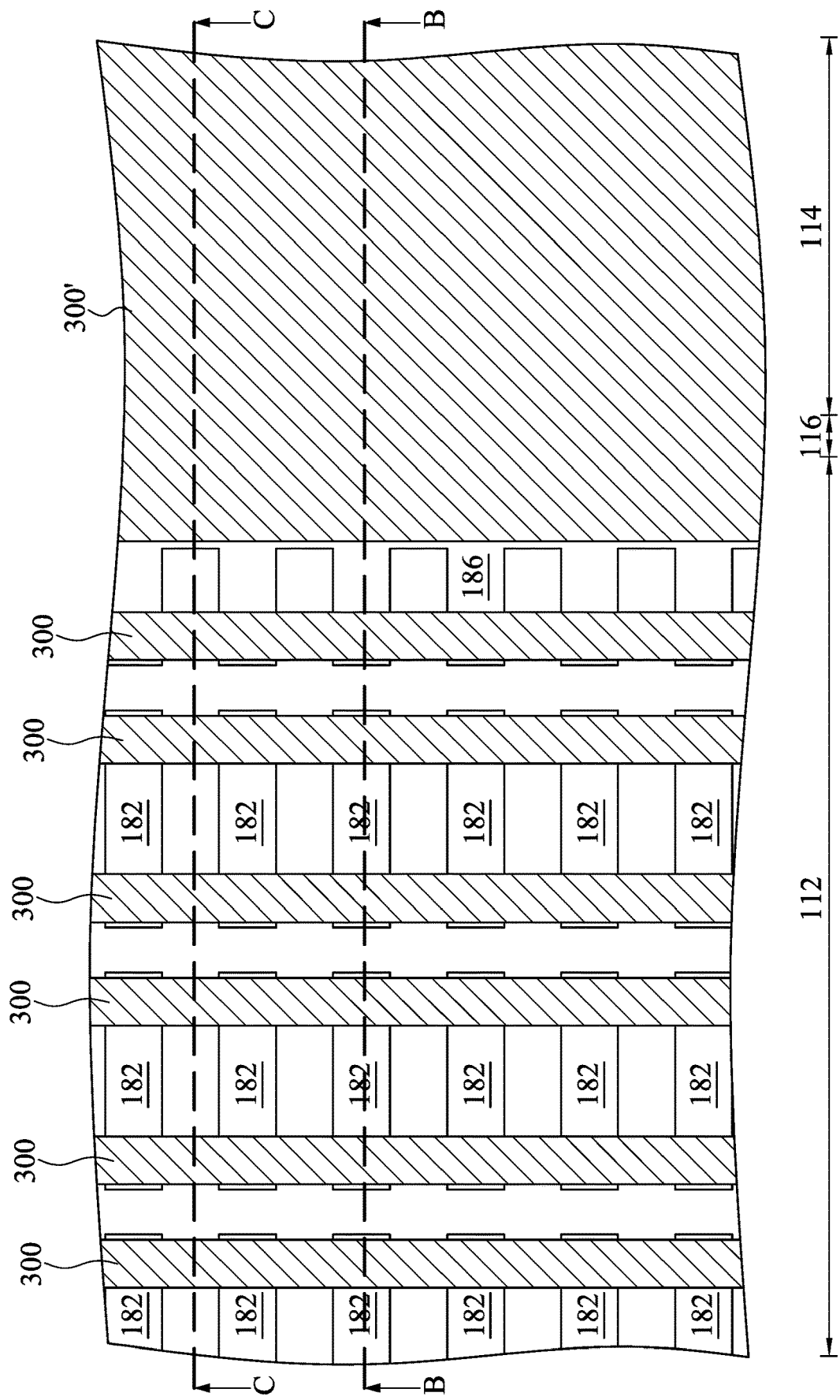

Reference is made to FIGS. 26A to 26C, where FIG. 26A is a top view of the IC, FIG. 26B is a cross-sectional view taking along line B-B of FIG. 26A, and FIG. 26C is a cross-sectional view taking along line C-C of FIG. 26A. The hard mask layer 330, the control gate film 320, the dielectric film 310, the floating gate layer 152, and the tunneling film 142 of FIGS. 25A and 25B are patterned to form a plurality of gate stacks 300 over the cell region 112 of the substrate 110. Two adjacent gate stacks 300 are formed between two adjacent isolation features 182 (186). Specifically, at least one of the gate stacks 300 includes a tunneling layer 146, a floating gate 156, a dielectric layer 312, a control gate 322, and a hard mask 332. The tunneling layer 146 is formed from the tunneling film 142 of FIGS. 25A and 25B. For example, the tunneling films 142 can be patterned to form the tunneling layers 146. The floating gate 156 is formed over the tunneling layer 146 and is formed from the floating gate layer 152 of FIGS. 25A and 25B. For example, the floating gate layer 152 can be patterned to form the floating gates 156. The dielectric layer 312 is formed over the floating gate 156. For example, the dielectric film 310 can be patterned to form the dielectric layer 312. The control gate 322 is formed over the dielectric layer 312. For example, the control gate film 320 can be patterned to form the control gate 322. The hard mask 332 is formed over the control gate 322. For example, the hard mask layer 330 can be patterned to form the hard mask 332. In some embodiments, the floating gate 156 may be thinner than the control gate 322. At least one of the gate stacks 300 further include a pair of spacers 340 disposed over the floating gate 156 and on opposite sides of the dielectric layer 312, the control gate 322, and the hard mask 332. For clarity, the spacers 340 are illustrated in FIGS. 26B and 26C and are omitted in FIG. 26A. In some embodiments, the spacer 340 includes an inner silicon oxide layer, a middle silicon nitride layer, and an outer silicon oxide layer. Furthermore, the portions of the hard mask layer 330, the control gate film 320, and the dielectric film 310 over the peripheral region 114 is patterned to form a semiconductor stack 300' including a dielectric layer 314, a control gate layer 324 over the dielectric layer 314, and a hard mask layer 334 over the control gate layer 324.

Reference is made to FIGS. 27A and 27B, where the cross-sectional positions of FIGS. 27A and 27B are respectively the same as the cross-sectional position of FIGS. 26B and 26C. Dielectric layers 345 are formed on opposite sides of the gate stacks 300. In some embodiments, the dielectric layers 345 are high temperature oxide layer or other suitable dielectric layers. In some embodiments, a dielectric film may be conformally formed over the structure of FIGS. 26A to 26C, and an etching process is performed to remove the horizontal portions of the dielectric film to form the dielectric layers 345.

Reference is made to FIGS. 28A and 28B, where the cross-sectional positions of FIGS. 28A and 28B are respectively the same as the cross-sectional position of FIGS. 27A and 27B. The dielectric layers 345 between adjacent two gate stacks 300 are removed, and source regions 350 are formed between two adjacent gate stacks 300. For example, a patterned photoresist layer is formed by a combination of spin coating, exposing and developing processes to expose areas of the substrate 110 between adjacent gate stacks 300. The exposed dielectric layers 345 are then removed, and ions are implanted into the areas to form the source regions 350. A common source (CS) dielectric layer 355 is formed over the source region 350. The CS dielectric layer 355 may be a dielectric isolation structure and may be formed by oxidizing the substrate 110, other suitable processes, or combinations thereof. The patterned photoresist layer is then removed, and the removal method may be performed by solvent stripping or plasma ashing, for example.

In FIG. 28B, since the dielectric layers 345 and the CS dielectric layer 355 are formed separately, the thickness T1 of the dielectric layers 345 and the thickness T2 of the portion of CS dielectric layer 355 in contact with the spacer 340 are different. For example, the thickness T1 is greater than the thickness T2, and the present disclosure is not limited in this respect.

Figure 29A:
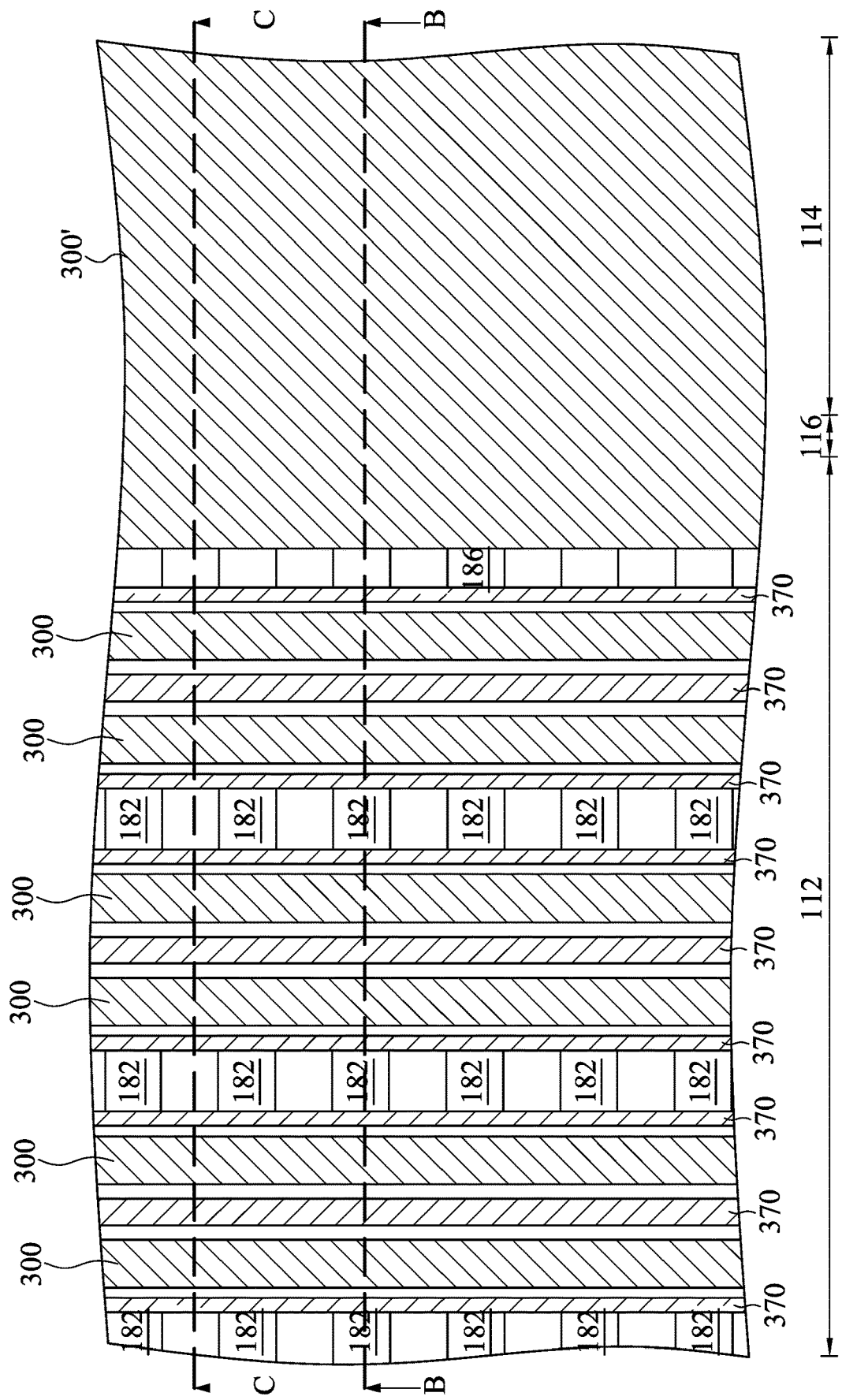
Figure 29B:
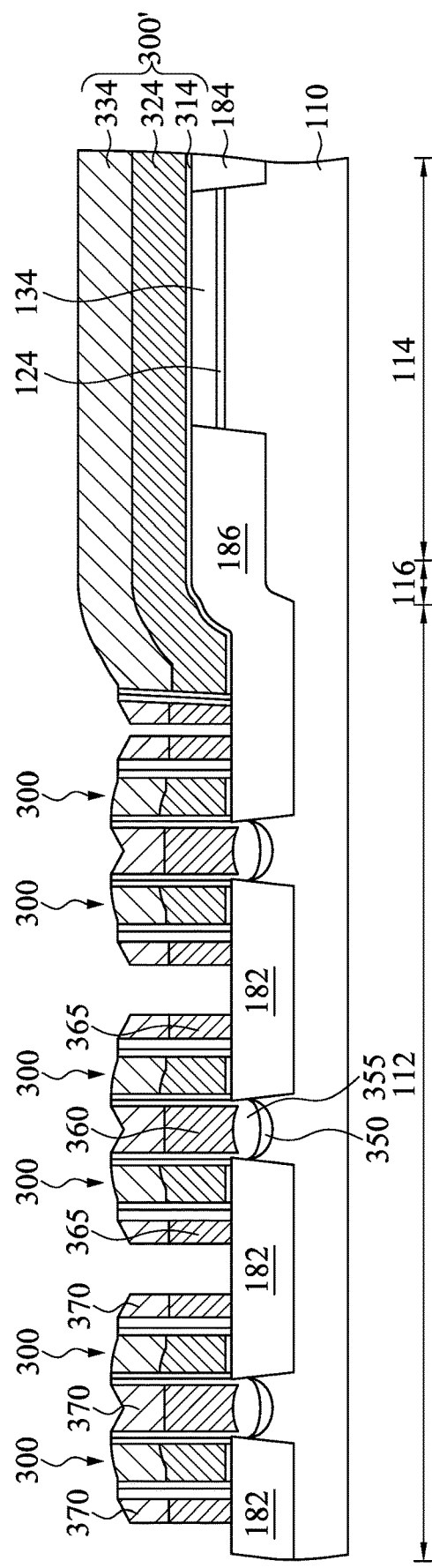
Figure 29C:
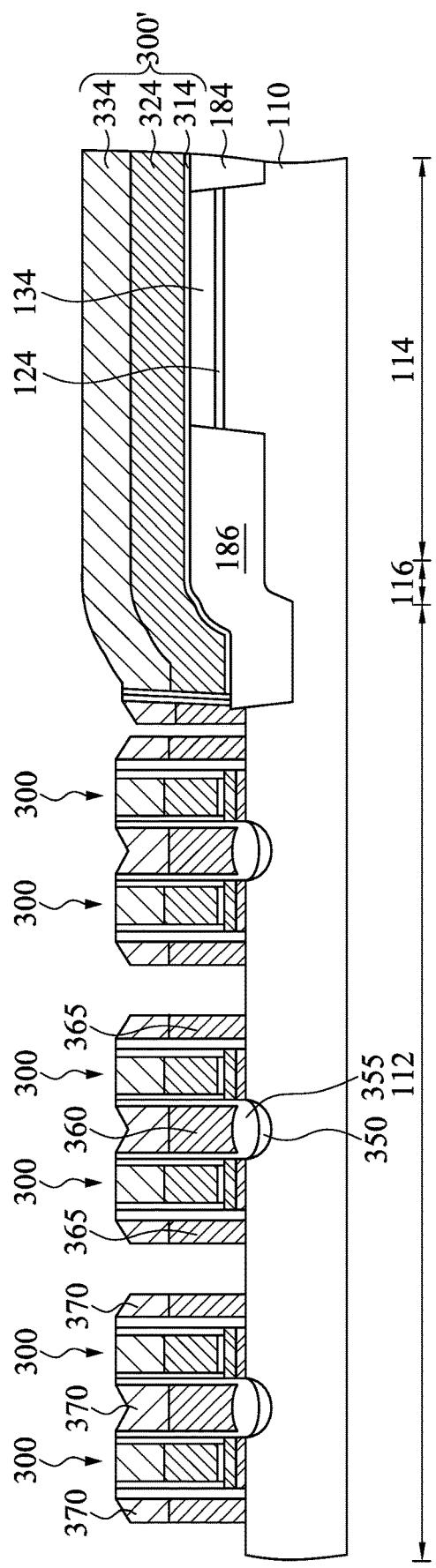

Reference is made to FIGS. 29A to 29C, where FIG. 29A is a top view of the IC, FIG. 29B is a cross-sectional view taking along line B-B of FIG. 29A, and FIG. 29C is a cross-sectional view taking along line C-C of FIG. 29A. A plurality of erase gates 360 and select gates (or word lines) 365 are respectively formed on opposite sides of the gate stacks 300. For example, a conductive layer is deposited over the substrate 110, and the conductive layer is patterned or etched back. Then, a plurality of hard masks 370 are respectively formed over the patterned conductive layer, and another etching process is formed to pattern the patterned conductive layer using the hard masks 370 as masks to form the erase gates 360 and the select gates 365. In some embodiments, the erase gates 360 and the select gates 365 may be made of polysilicon or other suitable materials.

Figure 30A:
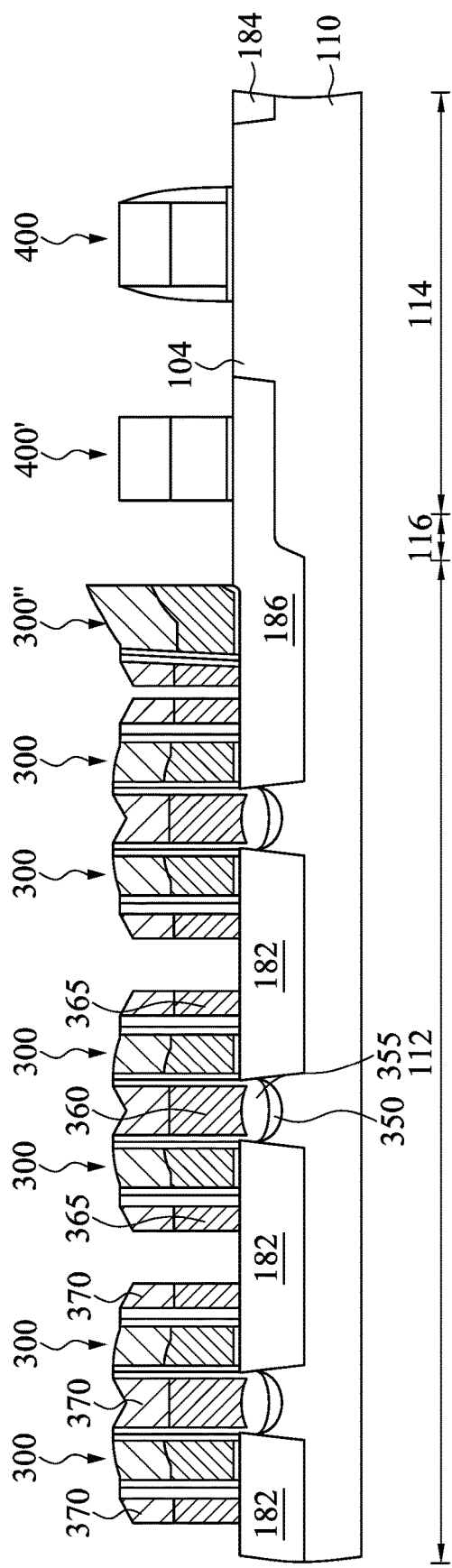
Figure 30B:
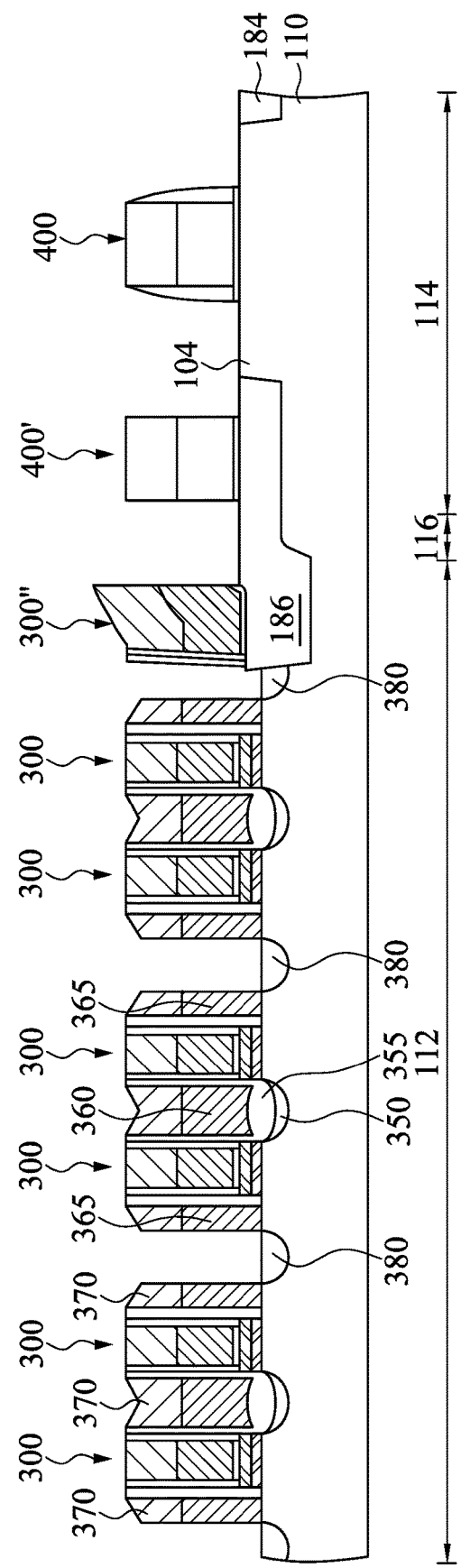

Reference is made to FIGS. 30A and 30B, where the cross-sectional positions of FIGS. 30A and 30B are respectively the same as the cross-sectional position of FIGS. 29B and 29C. The semiconductor stack 300' of FIGS. 29B and 29C are removed to expose the patterned mask layers 134 (see FIGS. 29B and 29C) and the isolation feature 184. A portion of the semiconductor stack 300'' remains over the isolation feature 186 after the removing process. The patterned pad layer 124 and the patterned mask layer 134 (see FIGS. 29A and 29B) are then removed to expose the base portion 104. Then, the isolation features 186 and 184 are recessed until the top surfaces of the isolation features 186 and 184 are substantially flush with the base portion 104. At least one semiconductor device 400 is formed over the base portion 104 and at least one semiconductor stack 400' is formed over the isolation feature 186. In some embodiments, the semiconductor device 400 can be a transistor (such as a high-κ metal gate (HKMG) transistor, and/or a logic transistor), and the present disclosure is not limited in this respect. In some embodiments, the semiconductor stack 400' and the semiconductor device 400 are made of the same materials.

In some embodiments, when the semiconductor device 400 is a transistor, during the formation of source/drain region of the semiconductor device 400, a plurality of drain regions 380 are formed in the cell region 112 of the substrate 110. Specifically, the drain regions 380 are respectively disposed adjacent to the select gates 365. In other words, the gate stack 300 and the select gate 365 are disposed in a position between the source region 350 and the drain region 380. In some embodiments, the drain regions 380 are formed by performing an ion implantation process in the substrate 110.

Figure 31A:
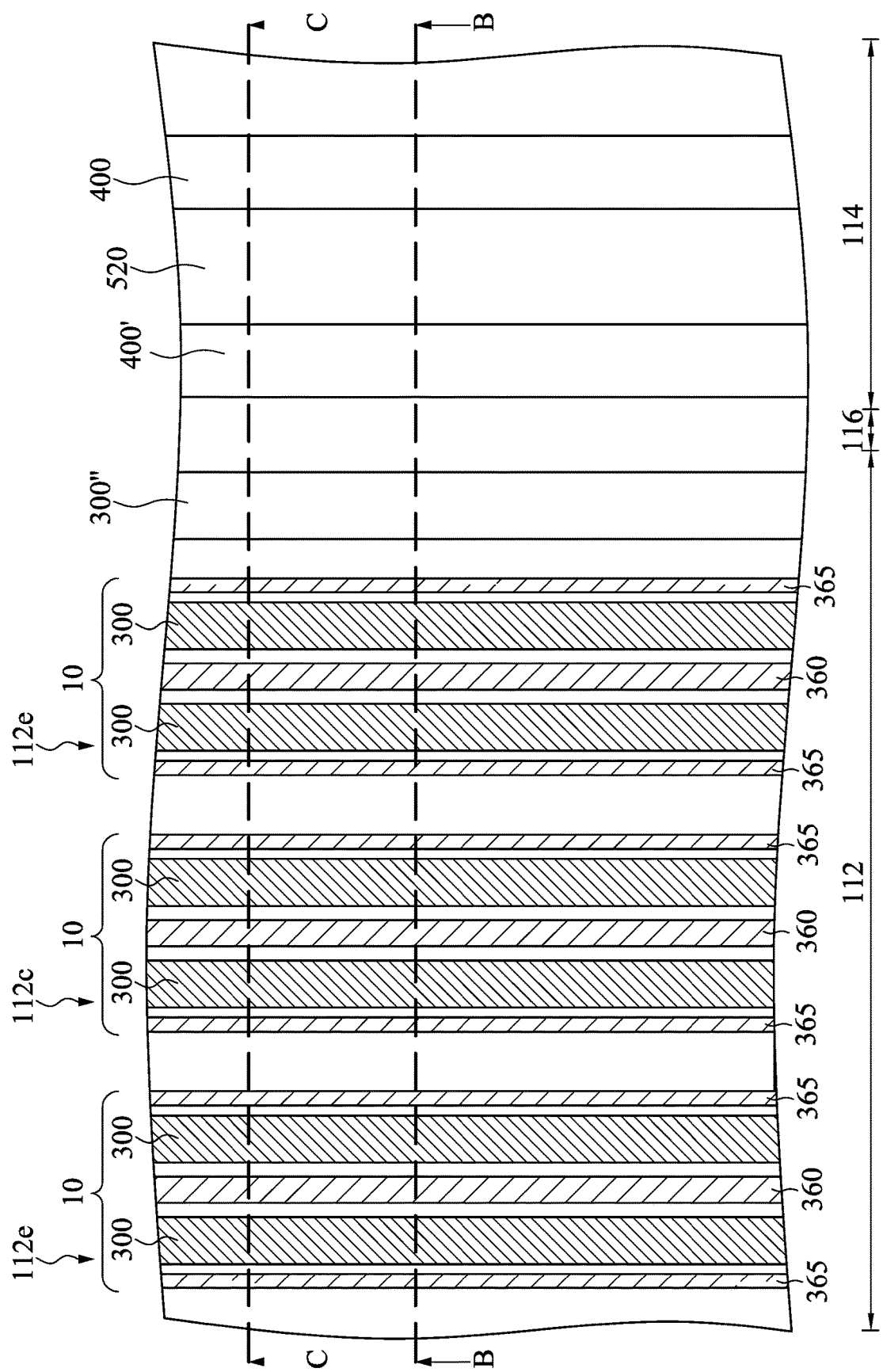
Figure 31B:
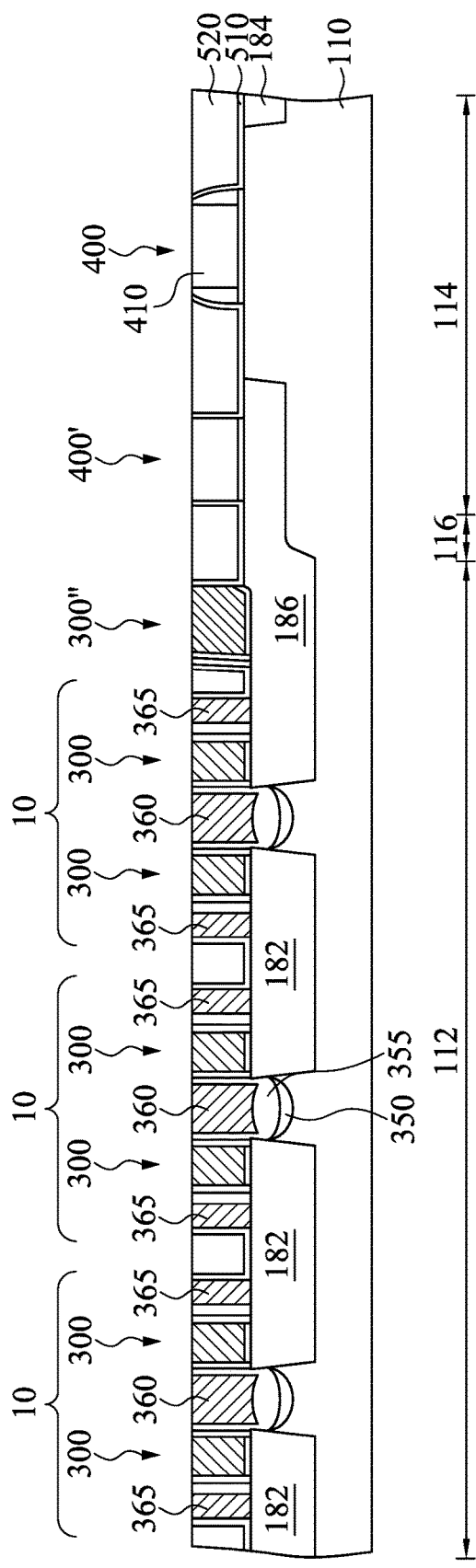
Figure 31C:
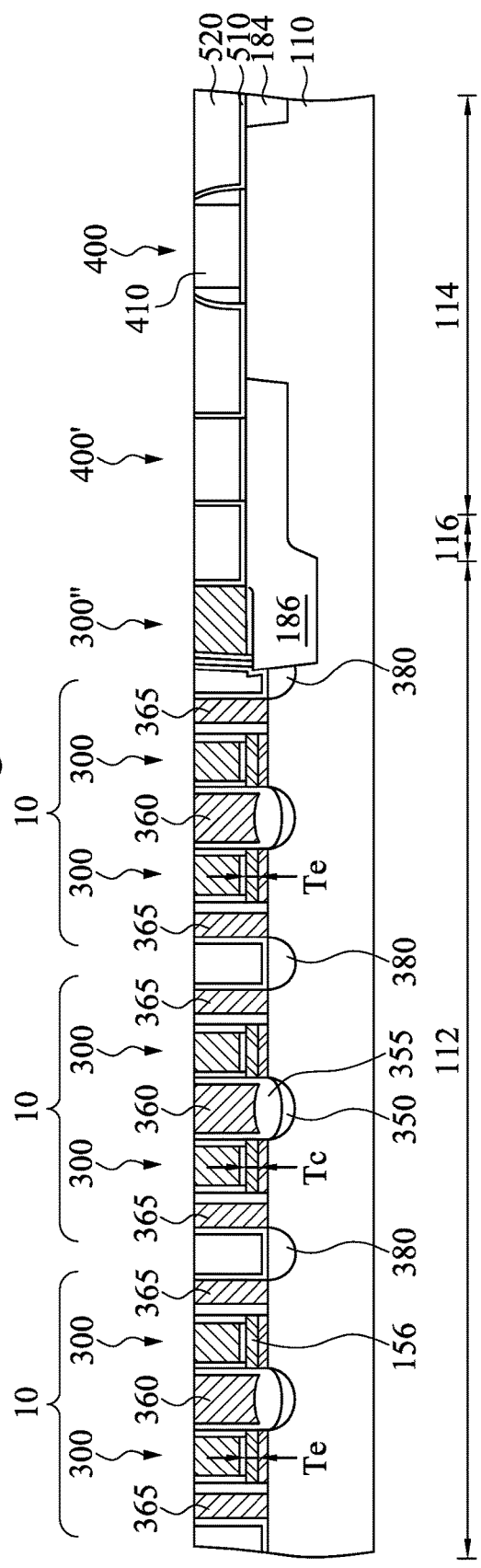

Reference is made to FIGS. 31A to 31C, where FIG. 31A is a top view of the IC, FIG. 31B is a cross-sectional view taking along line B-B of FIG. 31A, and FIG. 31C is a cross-sectional view taking along line C-C of FIG. 31A. An etching stop layer 510 is conformally formed over the structure of FIGS. 30A and 30B, and an interlayer dielectric (ILD) 520 is formed over the etching stop layer 510. Then, a chemical mechanical polish (CMP) process is performed to level the top surface of the ILD 520 with the top surfaces of the erase gates 360, the control gates 322, the select gates 365 of the memory cells 10 and a top surface of a gate 410 of the semiconductor device 400. As such, a plurality of memory cells 10 are formed. At least one of the memory cells 10 includes two gate stacks 300, one erase gate 360, two select gate 365, one source region 350, and two drain region 380. Two adjacent memory cells 10 share one drain region 380.

In FIGS. 31A to 31C, since the floating gate film 150 of FIG. 19 is deposited over the substrate 110, the thickness of the floating gate film 150 is uniform. Therefore, the floating gate 156 of the memory cell 10 disposed at the center 112c of the cell region 112 of the substrate 110 and the floating gate 156 of the memory cell 10 disposed at an edge 112e of the cell region 112 of the substrate 110 have substantially the same thickness. That is, the thickness Tc of the memory cell 10 disposed at the center 112c of the cell region 112 of the substrate 110 is substantially the same as the thickness Te of the memory cell 10 disposed at the edge 112e of the cell region 112 of the substrate 110. With such configuration, the product yield of the integrated circuit is improved. It is noted that the number of the memory cells 10 in FIGS. 31A to 31C is illustrative, and should not limit the present disclosure. In some other embodiments, the number of the memory cells 10 can be greater than three and arranged as an array. The floating gates 156 of the memory cells 10 have substantially the same thickness. The term "substantially" as used herein may be applied to modify any quantitative representation which could permissibly vary without resulting in a change in the basic function to which it is related.

Reference is made to FIGS. 32A and 32B, where the cross-sectional positions of FIGS. 32A and 32B are respectively the same as the cross-sectional position of FIGS. 31B and 31C. The difference between the integrated circuits of FIGS. 32A to 32B and the integrated circuits of FIGS. 31A to 31C pertains to the thickness of the isolation feature 184 and the profile of the isolation feature 186. In some embodiments, if the patterned floating gate film 150' and the patterned tunneling film 140 are etched slower than the substrate 110 of the peripheral region 114 in FIG. 20, the isolation feature 184 is deeper than the isolation feature 182. That is, the isolation features 184 and 182 have different depths Ta and Tb. In FIG. 32A, the depth Tb is deeper than the depth Ta. Furthermore, the isolation feature 186 has different depths respectively in the cell region 112 and in the peripheral region 114. Hence, the substrate 110 further includes a protrusion portion 106' disposed in the transition region 116 of the substrate 110. The protrusion portion 106' may be a bump in FIGS. 32A and 32B. Other relevant structural details of the integrated circuits of FIGS. 32A to 32B are similar to the integrated circuits of FIGS. 31A to 31C, and, therefore, a description in this regard will not be repeated hereinafter.

According to some embodiments, an integrated circuit includes a substrate, a first isolation feature, and a plurality of memory cells. The substrate has a cell region, a peripheral region, and a transition region between the cell region and the peripheral region. A top surface of the cell region is lower than a top surface of the peripheral region, and the substrate includes at least one protrusion portion in the transition region. The first isolation feature is in the transition region and covers the protrusion portion of the substrate. The memory cells are over the cell region of the substrate.

According to some embodiments, the memory cells include floating gates, and the floating gate of one of the memory cells at the center of the cell region of the substrate has a thickness substantially the same as a thickness of another of the memory cells at an edge of the cell region of the substrate.

According to some embodiments, the integrated circuit further includes a second isolation feature and a third isolation feature. The second isolation feature is in the cell region and is in contact with one of the memory cells. The third isolation feature is in the peripheral region and has a depth different from a depth of the second isolation feature.

According to some embodiments, the depth of the second isolation feature is greater than the depth of the third isolation feature.

According to some embodiments, the depth of the second isolation feature is less than the depth of the third isolation feature.

According to some embodiments, the integrated circuit further includes a semiconductor device over the peripheral region of the substrate and separated from the memory cells.

According to some embodiments, a method for manufacturing an integrated circuit includes forming a floating gate film over a substrate. The floating gate film and the substrate are patterned to form at least one trench in the floating gate film and the substrate. An isolation feature is formed in the at least one trench and in contact with the patterned floating gate film. At least one memory cell is formed over the patterned substrate and adjacent to the isolation feature, including patterning the patterned floating gate film to form a floating gate of the at least one memory cell.

According to some embodiments, the method further includes forming a tunneling film over the substrate, and the floating gate film is formed over the tunneling film.

According to some embodiments, the method further includes patterning the tunneling film to form a portion of the at least one trench, and the isolation feature is formed to be in contact with the patterned tunneling film.

According to some embodiments, forming the at least one memory cell further includes patterning the patterned tunneling film to form a tunneling layer of the memory cell.

According to some embodiments, the method further includes forming a recess in the substrate, and forming the floating gate film comprises covering the recess of the substrate.

According to some embodiments, the method further includes forming a pad layer over the floating gate film, forming a mask layer over the pad layer, and patterning the mask layer and the pad layer, wherein the floating gate film and the substrate are patterned through the patterned mask layer and the patterned pad layer.

According to some embodiments, the method further includes removing the patterned mask layer and the patterned pad layer to expose the patterned floating gate film.

According to some embodiments, patterning the floating gate film and the substrate comprises forming a protrusion portion in the substrate.

According to some embodiments, a method for manufacturing an integrated circuit includes recessing a substrate until a top surface of a cell region of the substrate is lower than a top surface of a peripheral region of the substrate. A floating gate film is formed over the cell region of the substrate. A pad layer is formed over the floating gate film and the substrate. The pad layer is in contact with the floating gate film and the peripheral region of the substrate. A mask layer is formed over the pad layer. At least one first trench is formed in the mask layer, the pad layer, the floating gate film, and the cell region of the substrate. A first isolation feature is formed in the first trench. At least one memory cell is formed over the cell region of the substrate. A floating gate of the memory cell is formed from the floating gate film.

According to some embodiments, the method further includes forming a second trench in the mask layer, the pad layer, the floating gate film, and a transition region of the substrate, wherein the transition region is between the cell region and the peripheral region.

According to some embodiments, the method further includes forming a second isolation feature in the second trench.

According to some embodiments, forming the second trench comprises forming a protrusion portion in the transition region of the substrate.

According to some embodiments, the method further includes forming a second isolation feature to cover the protrusion portion of the substrate.

According to some embodiments, the method further includes forming a tunneling film over the cell region of the substrate before forming the first isolation feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, the method comprising:
   forming a recess in a cell region of a substrate, wherein the substrate has a peripheral region surrounding the cell region;
   forming a floating gate film covering the recess;
   patterning the floating gate film and the substrate to form at least one first trench in the floating gate film and the substrate and at least one second trench in the peripheral region of the substrate, such that a bottom of the first trench is lower than a bottom of the second trench;
   forming an isolation feature in the at least one first trench and in contact with the patterned floating gate film; and
   forming at least one memory cell over the patterned substrate and adjacent to the isolation feature, comprising patterning the patterned floating gate film to form a floating gate of the at least one memory cell.

2. The method of claim 1, further comprising forming a tunneling film over the substrate, and the floating gate film is formed over the tunneling film.

3. The method of claim 2, further comprising patterning the tunneling film to form a portion of the at least one first trench, and the isolation feature is formed to be in contact with the patterned tunneling film.

4. The method of claim 3, wherein forming the at least one memory cell further comprises patterning the patterned tunneling film to form a tunneling layer of the memory cell.

5. The method of claim 1, further comprising:
forming a pad layer over the floating gate film;
forming a mask layer over the pad layer; and
patterning the mask layer and the pad layer, wherein the floating gate film and the substrate are patterned through the patterned mask layer and the patterned pad layer.

6. The method of claim 5, further comprising removing the patterned mask layer and the patterned pad layer to expose the patterned floating gate film.

7. The method of claim 1, wherein patterning the floating gate film and the substrate comprises forming a protrusion portion in the substrate.

8. The method of claim 1, wherein forming the floating gate film is performed such that the floating gate film is over the cell region of the substrate.

9. A method for manufacturing an integrated circuit, the method comprising:
recessing a substrate until a top surface of a cell region of the substrate is lower than a top surface of a peripheral region of the substrate;
forming a floating gate film over the cell region of the substrate;
forming a pad layer over the floating gate film and the substrate, wherein the pad layer is in contact with the floating gate film and the peripheral region of the substrate;
forming a mask layer over the pad layer;
form at least one first trench in the mask layer, the pad layer, the floating gate film, and the cell region of the substrate;
forming a first isolation feature in the first trench; and
forming at least one memory cell over the cell region of the substrate, wherein a floating gate of the memory cell is formed from the floating gate film.

10. The method of claim 9, further comprising forming a second trench in the mask layer, the pad layer, the floating gate film, and a transition region of the substrate, wherein the transition region is between the cell region and the peripheral region.

11. The method of claim 10, further comprising forming a second isolation feature in the second trench.

12. The method of claim 10, wherein forming the second trench comprises forming a protrusion portion in the transition region of the substrate.

13. The method of claim 12, further comprising forming a second isolation feature to cover the protrusion portion of the substrate.

14. The method of claim 12, further comprising forming a tunneling film over the cell region of the substrate before forming the first isolation feature.

15. A method for manufacturing an integrated circuit, the method comprising:
recessing a top surface of a cell region of a substrate, wherein the substrate has a peripheral region and a transition region between the cell region and the peripheral region of the substrate;
forming a trench in the cell region, the peripheral region, and the transition region of the substrate, such that the trench has a stepped bottom surface;
forming an isolation feature in the trench;
prior to forming the isolation feature, forming a floating gate film over the substrate; and
prior to forming the trench, removing a portion of the floating gate film.

16. The method of claim 15, further comprising forming a gate stack of a memory cell by patterning the floating gate film.

17. The method of claim 15, further comprising:
forming the floating gate film in the cell region of the substrate; and
forming a mask layer over the floating gate film and in the peripheral region of the substrate.

18. The method of claim 17, wherein forming the trench includes removing an exposed portion of the mask layer and the floating gate film underneath the exposed portion of the mask layer.

19. The method of claim 17, further comprising removing a patterned mask layer of the mask layer to expose a floating gate layer of the floating gate film.

20. The method of claim 15, wherein forming the trench is such that the trench in the cell region is deeper than the trench in the peripheral region.

* * * * *